US009658527B2

(12) United States Patent
Dmitriev

(10) Patent No.: US 9,658,527 B2
(45) Date of Patent: May 23, 2017

(54) CORRECTION OF ERRORS OF A PHOTOLITHOGRAPHIC MASK USING A JOINT OPTIMIZATION PROCESS

(75) Inventor: Vladimir Dmitriev, Karmiel (IL)

(73) Assignee: Carl Zeiss SMS Ltd., Karmiel (IL)

( * ) Notice: Subject to any disclaimer, the term of this patent is extended or adjusted under 35 U.S.C. 154(b) by 260 days.

(21) Appl. No.: 13/179,799

(22) Filed: Jul. 11, 2011

(65) Prior Publication Data

US 2012/0009511 A1 Jan. 12, 2012

Related U.S. Application Data

(60) Provisional application No. 61/363,352, filed on Jul. 12, 2010.

(51) Int. Cl.
*G03F 1/72* (2012.01)
*G06F 17/50* (2006.01)
*G03F 1/84* (2012.01)
*G03F 7/20* (2006.01)

(52) U.S. Cl.
CPC ............ *G03F 1/72* (2013.01); *G03F 1/84* (2013.01); *G03F 7/70466* (2013.01); *G03F 7/70625* (2013.01)

(58) Field of Classification Search
None
See application file for complete search history.

(56) References Cited

U.S. PATENT DOCUMENTS 6,205,818 B1 3/2001 Seward, III
6,480,285 B1* 11/2002 Hill .......................... G01B 9/04
356/492
6,821,682 B1 11/2004 Stearns et al.
6,834,262 B1* 12/2004 Balasinski et al. ............. 703/13
6,844,272 B2 1/2005 Taylor et al.
6,858,537 B2 2/2005 Brewer
7,001,697 B2 2/2006 Park et al. .......................... 430/5
7,111,277 B2* 9/2006 Ye et al. ........................... 716/52
7,241,539 B2 7/2007 Kim et al. ......................... 430/5
(Continued)

FOREIGN PATENT DOCUMENTS

DE 10 2006 054 820 5/2008 ............... G03F 7/20
EP 0 628 806 A2 12/1994 ............. G01N 21/88
(Continued)

OTHER PUBLICATIONS

S. Oshemkov et al: "DUV Attenuation Structures In Fused Silica Induced Ultrashort Laser Radiation", Proc. CLEOE-IQEC, 1 page, Munich 2007.
(Continued)

*Primary Examiner* — Sun Lin
(74) *Attorney, Agent, or Firm* — Fish & Richardson P.C.

(57) ABSTRACT

A method for correcting a plurality of errors of a photolithographic mask is provided. First parameters of a imaging transformation of the photolithographic mask and second parameters of a laser beam locally directed onto the photolithographic mask are optimized, and the plurality of errors are corrected by applying an imaging transformation using optimized first parameters and locally directing the laser beam onto the photolithographic mask using optimized second parameters. The first and the second parameters are simultaneously optimized in a joint optimization process.

25 Claims, 57 Drawing Sheets

(56) References Cited

U.S. PATENT DOCUMENTS

| | | | |
|---|---|---|---|
| 7,352,452 B2 | 4/2008 | Wegmann et al. | |
| 7,459,242 B2 | 12/2008 | Zait et al. | 430/5 |
| 2005/0168717 A1* | 8/2005 | Hinsberg, III | G03F 7/70108 355/71 |
| 2007/0061773 A1* | 3/2007 | Ye | G03F 7/70441 716/52 |
| 2007/0065729 A1 | 3/2007 | Zait et al. | 430/5 |
| 2007/0065732 A1 | 3/2007 | Lee et al. | |
| 2007/0224522 A1 | 9/2007 | Lee et al. | |
| 2008/0026300 A1 | 1/2008 | Itoh et al. | |
| 2008/0027698 A1* | 1/2008 | White | G03F 7/70425 703/14 |
| 2008/0033206 A1 | 2/2008 | Harris et al. | |
| 2008/0174736 A1* | 7/2008 | Huang et al. | 353/20 |
| 2010/0003830 A1 | 1/2010 | Itoh | |
| 2010/0010784 A1* | 1/2010 | Cao et al. | 703/1 |
| 2012/0117522 A1* | 5/2012 | Feng et al. | 716/54 |

FOREIGN PATENT DOCUMENTS

| | | | |
|---|---|---|---|
| EP | 1 829 052 B1 | 4/2008 | G21K 1/06 |
| JP | 9-15834 | 1/1997 | G03F 1/08 |
| JP | 2001-244181 | 9/2001 | H01L 21/027 |
| JP | 2005-517996 | 6/2005 | G03F 1/08 |
| JP | 2006-350352 | 12/2006 | G03F 1/08 |
| JP | 2008-026822 | 2/2008 | G03F 1/08 |
| JP | 2009-170458 | 7/2009 | H01L 21/027 |
| JP | 2010-152031 | 7/2010 | G03F 1/08 |
| WO | WO 03/071358 | 8/2003 | G03F 9/00 |

OTHER PUBLICATIONS

U.S. Appl. No. 61/324,467, filed Apr. 15, 2010.
U.S. Appl. No. 61/351,056, filed Jun. 3, 2010.
L.N. Allen et al., "An ion figuring system for large optics fabrication", Proc. SPIE 1168, p. 33-50 (1989).
Martin Ams et al., "Investigation of Ultrafast Laser-Photonic Material Interactions: Challenges for Directly Written Glass Photonics", IEEE Journal of Selected Topics in Quantum Electronics, vol. 14, No. 5, pp. 1370-1381 (Sep./Oct. 2008).
Peter Bechtold et al., "Non-thermal Micro Adjustment Using Ultrashort Laser Pulses", Journal of Laser Micro/Nanoengineering, vol. 2, No. 3, pp. 183-188 (2007).
O.M. Efimov et al., "Color center generation in silicate glasses exposed in infrared femtosecond pulses", J. Opt. Soc. Am., vol. 15, p. 193-199 (1998).
F. Frost et al., "Large area smoothing of optical surfaces by low-energy ion beams", Thin Solid Films 459, p. 100-105 (2004).
E. N. Glezer et al., "3-D Optical Storage Inside Transparent Materials", Optics Letters, vol. 21, No. 24, pp. 2023-2025 (1996).
S.J. Hoskins, "Aspheric surface figuring of fused silica plasma assisted chemical etching", SPIE vol. 2542, Optomechanical and Precision Instrument Design, p. 220-230 (1995).
Y. Shimotsuma et al., "Nano-modification inside transparent materials by femtosecond pulse laser", Mod. Phys. Left. B, vol. 19, No. 5, p. 225-238, (2005).
Yasuhiko Shimotsuma et al., "Self-Organized Nanogratings in Glass Irradiated by Ultrashort Light Pulses", Physical Review Letters, vol. 91, No. 24, pp. 247405-1-247405-4 (Dec. 12, 2003).
Linards Skuja et al., "Laser-induced color centers in silica", SPIE, vol. 4347, pp. 155-168 (2001).
Alexander M. Streltsov et al., "Fabrication and analysis of a directional coupler written in glass by nanojoule femtosecond laser pulses", Optics Letters, vol. 26, No. 1, pp. 42-43 (Jan. 1, 2001).
John S. Taylor et al., "Specification, Fabrication, Testing, and Mounting of EUVL Optical Substrates", EUV Lithography, SPIE Press Monograph, vol. PM178, pp. 161-185 (2008).
R. S. Taylor et al., "Femtosecond laser erasing and rewriting of self-organized planar nanocracks in fused silica glass", Optics Letters, vol. 32, No. 19, pp. 2888-2890 (Oct. 1, 2007).
John S. Taylor et al., "Fabrication and Testing of Aspheres, Trends in Optics and Photonics (TOPS)," vol. XXIV, Optical Society of America, Washington D.C., pp. 187-192 (1999).
R.A. Jones, Ed., "Selected Papers on Computer-Controlled Optical Surfacing," vol. MS40, SPIE Press, Bellingham, WA (1991).
Japanese Office Action for Japanese Application No. 2011-167641 dated Feb. 23, 2015 (7 pages).
Japanese Office Action for Japanese Application Serial No. 2016-021010 dated Nov. 30, 2016.

* cited by examiner

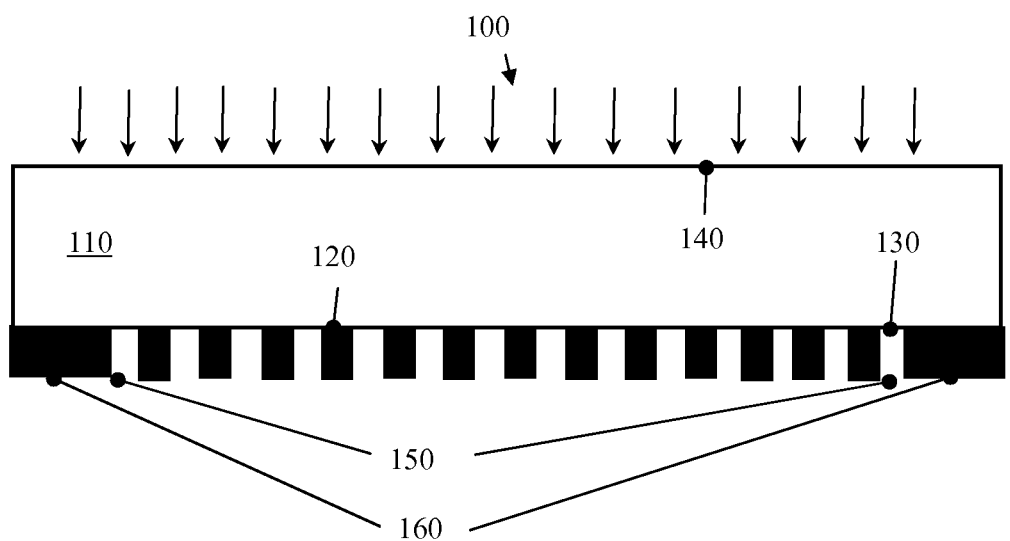
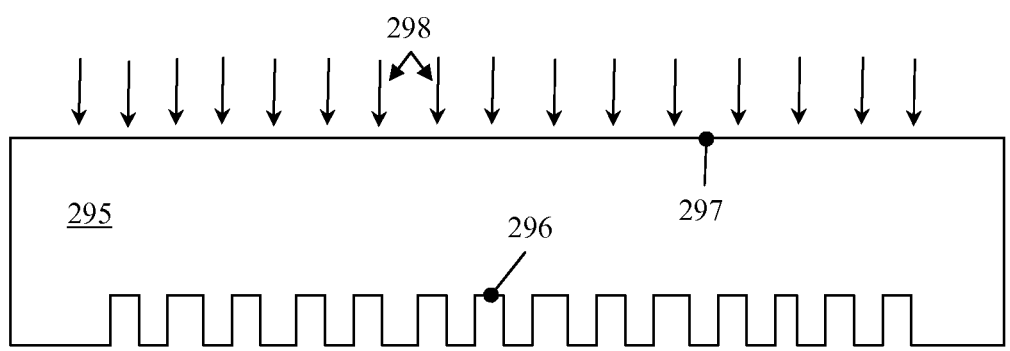

CORRECTION OF ERRORS OF A PHOTOLITHOGRAPHIC MASK USING A JOINT OPTIMIZATION PROCESS

CROSS-REFERENCE TO RELATED APPLICATIONS

Under 37 C.F.R. §119 this application claims the benefit of priority from U.S. provisional application Ser. No. 61/363,352, filed Jul. 12, 2010, the contents of which are incorporated by reference in their entirety.

FIELD OF THE INVENTION

The present invention relates to the field of correcting errors of a photolithographic mask.

BACKGROUND OF THE INVENTION

As a result of the constantly increasing integration density in the semiconductor industry, photolithographic masks have to project smaller and smaller structures onto a photosensitive layer, e.g., a photoresist on wafers. In order to fulfil this demand, the exposure wavelength of photolithographic masks has been shifted from the near ultraviolet across the mean ultraviolet into the far ultraviolet region of the electromagnetic spectrum. Presently, a wavelength of 193 nm is typically used for the exposure of the photoresist on wafers. As a consequence, the manufacturing of photolithographic masks with increasing resolution is becoming more and more complex, and thus more and more expensive as well. In the future, photolithographic masks will use significantly smaller wavelengths in the extreme ultraviolet (EUV) wavelength range of the electromagnetic spectrum (approximately 13.5 nm).

Photolithographic masks have to fulfil highest demands with respect to transmission homogeneity, planarity, pureness and temperature stability. For future EUV photolithographic masks the tolerable deviation of their substrates from the planarity is only a portion of a wavelength of the exposure wavelength in order to not significantly disturb the phase front of the electromagnetic wave reflected from a multi-layer structure on a surface of the substrate. Larger deviations of the planarity of the substrate of the photolithographic mask may lead to variations of the optical intensity distribution in the photoresist due to a constructive of a destructive addition of the wave front in the photoresist. At the further processing of the wafer, the variations of the optical intensity may result in the fabrication of defective semiconductor devices. Decreasing exposure wavelength makes this problem more challenging. The substrate as supplied from the manufacturer may not even fulfil the planarity condition for EUV photolithographic masks and the manufacturing process of the mask which forms fine patterns on one surface may even deteriorate the planarity of the substrate.

For transmissive photolithographic masks the homogeneity of the optical transmission across the mask area is an important parameter. A variation of the optical transmission across the area of the photolithographic mask leads to a corresponding variation of the local optical dose applied to the photoresist on the wafer. The variation of the locally applied dose results in a fluctuation or a variation of the structure dimension of a pattern element in the developed photoresist. The uniformity of a structure element across the area of the photolithographic mask is called critical dimension uniformity (CDU).

Furthermore, a curvature of the substrate of a photolithographic mask also leads to imaging errors of the mask. US patent publication 2007/0224522 A1 describes a method to improve the planarity of a manufactured photolithographic mask. To adjust a curvature of the substrate or to smooth the unevenness of the substrate, this document proposes forming a deformed or expanded portion in a predetermined region of the substrate wherein the substrate includes a curved region before forming the expanded portion. The expanded portion is generated by focussing femtosecond laser pulses in this region which locally modifies the bonding state of the substrate.

U.S. Pat. No. 7,001,697 B2 provides another method to eliminate intensity differences or optical transmission errors introduced by the photolithographic mask in the photoresist on a wafer. A diffraction pattern is etched on the rear substrate surface, which is the substrate surface opposite to the surface carrying the pattern elements, in order to compensate for the local differences in the optical intensity in the photoresist induced during a single illumination of the mask.

U.S. Pat. No. 7,241,539 B2 and US patent publication 2007/0065729 A1 disclose a further method to correct optical transmission errors or imaging errors introduced by a photolithographic mask or by the optical elements used for the illumination of the mask. By generating an array of shadowing elements in the substrate of the mask by again using femtosecond laser pulses, diffraction errors through the pattern elements are offset, so that an approximately uniform intensity of patterning radiation is transmitted through the mask substrate. Spacings, sizings and/or placements of the shadowing elements may be determined empirically using trial and error and/or by using simulation.

The action of femtosecond laser pulses on quartz or fused silica forming the substrate material of photolithographic masks has for example been investigated by S. Oshemkov, V. Dmitriev, E. Zait and G. Gen-Zvi: "DUV attenuation structures in fused silica induced ultrashort laser radiation", Proc. CLEOE-IQEC, Munich 2007. The pending U.S. provisional patent applications 61/324,467 and 61/351,056 of the applicant, which are herein incorporated by reference in their entirety, describe some aspects of the critical dimension correction (CDC) in photolithographic masks.

In addition to errors introduced due to diffraction at the pattern elements, the pattern elements forming the photolithographic mask may also be defective. U.S. Pat. No. 7,459,242 discloses a method for repairing a photolithographic mask having also a void in the chrome layer forming the pattern elements. By introducing a diffractive optical element or a shading element (DOE/SE) in the substrate of the photolithographic mask in front of the void the scattering properties of the substrate at the position of the DOE/SE is changed, thus correcting the void in the chrome layer on the substrate of the photolithographic mask.

Moreover, photolithographic masks may also have placement errors of pattern elements, i.e. some of the pattern elements do not image the pattern parameters exactly at the predetermined position on the photoresist. The effects of placement errors of pattern elements in the photoresist are normally reduced by performing a linear imaging transformation of the photolithographic mask with respect to the focus of the image field. By a small shift of the photolithographic mask in a plane parallel to the photoresist the overall effect of placement errors can be diminished. A rotation of the mask relative to the focus of the image plane may also decrease the sum of placement errors of the pattern elements on the substrate of the photolithographic mask. Furthermore, a further possibility for correcting placement errors of pattern elements is performing a scale correction of the imaging of the pattern elements of the photolithographic mask in the photoresist on the wafer. In case the placement errors of the pattern elements are still too large after a linear imaging transformation the mask has to be discarded.

The document DE 10 2006 054 820 A1 still goes a step further. This document proposes to introduce an array of local density variation in a portion of the substrate of the mask close to the placement error in order to shift the respective pattern elements. This shift of the pattern elements in a direction in order to minimize imaging errors of the photolithographic mask on the photoresist again reduces the sum of the overall placement errors of the mask and thus increases the yield of the mask fabrication process. The local density variations in the mask substrate are generated by locally and temporarily melting the substrate material using a femtosecond laser beam. This process locally diminishes the substrate density at the range the material has been temporary melted. A dot locally changed by a laser beam is called pixel. The shape, the density and the configuration of pixels necessary to perform a desired correction of a placement error for a pattern element is determined experimentally by executing a respective illumination of a plurality of samples which have pattern elements arranged thereon. The experimental results are then stored in a library.

The document DE 10 2006 054 820 A1 describes a method in which the placement errors of pattern elements on a substrate of a photolithographic mask is reduced in a two stage process. In a first step a linear imaging transformation is performed. In a second step the remaining placement errors are further reduced by selectively introducing a density variation in the substrate of the mask. If necessary, this loop can be repeated. However, this approach still retains an amount of errors of a photolithographic mask which can in many cases not be tolerated. Moreover, for each substrate material a comprehensive library of correcting tools has to be experimentally determined prior being able to correct placement errors which are not correctable by a linear imaging transformation of the photolithographic mask.

It is therefore one object of the present invention to provide a method and an apparatus for correcting photolithographic masks, so that the error remaining after error correction is minimal and thus increasing the yield of fabricated photolithographic masks.

SUMMARY OF THE INVENTION

According to a first aspect of the invention, a method for correcting a plurality of errors of a photolithographic mask comprises optimizing first parameters of an imaging transformation of the photolithographic mask and second parameters of a laser beam locally directed onto the photolithographic mask, and correcting the plurality of errors by applying an imaging transformation using optimized first parameters and locally directing the laser beam onto the photolithographic mask using optimized second parameters, wherein the first and the second parameters are simultaneously optimized in a joint optimization process.

The simultaneous variation of the imaging parameters and of the laser beam parameters expands the dimension of the variation space of the optimization process compared to the step-wise optimization according to the prior art. The expanded solution space in a joint optimization process for the imaging parameters and the laser beam parameters results in a reduction of the overall error of photolithographic masks not attainable with prior art optimization processes. Thus, the application of the defined error correction method will significantly increase the yield of the mask fabrication process.

According to a further aspect, the present invention comprises setting up a target functional comprising error data, first imaging transformation parameters and second laser beam parameters, and minimizing the target functional by simultaneously varying the first imaging transformation parameters and the second laser beam parameters. In still another aspect, a Lagrange variational principle is used to set-up the target functional. In a further aspect, the target functional minimizes a potential energy distribution introduced into the photolithographic mask by the first and the second parameters. In still another aspect, the imaging transformation comprises a linear imaging transformation.

A further important aspect of the present invention is to establish a general relation between the laser beam parameters and the effect induced by a laser beam having this laser beam parameters in a substrate of a photolithographic mask. The establishment of such a relation allows the determination of laser beam parameters necessary for the correction of a special type of mask errors. Moreover, a relation between laser beam parameters and induced effects in a substrate of a photolithographic mask allows determining optimized laser beam parameters in order to locally direct the laser beam onto the substrate of a mask to simultaneously correct different types of errors of the photolithographic mask by only one time directing the laser beam onto the photolithographic mask or in a single process of writing pixels by the laser beam.

In another aspect, the linear imaging transformation comprises two parameters for a photolithographic mask shift, two parameters for a photolithographic mask scaling and two parameters for a generalized rotation of the photolithographic mask.

According to a further aspect, the second laser beam parameters comprise an energy of the laser beam and/or a numerical aperture and/or a focus size and/or a beam polarization and/or an astigmatism and/or a pulse length and/or a repetition rate and/or a number of pulses directed onto one location of the photolithographic mask and/or a distance between two locations the laser beam is directed onto the photolithographic mask.

In another aspect, the laser beam locally modifies a density and/or an optical transmission distribution of the photolithographic mask. In an aspect, the locally modified density and/or the optical transmission distribution of the photolithographic mask is discontinuously modified within a plurality of small volumes of the photolithographic mask, wherein each small volume is called a pixel. In an alternative aspect, the locally modified density and/or the optical transmission distribution of the photolithographic mask is continuously modified across the photolithographic mask.

This means that the density of the substrate of the photolithographic mask can be specifically modified by locally introducing pixels into the mask substrate and the optical transmission distribution can be separately modified by continuously modifying the mask by using a different set of laser beam parameters. Thus, the correction of registration errors and the correction of errors of the optical transmission distribution can essentially be separated.

According to a further aspect, the density and/or the optical transmission distribution of the photolithographic mask is modified by a stress distribution introduced by a strain distribution caused by the laser beam, wherein the stress distribution and the strain distribution are connected by Hooke's law.

In still a further aspect, a displacement of a node of a rectangular grid extending across the photolithographic mask is a function of the second laser beam parameters.

According to another aspect, the second laser beam parameters determine at least one writing density amplitude and at least one deformation element in a normal direction perpendicular to the laser beam introduced in the photolithographic mask by the laser beam. In still a further aspect the at least one writing density amplitude $a_m^\alpha$ of a mode m in a cell α and the at least one deformation element in at least one normal direction l, $t_l^m$ of mode m in the cell α introduce a displacement $\xi_i$ of node i given by $$\xi_i = \sum_{jk\alpha lm} (P_{ij}^g)^{-1} P_{jk\alpha}^w a_m^\alpha N_{kl} t_l^m,$$

wherein the tensor $(P_{ij}^g)^{-1}$ is the inverse tensor of a potential energy distribution prior to correcting the plurality of errors, and $P_{jk\alpha}^w$ is an element of the tensor describing the potential energy distribution after directing the laser beam onto the photolithographic mask, both tensors comprise material parameters of the photolithographic mask, and $N_{kl}$ is a normalization tensor.

This equation connects the second laser beam parameters of the laser beam with their effect onto the photolithographic mask. This means that the inventive method uses material parameters of the photolithographic mask and basic physical law in order to determine the effect light pulses of the laser beam induce in the substrate material of the photolithographic mask.

In another aspect, the writing density amplitude of the laser beam is below a damage threshold of the photolithographic mask. The laser beam parameters have to be selected so that on the one hand the laser beam locally modifies the density and/or the optical transmission distribution of the substrate of the photolithographic mask, but on the other hand does not locally damage the substrate of the photolithographic mask.

According to still a further aspect, the displacement at a position on the photolithographic mask is determined from a linear combination of the displacements of all grid nodes.

In a further aspect, the error data comprises data indicating the locations of the plurality of errors. According to another aspect, the error data is determined from at least one measurement of the photolithographic mask and/or from at least one measurement of a wafer illuminated using the photolithographic mask and/or is provided by a manufacturer of a substrate of the photolithographic mask. In another aspect, a portion of the plurality of errors originating from the imaging transformation is determined from the at least one measurement of the wafer illuminated using the photolithographic mask.

According to another aspect, the photolithographic mask comprises a plurality of pattern elements of at least one absorbing material arranged on the photolithographic mask.

In another aspect, the error data comprises differences between determined positions of pattern elements of the photolithographic mask and predetermined positions of the pattern elements. According to another aspect, the error data comprises differences between determined positions of pattern elements on the wafer illuminated using the photolithographic mask and predetermined positions of the pattern elements on the wafer. In an alternative aspect, the error data comprises differences between a determined optical transmission distribution of the photolithographic mask and a predetermined optical transmission distribution of the photolithographic mask. In a further aspect, the error data comprises differences between the determined optical transmission distribution of the photolithographic mask and the predetermined optical transmission distribution of the photolithographic mask and differences between determined positions of pattern elements on the photolithographic mask or on the wafer illuminated using the photolithographic mask and predetermined positions of the pattern elements on the photolithographic mask or on the wafer illuminated using the photolithographic mask.

In a further aspect, the error data comprises differences between calculated positions of pattern elements on the wafer illuminated using the photolithographic mask and predetermined positions of the pattern elements on the wafer. According to another aspect, the calculated positions of pattern elements are determined from locally directing the laser beam onto the photolithographic mask in order to correct a first type of the plurality of errors. In still a further aspect, the error data comprises differences between a calculated optical transmission distribution of the photolithographic mask and a predetermined optical transmission distribution of the photolithographic mask. In still another aspect, the calculated optical transmission distribution is determined from locally directing the laser beam onto the photolithographic mask in order to correct a second type of the plurality of errors.

In addition to measuring errors, errors which are newly introduced in the substrate of the photolithographic mask when correcting for example registration errors can also be calculated. The calculated errors can be corrected by again directing the laser beam onto the substrate of the photolithographic mask in a second writing process.

In yet another aspect, the target functional is minimized as a mean square of residual displacements using a Tikhonov regularization.

According to another aspect, the target functional having a number of m writing density amplitudes $a_m^\alpha$ and deformation elements in normal directions l, $t_l^m$ of mode m in cell α is of the form:

$$\min\left\{\sum_i \left(\varphi_i + \varsigma_i + \sum_k T_{ik} s_k\right)^2 + \lambda^s \sum_k s_k^2 + \sum_k \lambda_m^\alpha a_k^{m\,2}\right\},$$

wherein $\phi_i$ comprises differences between determined positions of pattern elements of the photolithographic and predetermined positions of the pattern elements, and wherein a displacement $\zeta_i$ at an arbitrary position of the photolithographic mask is determined by a linear transformation from the displacements at the nodes $\xi_i$ with $$\varsigma_i = \sum_j M_{ij} \xi_j$$

where $M_{ij}$ is the transformation matrix between $\zeta_i$ and $\xi_i$, wherein further the connection of the displacements $\xi_i$ at nodes i with the writing density amplitudes $a_m^\alpha$ and the deformation elements in normal directions $t_l^m$ introduced by the laser beam is defined on the preceding page, and wherein additionally the third term describes the linear imaging transformation, where the vector s={$m_x$, $m_y$, $s_x$, $s_y$, $r_x$, $r_y$} contains the linear imaging coefficients and the tensor $T_{ik}$ translates the linear imaging coefficients $s_k$ in displacements in the plane of the nodes and wherein finally the last two sums are the terms of the Tikhonov regularization.

According to a beneficial aspect, the target functional comprises at least one weighting function as a constraint in an active area and/or in a non-active area of the photolithographic mask. In another aspect, the at least one weighting function prefers locally directing the laser beam close to the centre of the active area of the photolithographic mask. In a further aspect, the at least one weighting function restricts directing the laser beam to areas of the pattern elements. In still another aspect, the at least one weighting function restricts directing the laser beam around areas of the pattern elements. According to still another aspect, the density of pixels decreases with increasing distance from the pattern elements. In a further aspect, the at least one weighting function compromises the correction of different types of errors when locally directing the laser beam onto the photolithographic mask. According to a further beneficial effect, the at least one weighting function balances errors introduced by locally directing the laser beam onto a first area of the photolithographic mask by locally directing the laser beam onto a second area of the photolithographic mask.

In another aspect, the plurality of errors comprises different types of the plurality of errors. According to a further aspect, the different types of the plurality of errors comprise registration errors and/or optical transmission distribution errors and/or planarity errors. In another aspect, the pixels and/or the continuously modified density are arranged in at least one single layer in the height of the substrate in the photolithographic mask. According to a beneficial aspect, the pixels and/or the continuously modified density are arranged in at least two layers in the height of the substrate in the photolithographic mask. In still another aspect, the pixels that are arranged in the at least two layers are generated with different laser beam parameters. In a further aspect, errors not corrected and/or introduced when locally directing the laser beam onto the substrate of the photolithographic mask generating pixels in a first layer for correcting the plurality of errors are corrected by again directing the laser beam onto the photolithographic mask and generating pixels in a second layer of the photolithographic mask.

In a further beneficial aspect, the photolithographic mask comprises a transmissive photolithographic mask. In an alternative aspect, the photolithographic mask comprises a reflective photolithographic mask. In a further alternative aspect, the photolithographic mask comprises a template for the nanoimprint lithography.

According to another aspect, the weighting function is constructed to simultaneously correct registration errors and flatness errors of the plurality of errors.

In a further aspect, the laser beam is not directed onto an active area of the photolithographic mask.

By not directing the laser beam onto the active area of the photolithographic mask, it is secured that no new or additional errors are introduced in the active area of the photolithographic mask during correcting identified errors. On the other hand, it is clear that limiting the area for the error correction which may additionally be far from the defective area results in a less effective correction process. This drawback can at least partially be compensated by directing the laser beam onto the non-active area of the mask using higher pulse energies.

Another aspect comprises introducing at least two weighting functions in the target functional for controlling displacements in two perpendicular directions, in particular a x direction and a y direction, and solving the target functional in an iterative process by varying the weighting functions. In still a further aspect the target functional for a single writing density amplitude $a^\alpha$ having the weighting functions $w_i$ is of the form:

$$\min\left\{\sum_i w_i \left(\varphi_i + \sum_{jk\alpha ln} M_{in}(P^g_{nj})^{-1} P^w_{jk\alpha} a^\alpha N_{kl} t_l + \sum_k T_{ik} s_k\right)^2 + \lambda^s \sum_k s_k^2 + \lambda \sum_k a_k^2\right\},$$

where the weighting functions for the iteration process with the index k are $$w_x^k = \frac{1 - w^k}{2} \text{ and } w_y^k = \frac{1 + w^k}{2}$$

with $w_{2i}^k = w_x^k$ and $w_{2i+1}^k = w_y^k$ and further with $w^0 = 0$ and variation limits of $w_{min}^0 = -1$ and $w_{max}^0 = +1$, and wherein $a^\alpha = 0$ within the active area of the photolithographic mask. In yet another aspect, the iteration process comprises stopping the iteration when induced displacements exceed a predetermined threshold; determining a direction having the largest difference to the predetermined threshold; when the induced displacements in the determined direction exceed the threshold, stopping the iteration; when the x direction has the largest difference to the predetermined threshold selecting $$w^{k+1} = \frac{w^k + w_{min}^k}{2}$$

and modifying a variation limit to $w_{max}^{k+1} = w^k$, $w_{min}^{k+1} = w_{min}^k$; when the y direction has the largest difference to the predetermined threshold selecting $$w^{k+1} = \frac{w^k + w_{max}^k}{2}$$

and modifying a variation limit to $w_{max}^{k+1} = w^k$, $w_{min}^{k+1} = w^k$; and repeating the iteration process and taking the last weighting function as the solution for the respective direction.

According to a further aspect, the laser beam and/or the photolithographic mask is rotated by an angle around an axis parallel to the laser beam for a portion of a time period the laser beam is directed onto the photolithographic mask.

The pixels of a single set of laser beam parameters induce an asymmetry in the plane perpendicular to the laser beam, since the laser beam is normally not perfectly symmetrical in the plane perpendicular to the beam direction. The application of two laser beams rotated relative to each other around the beam direction provides a simple means to at least partially compensate for the asymmetry introduced by the laser beam.

In another aspect, the rotation angle of the laser beam and/or of the photolithographic mask is 90°. In still a further aspect, the time period the laser beam is directed onto the photolithographic mask without rotation of the photolithographic mask and/or of the laser beam is 50% of the overall time period the laser beam is directed onto the photolithographic mask.

In another aspect, directing the laser beam onto the photolithographic mask does not introduce a variation of an optical transmission distribution for a laser beam at the exposure wavelength of the photolithographic mask.

This aspect of the inventive method secures that the correction of identified errors does not introduce new errors in the active area of the mask.

According to a further aspect, directing the laser beam onto the photolithographic mask introduces a constant modification of the optical transmission across the photolithographic mask for the laser beam at the exposure wavelength. In still a further aspect, directing of the laser beam onto the photolithographic mask is performed with at least one first set of second laser beam parameters having a first writing density amplitude $a_1^\alpha$ and with at least one second set of second laser beam parameters having a second writing density amplitude $a_2^\alpha$ in order not to introduce a variation of the optical transmission distribution across the photolithographic mask for the laser beam at the exposure wavelength. In yet a further aspect, the target functional for optimizing the partitioning between the first and the second writing density amplitudes is of the form:

$$\min\left\{\sum_i w_i\left(\varphi_i + \sum_\alpha \Phi_{i\alpha}^1 a_1^\alpha + \sum_\alpha \Phi_{i\alpha}^2 a_2^\alpha + \sum_k T_{ik}s_k\right)^2 + \lambda^s \sum_k s_k^2 + \lambda_1^a \sum_k a_k^{1^2} + \lambda_2^a \sum_k a_k^{2^2}\right\}$$

wherein the condition of constant optical transmission in cell a requires that $a_1^\alpha + a_2^\alpha = c$, where c is an arbitrary constant.

According to another aspect, directing the laser beam onto the photolithographic mask additionally introduces a predetermined variation of the optical transmission distribution across the photolithographic mask for the laser beam at the exposure wavelength of the photolithographic mask.

By locally directing a laser beam onto the substrate of the photolithographic mask having parameters fulfilling this condition, both registration errors and optical transmission distribution errors or CDU errors can simultaneously be corrected in a single process of writing pixels in the mask substrate.

In a further aspect, directing of the laser beam onto the photolithographic mask is performed with at least one first set of second laser beam parameters and with at least one second set of second laser beam parameters in order to additionally introduce the predetermined variation of the optical transmission across the photolithographic mask for the laser beam at the exposure wavelength. In still another aspect, the target functional defined above is used for optimizing the partitioning between the first $a_1^\alpha$ and second writing density amplitudes $a_2^\alpha$ with the additional condition for each cell $\alpha$: $a_1^\alpha + a_2^\alpha = a^\alpha$ with $a^\alpha = \int_\alpha T_{Mod}(x,y)dxdy / \int_\alpha dxdy$ within the cells in the active area and with $a^\alpha = const$ in cells outside of the active area of the photolithographic mask where $T_{mod}$ is the predetermined variation of the optical transmission distribution in the active area.

A further aspect, the inventive method comprises directing the laser beam on the photolithographic mask in order to correct errors newly introduced in the photolithographic mask by correcting optical transmission distribution errors in the active area of the photolithographic mask.

It is already known that the correction of optical transmission distribution errors or CDU errors by directing a laser beam onto the mask substrate or by writing pixels in the substrate of the photolithographic mask may introduce registration errors which have not been observed prior to the CDU correction process. By taking an appropriate constraint in the target functional into account when minimizing the target functional, the inventive method allows to correct these registration errors.

In another aspect, the errors newly introduced are registration errors, and wherein the registration errors are corrected by directing the laser beam with a first set of laser beam parameters onto the active area and with a second set of laser beam parameters onto the non-active area of the photolithographic mask. In still another aspect, the registration errors are corrected by directing the laser beam onto the non-active area of the photolithographic mask. Still a further aspect of the inventive method, directing the laser beam onto the non-active area of the photolithographic mask comprises using one single set of second laser beam parameters across the non-active area.

In another aspect, directing the laser beam onto the non-active area of the photolithographic mask comprises at least two frames surrounding the active area of the photolithographic mask, wherein each frame has one set of second laser beam parameters, and the introduced density modification decreases when directing the laser beam onto the frames decreases towards a boundary of the photolithographic mask. In still a further aspect, the target functional having writing density amplitudes $a_j^{cdc}$ to correct optical transmission errors in the active area and having writing density amplitudes $a_j^{apo}$ in the non-active area to correct registration errors is of the form:

$$\min\left\{\sum_i \left(\sum_j \Phi_{ij}^{cdc} a_j^{cdc} + \sum_j \Phi_{ij}^{apo} a_j^{apo} + \sum_j T_{ij}s_j\right)^2 + \lambda^s \sum_j s_j^2 + \lambda^a \sum_j a_j^{apo^2}\right\},$$

wherein the first term takes the displacements into account introduced by the optical transmission distribution correction in the active area of the photolithographic mask, the second term defines the displacements introduced by the laser beam when directing the laser beam onto the non-active area, and the writing density amplitudes $a_j^{apo}$ are only defined in the non-active area of the photolithographic mask.

In still a further aspect of the inventive method, directing the laser beam on the photolithographic mask comprises at least two sets of laser beam parameters so that correction of optical transmission distribution errors across the photolithographic mask does not introduce registration errors into the photolithographic mask.

By locally directing a laser beam onto the substrate of the photolithographic mask having at least two different sets of laser beam parameters or writing modes, which induce different effects in the mask substrate, optical transmission distribution errors or CDU errors can be corrected without introducing any new registration errors.

According to another aspect, the first set of second laser beam parameters comprises a first laser beam and the second set of second laser beam parameters comprises a second laser beam, wherein the second laser beam is rotated relative to the first laser beam around a beam direction. In another aspect, the photolithographic mask is rotated around an axis parallel to the laser beam. In still a further aspect, the laser beam and/or the photolithographic mask is rotated by 90°. According to another aspect, a temporal and/or a spatial distribution of directing of the first and the second laser beams across the photolithographic mask removes a variation of the optical transmission across the photolithographic mask and minimizes introducing of new errors into the photolithographic mask. In another aspect of the inventive method for optimizing partitioning between writing density amplitudes $a_j^{cdc00}$ for the first not rotated laser beam and writing density amplitudes $a_j^{cdc90}$ for the second rotated laser beam, the target functional is of the form:

$$\min\left\{\sum_i \begin{pmatrix}\left(\sum_j(\Phi_{ij}^{cdc00}-\Phi_{ij}^{cdc90})a_j^{cdc00}+\sum_j\Phi_{ij}^{cdc90}a_j^{cdc}+\sum_j T_{ij}s_j\right)^2++\\ \lambda^s\sum_j s_j^2+\lambda^a\left(\sum_j\left(a_j^{cdc00^2}+(a_j^{cdc}-a_j^{cdc00^2})^2\right)\right)\end{pmatrix}\right\},$$

with the additional condition for cell j within the active area of the photolithographic mask: $a_j^{cdc00}+a_j^{cdc90}=a_j^{cdc}$.

According to another aspect, the first set of second laser beam parameters comprises laser pulses having an energy several time higher than the second set of second laser beam parameters and/or wherein the first set of second laser beam parameters having a pulse density on the photolithographic mask which is several times lower than for the second set of second laser beam parameters.

The application of a laser beam having different pulse energies at different portions of the mask substrate allows the correction of optical transmission errors without the generation of new errors in the active area of the photolithographic mask, in particular registration errors.

In a further aspect, a ratio between the energy of the first set and the second set of second laser beam parameters comprises a range of 1.5-10, preferably of 1.8-7 and most preferably of 2-4. In still a further aspect, the optimal partitioning between the first set or standard energy mode (std) and the second set or low energy mode (le) of laser beam parameters is determined from a target functional having the form:

$$\min\left\{\sum_i\begin{pmatrix}\left(\sum_j(\Phi_{ij}^{std}-\Phi_{ij}^{le})a_j^{std}+\sum_j\Phi_{ij}^{le}a_j^{cdc}+\sum_j T_{ij}s_j\right)^2++\\ \lambda^s\sum_j s_j^2+\lambda^a\left(\sum_j(a_j^{std^2}+(a_j^{cdc}-a_j^{std})^2)\right)\end{pmatrix}\right\},$$

with the additional condition for the standard energy density writing amplitude $a_j^{std}$ of the first set of the second laser beam parameters and the low energy density writing amplitude $a_j^{le}$ for the second laser beam for cell j within the active area of the photolithographic mask: $a_j^{std}+a_j^{le}=a_j^{cdc}$ and wherein low energy density writing amplitudes of the first set of the second laser beam parameters are compensated by a higher pulse density.

In a further aspect, the pulse energy is 0.05 µJ to 5 µJ, the pulse length is 0.05 ps to 100 ps, the repetition rate is 1 kHz to 10 MHz, a pulse density is 1,000 pulses per mm² to 10,000,000 pulses per mm², the numerical aperture (NA) of an objective is 0.1 to 0.9 and the magnification of the objective is 5× to 40×. According to another aspect, the first set of second laser beam parameter comprises a pulse energy of 0.45 µJ-0.55 µJ, a pulse duration of 5-10 ps, a repetition rate of 10 kHz-100 kHz, a NA of the objective of 0.3-0.4, a magnification of the objective of 10×-20× and a pulse density of 1,000-100,000 pulses per mm², and the first set of the second laser beam parameters has a pulse energy of 0.27 µJ-0.37 µJ and a pulse density of 5,000-500,000 pulses per mm².

In still a further aspect, directing the laser beam on the photolithographic mask comprises at least three sets of second laser beam parameters, a first set and a second set for directing the laser beam onto the active area having different pulse energies and a third set for directing the laser beam onto the non-active area of the photolithographic mask.

By locally directing a laser beam onto the substrate of the photolithographic mask having at least three different sets of laser beam parameters or writing modes, the flexibility for the correction of different types of errors or for the consideration of basic or boundary conditions is further increased. Thus, this aspect of the inventive method facilitates the simultaneous correction of registration errors and optical transmission errors, since directing the laser beam with different sets of second laser beam parameters onto the photolithographic mask increases the flexibility to locally modify the substrate of the photolithographic mask.

According to another aspect, the optimal partitioning between the first set or standard energy mode (std) and the second set or low energy mode (le) and the third set (apo) of laser beam parameters is determined from the target functional:

$$\min\left\{\sum_i\begin{pmatrix}\left(\sum_j(\Phi_{ij}^{std}-\Phi_{ij}^{le})a_j^{std}+\sum_j\Phi_{ij}^{le}a_j^{cdc}+\sum_j\Phi_{ij}^{apo}a_j^{apo}+\\ \sum_j T_{ij}s_j\right)^2++\lambda^s\sum_j s_j^2+\lambda^a\left(\sum_j(a_j^{std^2}+(a_j^{cdc}-a_j^{std})^2+a_j^{apo^2})\right)\end{pmatrix}\right\}.$$

In another aspect, the target functional is used in order to minimize an overlay error between at least one first photolithographic mask and at least one second photolithographic mask.

For the fabrication of a semiconductor device normally a series of photolithographic masks is successively applied on the same wafer during the manufacturing process in order to generate complex structures on the wafer. In many applications the absolute location of the mask pattern with respect to the optical axis is not as important as the orientation of two or more masks relative to each other so that overlay critical structures can be printed onto the wafer. So the target is not to bring a first photolithographic mask to the best match with a predetermined design, but to obtain the best match with a second mask. The inventive method can also be used to correct such overlay errors of two or more photolithographic masks. In particular, if the first and the second parameters of both masks can simultaneously be varied the relative orientation of the two masks can be optimized with a low remaining registration error.

In a further aspect, the target functional comprises a plurality of registration differences between the at least first and the at least second photolithographic masks and the overlay error is maximized by minimizing the target functional. In yet another aspect, the registration of the first photolithographic mask is fixed and the registration of the second photolithographic mask is varied by the target functional. According to a further aspect, the registration of the first and of the second photolithographic mask is varied by the target functional. Furthermore, in another aspect, the parameters $\phi_i$ of the target functional given on page 10 describe the registration of the first photolithographic mask, the parameters $\zeta_i$ of the above mentioned target functional describe the registration of the second photolithographic mask and the above mentioned target functional is used with a condition: $-a<a_j^m<a$, wherein the positive part of the writing density amplitudes $a_j^m$ is corrected onto the first photolithographic mask and the negative part is corrected onto the second photolithographic mask.

Finally, in a further aspect, an apparatus for correcting a plurality of errors of a photolithographic mask comprises at least one computing means operable for simultaneously optimizing first parameters of an imaging transformation of the photolithographic mask and second parameters of a laser beam locally directed onto the photolithographic mask, at least one laser source for generating the laser beam of light pulses according to optimized second laser beam parameters, and at least one scanning means for performing an imaging transformation according to optimized first linear imaging parameters.

Further aspects of the invention are described in further dependent claims.

DESCRIPTION OF THE DRAWINGS

In order to better understand the present invention and to appreciate its practical applications, the following Figures are provided and referenced hereafter. It should be noted that the Figures are given as examples only and in no way limit the scope of the invention.

FIG. 1 shows in cross-section a schematic view of a transmissive photolithographic mask;

FIG. 2b schematically depicts a cross-sectional view of a template used in the nanoimprint lithography;

FIG. 21a schematically shows the registration change induced by the correction writing map of FIG. 19a;

FIG. 27b depicts the correction writing map necessary to correct the CD uniformity problem of FIG. 27a;

FIG. 28a indicates the optimized correction writing map for the first writing mode for the registration and CD uniformity problem of FIG. 27a;

FIG. 28b shows the optimized correction writing map for the second writing mode for the registration and CD uniformity problem of FIG. 27a;

FIG. 28c presents the optimized correction writing map combined for the first (FIG. 28a) and the second writing mode (FIG. 28b) for the registration and CD uniformity problem of FIG. 27a;

FIG. 34b schematically depicts the registration change induced by the apodization writing map of FIG. 33a;

FIG. 35a shows the registration change after the writing of CDC and the APO (apodization) corrections of FIGS. 30 and 34a;

FIG. 36b schematically depicts the registration change induced by the fading apodization writing map of FIG. 36a;

FIG. 37a presents a writing map combining the test CD correction of FIG. 30 and the fading apodization of FIG. 36a;

FIG. 37b schematically depicts the registration change induced by the test CD correction and fading apodization writing map of FIG. 37a;

FIG. 38b schematically depicts the registration change induced by the test CD correction and fading apodization writing map of FIG. 38a;

FIG. 39b schematically presents the registration change induced by the apodization writing map of FIG. 39a;

FIG. 40b schematically depicts the registration change induced by the CD correction map of FIG. 40a;

FIG. 41a presents an apodization writing map calculated with respect to the CDC task of FIG. 40a;

FIG. 42a presents the writing map combining the CD correction of FIG. 40a and the calculated apodization of FIG. 41a;

FIG. 42b schematically depicts the registration change induced by the CDC and APO writing map of FIG. 42a;

FIG. 43a presents the correction writing map of FIG. 42a measured at the photolithographic mask of FIG. 40a;

FIG. 43b schematically depicts the registration change induced by the correction map of FIG. 43a;

FIG. 47a schematically shows the registration change induced by the CD correction writing map of FIG. 46a;

FIG. 56 schematically shows the initial overlay problem of masks B and C of FIGS. 54a and 55a;

DETAILED DESCRIPTION OF PREFERRED EMBODIMENTS

Figure 2A:
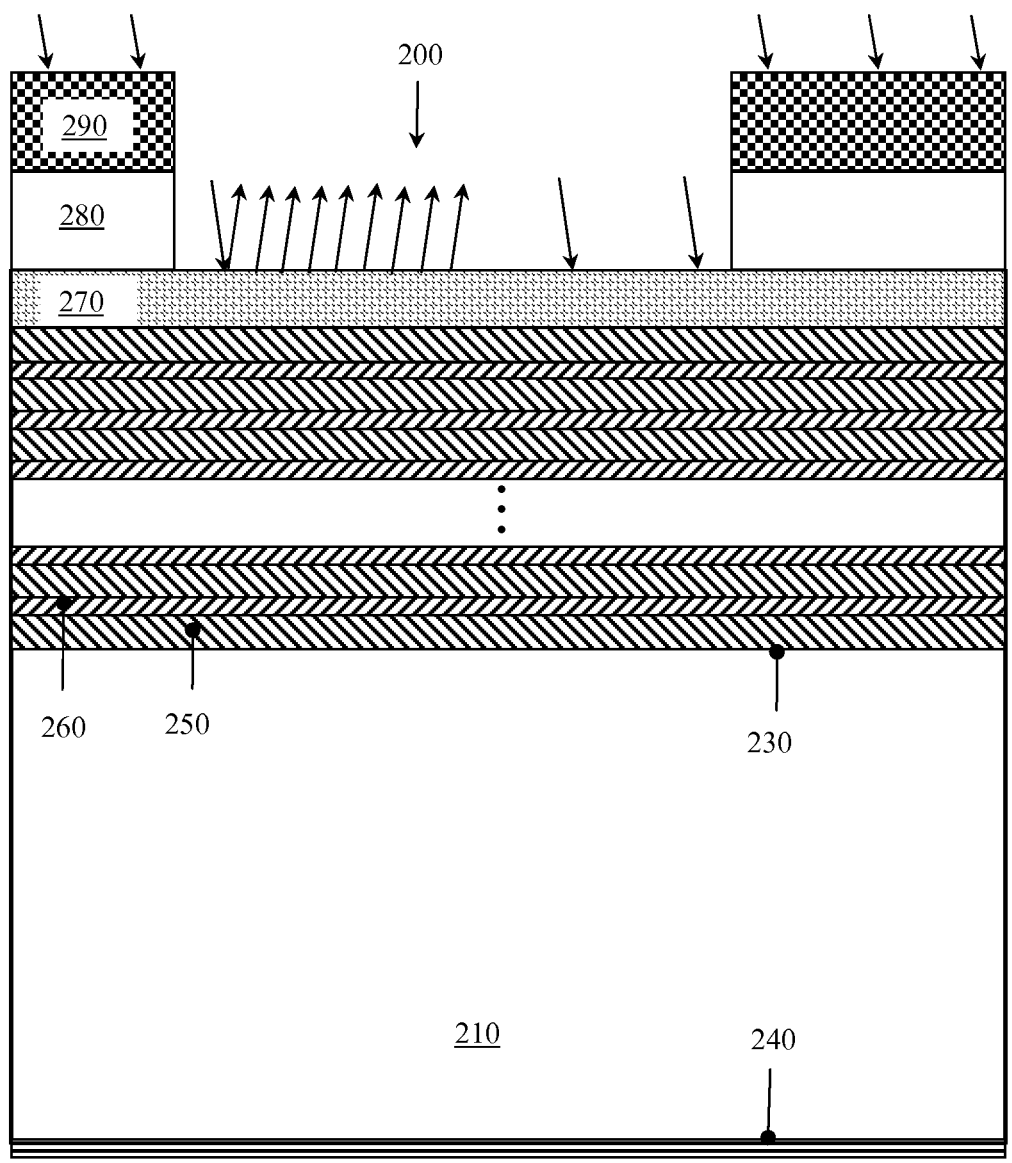
FIG. 2a shows in cross-section a schematic view of a reflective photolithographic mask.

This part of the specification is organized as follows: It begins with the introduction of some technical terms and of some problems with respect to photolithographic masks and then describes the apparatus used to correct these problems ("photolithographic masks and laser system"). In the second part entitled "registration problems" the inventive method is then applied in order to primarily correct registration errors of a photolithographic mask. A third part entitled "CDU problems" discusses the application of the inventive principle in order to primarily correct critical dimension uniformity (CDU) problems. Further, in the fourth part entitled "overlay problems" the inventive method is used in order to minimize overlay problems between different photolithographic masks in a stack of masks. Finally, the theoretical and/or mathematical background of the inventive method necessary for the discussion of the various examples in this section is presented in an own section entitled "theoretical background".

Photolithographic Masks and Laser System

In the following, the present invention will be more fully described hereinafter with reference to the accompanying Figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

FIG. 1 represents a schematic cross-section view of an example transmissive photolithographic mask 100. The mask 100 comprises a substrate 110 having a first or front surface 130 and a second or rear surface 140. The substrate 110 has to be transparent for the wavelength used for the illumination of the photoresist on a wafer. For example, the exposure wavelength may be in the deep ultraviolet (DUV) spectral range of the electromagnetic spectrum, in particular around 193 nm. The substrate material comprises typically quartz. For example, the substrate has typical lateral dimensions of 152 mm×152 mm and a thickness or height of essentially 6.35 mm. The substrate 110 of the photolithographic mask 100 has on its front surface 130 pattern elements 120 normally fabricated from chromium which form on the photoresist the predetermined structure elements from which semiconductor devices are produced. The portion of the substrate 110 of the photolithographic mask 100 carrying pattern elements 120 is called an active area 150 of the mask, whereas the boundary portion which does not have pattern elements 120 is called a non-active area 160. A laser beam at the exposure wavelength illuminates the substrate 110 of the mask 100 through the second or rear surface 140 of the substrate 110.

FIG. 2a shows a schematic cross-sectional view of an example reflective photolithographic mask 200 for use in the extreme ultraviolet (EUV) spectral range of the electromagnetic spectrum, in particular for an exposure wavelength of about 13.5 nm. Different from the photolithographic mask 100 of FIG. 1, the mask 200 is a reflective optical element based on a multi-layer mirror structure. The multi-layer mirror system of the photolithographic mask 200 is deposited on a front substrate surface 230 of a suitable substrate 210, such as fused silica substrate. Other transparent dielectrics, glass materials or semiconducting materials may also be applied as substrates for EUV photolithographic masks as for example ZERODUR®, ULE® or CLEARCERAM®.

The multi-layer mirror system comprises, e.g., 40 pairs of alternating molybdenum (Mo) 250 and silicon (Si) layers 260. For example, the thickness of each Mo layer 250 is 4.15 nm and that of the Si layer 260 amounts to 2.80 nm. In order to protect the multi-layer structure, a capping layer 270 of silicon with a native oxide of, e.g., 7 nm depth is arranged on top of the structure. In the multi-layer mirror system, the Mo layers 250 act as scattering layers, whereas the silicon layers 260 function as separation layers. The photolithographic mask 200 has on top of the multi-layer system, a capping layer 270 of silicon, a buffer structure 280 and an absorbing structure 290 as pattern elements.

FIG. 2b schematically illustrates an example template 295 used in the nanoimprint lithography to transfer pattern elements on the wafer. The template 295 comprises a material which is transparent in the UV and DUV spectral range, often fused silica is used as a template material. The pattern elements on the front template side 296 are fabricated in a process which is very similar to the fabrication of the pattern elements 120 of the photolithographic mask 100 of FIG. 1. Thus, the inventive principle can also be applied to correct various kinds of errors of a template used in the nanoimprint lithography. The template 295 is illuminated by electromagnetic radiation 298 through the template rear side 297.

Figure 3:
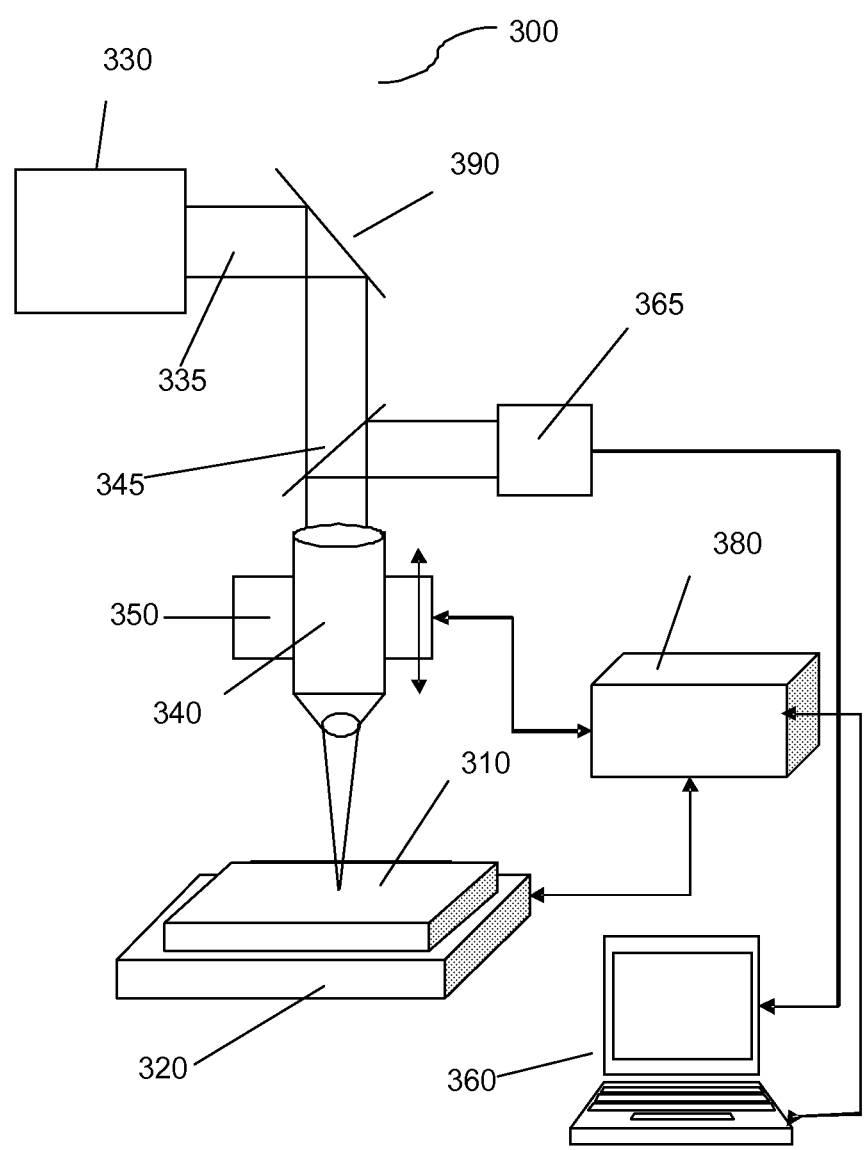
FIG. 3 schematically represents a block diagram of an apparatus for the modification of the substrate of the photolithographic masks of FIGS. 1 and 2.

FIG. 3 depicts a schematic block diagram of an example apparatus 300 which can be used to correct errors of the photolithographic masks 100 and 200 of FIGS. 1 and 2a as well as of a template 295 of FIG. 2b. The apparatus 300 comprises a chuck 320 which may be movable in three dimensions. The photolithographic mask 310 may be fixed to the chuck 320 by using various techniques as for example clamping. The photolithographic mask 310 may be the photolithographic mask 100 or 200 mounted upside down, so that its rear substrate surface 140 or 240 is directed towards the objective 340 or it may be the template 295 of FIG. 2b.

The apparatus 300 includes a pulse laser source 330 which produces a beam or a light beam 335 of pulses or light pulses. The laser source 330 generates light pulses of variable duration. The pulse duration may be as low as 10 fs but may also be continuously increased up to 100 ps. The pulse energy of the light pulses generated by the pulsed laser source 330 can also be adjusted across a huge range reaching from 0.01 µJ per pulse up to 10 mJ per pulse. Further, the repetition rate of the light pulses comprises the range from 1 Hz to 100 MHz. In a preferred embodiment the light pulses may be generated by a Ti:Sapphire laser operating at a wavelength of 800 nm. However, the methods described in the following are not limited to this laser type, principally all laser types may be used having a photon energy which is smaller than the band gap to the substrate of the photolithographic mask 310 and which are able to generate pulses with durations in the femtosecond range. Therefore, for example Nd—YAG laser or dye laser systems may also be applied.

The apparatus 300 may also comprise more than one pulse laser source 330 (not shown in FIG. 3).

The following table represents an overview of laser beam parameters of a frequency-doubled Nd—YAG laser system which is used in an embodiment of the inventive method.

TABLE 1

Numerical values of selected laser beam parameters for a Nd-YAG laser system Overview

| Parameter | Numerical value | Unit |
| --- | --- | --- |
| Pulse energy | 0.05-5 | µJ |
| Pulse length | 0.05-100 | ps |
| Repetition rate | 1-10,000 | kHz |
| Pulse density | 1,000-10,000,000 | mm$^{-2}$ |
| NA | 0.1-0.9 | |
| Wavelength | 532 | nm |

The following tables indicate parameters of differently influencing the density and/or the optical transmission distribution of the substrate 110 of the photolithographic mask 100. Table 2 presents parameters of an embodiment using a frequency-doubled Nd—YAG laser system for a mode of introducing or writing pixels called standard process window (std PW).

TABLE 2

Numerical values of selected laser beam parameters for a Nd-YAG laser system for a standard process window Std PW (standard process window)

| Parameter | Numerical value | Unit |
| --- | --- | --- |
| Pulse energy | 0.45 | µJ |
| Pulse length | 8 | ps |
| Repetition rate | 50,000 | kHz |
| Pulse density | 1,000-100,000 | mm$^{-2}$ |
| NA | 0.3 | |
| Wavelength | 532 | nm |

Table 3 summarizes parameters of a mode called low registration process window (LowReg PW) again of an embodiment using a frequency-doubled Nd—YAG laser system. This operation mode of the laser system 330 uses light pulses having a lower energy than the std PW, but introduces a higher pixel density.

TABLE 3

Numerical values of selected laser beam parameters for a Nd-YAG laser system for a low registration process window (LowReg PW) Low Reg PW (low registration process window)

| Parameter | Numerical value | Unit |
| --- | --- | --- |
| Pulse energy | 0.32 | µJ |
| Pulse length | 8 | ps |
| Repetition rate | 50,000 | kHz |
| Pulse density | 5,000-500,000 | mm$^{-2}$ |
| NA | 0.3 | |
| Wavelength | 532 | nm |

The following table lists parameters for a mode called no registration process window (NoReg PW) which is characterized by further reducing the energy of the light pulses of the laser system 330.

TABLE 4

Numerical values of selected laser beam parameters for a Nd-YAG laser system for a no registration process window (NoReg PW) NoReg PW (no registration process window)

| Parameter | Numerical value | Unit |
| --- | --- | --- |
| Pulse energy | 0.19 | µJ |
| Pulse length | 8 | ps |
| Repetition rate | 80,000 | kHz |
| Pulse density | 1,000-100,000 | mm$^{-2}$ |
| NA | 0.4 | |
| Wavelength | 532 | nm |

Table 5 presents parameters of a mode called pixelless process window (pixelless PW). In this case, a Ti:sapphire laser system is used for the modification of the density and/or the optical transmission distribution. This laser system generates femtosecond laser pulses at an emission wavelength of about 800 nm. The pulse density of the pixelless PW is very high.

TABLE 5

Numerical values of selected laser beam parameters for a Ti:sapphire laser system for a pixelless process window (Pixelless PW) Pixelless PW (pixelless process window)

| Parameter | Numerical value | Unit |
| --- | --- | --- |
| Pulse energy | 0.1-0.5 | µJ |
| Pulse length | 0.15 | ps |

TABLE 5-continued

Numerical values of selected laser beam parameters for a Ti:
sapphire laser system for a pixelless process window (Pixelless PW)
Pixelless PW (pixelless process window)

| Parameter | Numerical value | Unit |
| --- | --- | --- |
| Repetition rate | 10,000 | kHz |
| Pulse density | 1,000,000-100,000,000 | $mm^{-2}$ |
| NA | 0.33 | |
| Wavelength | 800 | nm |

The steering mirror 390 directs the pulsed laser beam 335 into the focusing objective 340. The objective 340 focuses the pulsed laser beam 335 through the rear substrate surface into the substrate of the photolithographic mask 310. The NA (numerical aperature) of the applied objectives depends on the predetermined spot size of the focal point and the position of the focal point within the substrate of the photolithographic mask 310 relative to the rear substrate surface. As indicated in table 1, the NA of the objective 340 may be up to 0.9 which results in a focal point spot diameter of essentially 1 µm and a maximum intensity of essentially $10^{20}$ W/cm².

The apparatus 300 also includes a controller 380 and a computer 360 which manage the translations of the two-axis positioning stage of the sample holder 320 in the plane of (x and y directions). The controller 380 and the computer 360 also control the translation of the objective 340 perpendicular to the plane of the chuck 320 (z direction) via the one-axis positioning stage 350 to which the objective 340 is fixed. It should be noted that in other embodiments of the apparatus 300 the chuck 320 may be equipped with a three-axis positioning system in order to move the photolithographic mask 310 to the target location and the objective 340 may be fixed, or the chuck 320 may be fixed and the objective 340 may be moveable in three dimensions. Although not economical, it is also conceivable to equip both the objective 340 and the chuck 320 with three-axis positioning systems. It should be noted that manual positioning stages can also be used for the movement of the photolithographic mask 310 to the target location of the pulsed laser beam 335 in x, y and z directions and/or the objective 340 may have manual positioning stages for a movement in three dimensions.

The computer 360 may be a microprocessor, a general purpose processor, a special purpose processor, a CPU (central processing unit), a GPU (graphic processing unit), or the like. It may be arranged in the controller 380, or may be a separate unit such as a PC (personal computer), a workstation, a mainframe, etc. The computer 360 may further comprise I/O (input/output) units like a keyboard, a touchpad, a mouse, a video/graphic display, a printer, etc. In addition, the computer 360 may also comprise a volatile and/or a non-volatile memory. The computer 360 may be realized in hardware, software, firmware, or any combination thereof. Moreover, the computer 360 may control the laser source 330 (not indicated in FIG. 3).

Further, the apparatus 300 may also provide a viewing system including a CCD (charge-coupled device) camera 365 which receives light from an illumination source arranged to the chuck 320 via the dichroic mirror 345. The viewing system facilitates navigation of the photolithographic mask 310 to the target position. Further, the viewing system may also be used to observe the formation of a modified area on the rear substrate surface of the photolithographic mask 310 by the pulse laser beam 335 of the light source 330.

In the following various errors or defects are discussed on the basis of the transmissive photolithographic mask 100 of FIG. 1. The person skilled in the art will appreciate that this discussion can be adapted to the reflective photolithographic mask 200 of FIG. 2 and to the template 295 of FIG. 2b. Due to the small pattern elements 120 and the short exposure wavelength used to transform predetermined structure elements from the photolithographic mask 100 in the photoresist on the wafer, the photolithographic process is prone to errors. There are several sources of error. The substrate 110 of the photolithographic mask 100 may have defects, for example the substrate may be slightly curved or the transparency of the substrate 110 with respect to DUV radiation may slightly vary across the area of the mask 100 or its image field. These effects result in a variation of the optical intensity incident onto the photoresist across the image field of the photolithographic mask 100. The variation of the number of photons locally applied to the photoresist result in a variation of the image of a pattern element 120 in the developed photoresist across the image field. As already mentioned such a variation is called critical dimension uniformity (CDU).

Essentially two quantities are used in order to quantify the effect of a variation of the optical intensity across the active area 150 of the photolithographic mask 100 resulting in an increase of the CDU. The maximum deviation of a pattern element 120 with respect to its predetermined nominal dimension can be indicated. The maximum deviation is determined from a number of measurements (normally several hundred) in order to generate an appropriate statistical basis. Alternatively, it is assumed that the generated deviation of a dimension of a pattern element or the critical dimension (CD) variation follows a Gaussian distribution. Then the standard deviation $\sigma$, in particular its $3\sigma$ value, of the Gaussian distribution is used to quantify the CDU.

Errors of the photolithographic mask 100 may also result when some of the pattern elements 120 are not exactly at their predetermined position. The structure generated by these pattern elements in the photoresist on the wafer may not exactly correspond to the predetermined structure and/or may not be exactly generated at the predetermined position in the photoresist. This type of errors is called registration errors. The quantities described in the preceding paragraph (maximum deviation or $3\sigma$ value of the distribution) can be used to indicate the amount of registration errors. The distribution of the registration errors across the active area 150 of the photolithographic mask 100 is normally illustrated by a two-dimensional (2D) map of arrows, wherein the arrow direction indicates the direction in which a pattern element is shifted with respect to its nominal position and the length of the arrows indicates the amount of the shift.

As the optical system which images the photolithographic mask 100 onto the photoresist operates close to its resolution limit, it may also generate distortions, intensity variations across a perfect photolithographic mask 100 and further imaging errors. The deficiency of the optical elements of the photolithographic system adds to the errors of the photolithographic mask 100. Moreover, the photoresist on the wafer may also not be perfect and may increase the problems of the photolithographic mask 100 and of the components of the photolithographic illumination system.

In the following, numerous examples for the application of the inventive method are described which minimizes imaging errors for the photolithographic mask 100 and of the optical elements of the photolithographic illumination systems. However, the person skilled in the art will appreciate that the inventive method may also be applied for correcting errors of the reflective photolithographic mask 200 and the respective photolithographic illumination systems. Further, he will appreciate that the inventive method may also be used to correct errors of the template 295 of FIG. 2b.

The theoretical and/or mathematical background of the inventive method is presented in the following section "theoretical background". During the discussion of the various examples, it is referred to the equations defined in this section.

Registration Problems

Figure 4:
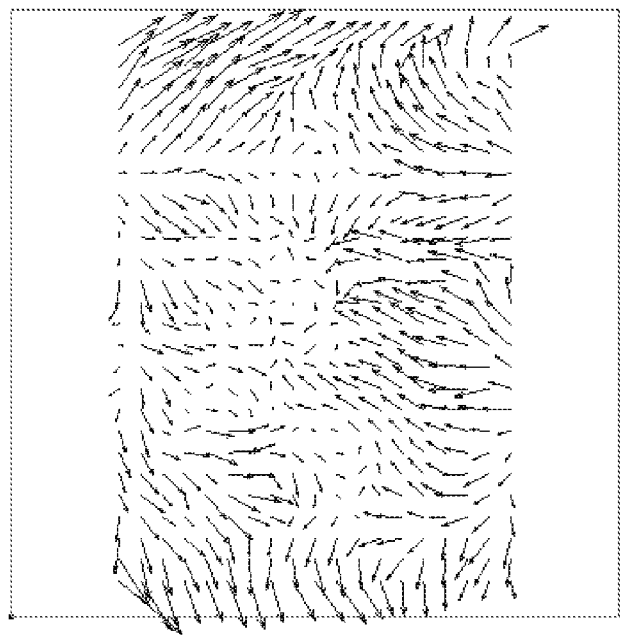
FIG. 4 graphically presents an initial registration problem of a photolithographic mask.

FIG. 4 presents an initial mask registration problem as a set of the displacements of pattern elements 120 from their predetermined locations in form of a 2D map of arrows. The displacement problem is only defined in the active area 150 of the photolithographic mask 100, i.e. the area which contains pattern elements 120 to be printed in the photoresist arranged on the wafer. The general formulation of the mathematical problem allows including any locations in the target functional. The target functional is in its general form defined in equation 38 of the following section "theoretical background". As discussed in this section, the target functional contains six parameters to include a linear imaging transformation in the optimization process.

The initial registration problem of FIG. 4 can be characterized by the deviation (3σ numerical value of the Gaussian distribution) of the determined locations of the pattern elements 120 with respect to their target positions. For the photolithographic mask of FIG. 4, the 3σ numerical value of the deviations from its predetermined position is 15.8 nm. This is a large value which can seriously challenge the application of the mask in a photolithographic process. As already discussed in the following section "theoretical background", a scanner can partly solve the registration problem by performing a linear imaging transformation prior to the illumination of the photolithographic mask 100. To characterize the residual registration problem after the application of a best scanner correction, the magnitude of the registration problem has to be calculated after having virtually performed the linear imaging transformation. A linear imaging transformation is in the following also called a scaling and an orthogonality (S/O) correction. In the example of FIG. 4, the residual registration error after an S/O correction, again indicated as a 3σ numerical value of the deviation, is 10.9 nm.

Figure 5:
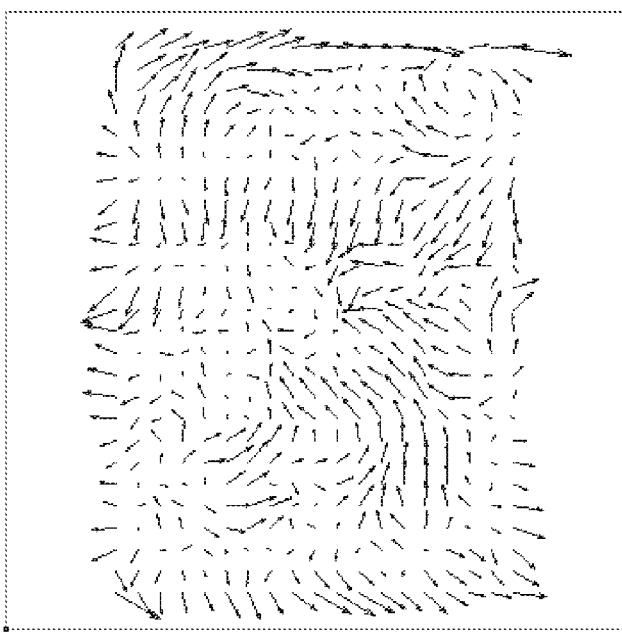
FIG. 5 schematically shows the registration problem of FIG. 3 after performing a linear imaging transformation.

FIG. 5 presents the remaining registration error after removing the registration errors corrected by a linear imaging transformation or an S/O correction. A photolithographic mask having a registration problem in the order of 11 nm does not meet a typical specification for a critical 3x node layer and will potentially be rejected wherein 3x is a typical notation for a 30-39 nm node, specifically for a 32 nm node.

In order to demonstrate the improvement obtained by the inventive method, the target functional of equation 38 (using equations 31 and 32 for $\zeta_i$) is now solved for a single set of laser beam parameters or a single writing mode ($a_m^\alpha \rightarrow a^\alpha$). In this case, equation 38 can be rewritten as:

$$\min\left\{\sum_i \left(\varphi_i + \sum_{jk\alpha ln} M_{in}(P_{nj}^g)^{-1} P_{jk\alpha}^w a^\alpha N_{kl} l_l + \sum_k T_{ik} s_k\right)^2 + \lambda^s \sum_k s_k^2 + \lambda^a \sum_k a_k^2\right\} \text{ or} \quad (40)$$

$$\min\left\{\sum_i \left(\varphi_i + \sum_\alpha \Phi_{i\alpha} a^\alpha + \sum_k T_{ik} s_k\right)^2 + \lambda^s \sum_k s_k^2 + \lambda^a \sum_k a_k^2\right\}. \quad (41)$$

All the deformation properties induced by the laser beam in the substrate of the photolithographic mask are summarized in the matrix $\Phi_{i\alpha}$.

The mathematical problem of equation 41 is an optimization problem of a quadratic form. An optimal convergence can be obtained by using the method of conjugate gradients. The constraints of equation 39 for the writing density amplitude ($0<a^m<(a^{thres})^m$) enforces to find the best solution in the cubic domain. A modification has to be added to consider the constraints of equation 39 during the optimization procedure of equation 41. When computing in descent direction and the iteration leads to an outward domain area, it is necessary to cut a component in the direction normal to the boundary of the domain. However, this is a fast operation that does not affect the computational time.

Figure 6:
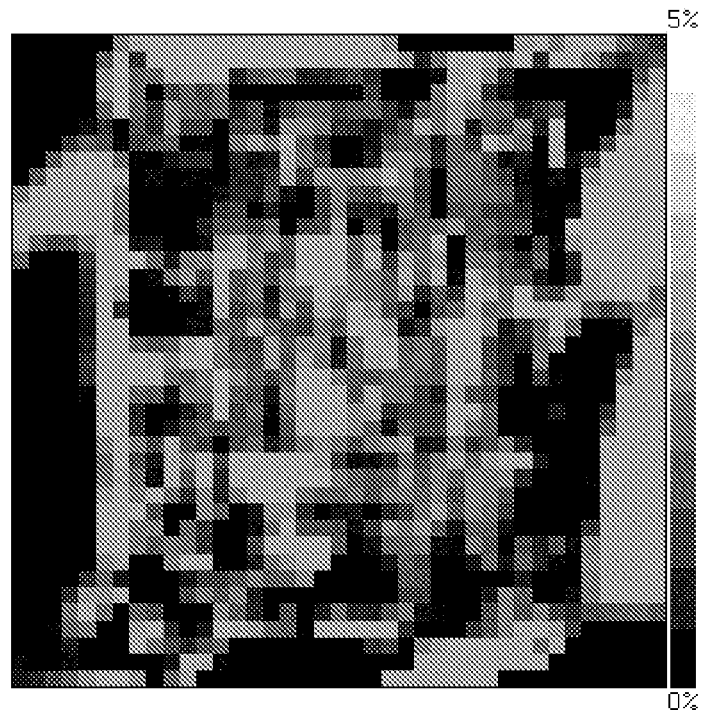
FIG. 6 depicts a computed correction map for the registration problem indicated in FIG. 5.

The execution of an optimization of equation 41 results in a proposed correction map for locally directing the laser beam 335 onto the substrate of a photolithographic mask. This correction map is shown in FIG. 6. The correction map for the laser beam 335 is in the following also called correaction writing map as the laser beam 335 "writes" pixels in the mask substrate.

The density of pixels written into the substrate of the photolithographic mask is expressed in percent of the optical transmission variation of the optical intensity used for illuminating the photolithographic mask, or to be more precise in percent of the attenuation of the illumination caused by the pixels introduced or written in the mask substrate. The maximum attenuationallowed by the pixels written for the correction of registration errors is 3%. The mean attenuation of the optical intensity at the illumination wavelength required for the correction writing map of FIG. 6 is 1.3%. As can be seen from FIG. 6, both the active area and the non-active area of the photolithographic mask are used for the correction of the registration problem of FIG. 4.

By performing a simulation it can be forecasted that the resulting 3σ numerical value of the deviation after removing of the registration error, which can be corrected by a linear imaging transformation, will be 6.4 nm which is an improvement of about 41% with respect to FIG. 5. In FIG. 5, a portion of the registration errors of FIG. 4 has been corrected by performing a linear imaging transformation.

The parameters for an optimized linear imaging transformation are simultaneously obtained from the optimization of equation 41. The numerical values for the six linear imaging transformation parameters are given in the following table:

TABLE 6

Linear imaging transformation parameters obtained from the optimization of equation 41

| Parameter | $m_x$ | $m_y$ | $s_x$ | $s_y$ | $r_x$ | $r_y$ |
|---|---|---|---|---|---|---|
| Unit | nm | nm | ppm | ppm | μR | μR |
| Numerical value | 0.14 | 0.08 | 0.09 | −0.06 | 0.014 | 0.026 |

(wherein μR is the abbreviation for micro radian)

Figure 7:
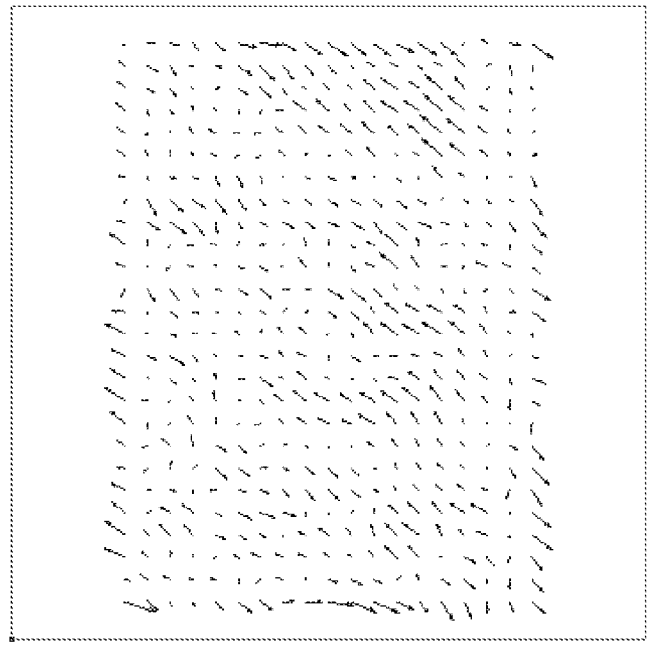
FIG. 7 shows a forecast of the remaining registration errors of the mask of FIG. 4 after optimizing the respective target functional.

FIG. 7 shows the resulting simulated registration errors after removing the registration errors correctable by performing a linear imaging transformation using the parameters indicated in Table 6.

In the next step, the laser beam parameters determined from the optimization procedure of equation 41 are used by the laser source 330 in order to locally write pixels into the substrate of the photolithographic mask, so that registration errors of the photolithographic mask of FIG. 4 are minimized. As already indicated, the optimized laser beam parameters may be arranged in a correaction writing map.

Figure 8:
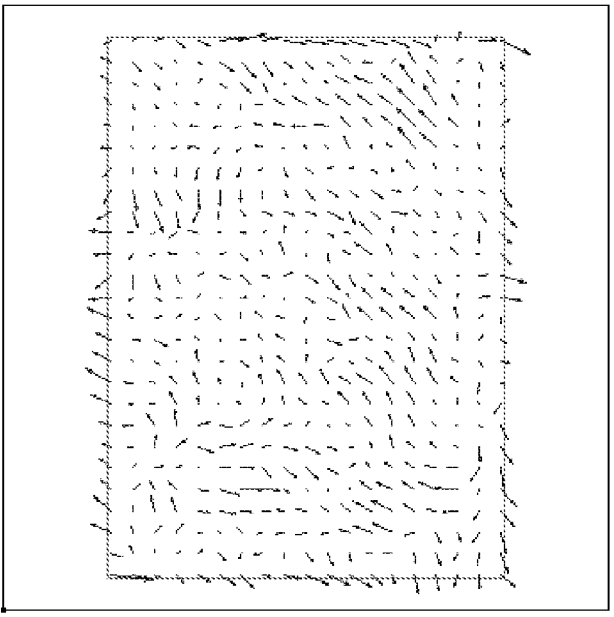
FIG. 8 represents the measured remaining registration errors of the photolithographic mask of FIG. 4 after performing an error correction using the laser beam parameters obtained from minimizing the respective target functional.

FIG. 8 depicts the measured registration errors after correcting the error problem of the mask of FIG. 4 by using the optimized laser beam parameters of the correction writing map of FIG. 6. The measured remaining registration error indicated by the 3σ numerical value of the distribution is 7.1 nm which is an improvement of about 35% with respect to performing only a linear imaging transformation (cf. FIG. 5).

Figure 9:
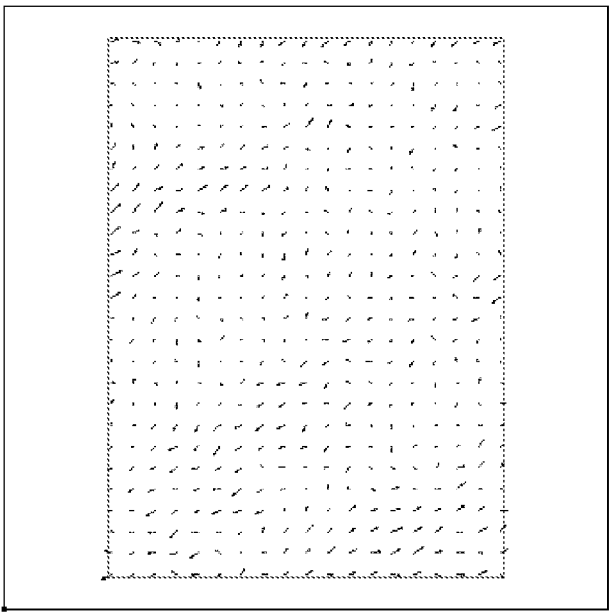
FIG. 9 shows a comparison of the measured and of the simulated error correction after correcting the registration errors of FIG. 4 and performing a linear imaging transformation.

FIG. 9 shows the differences between the forecasted and the measured registration error correction. This comparison demonstrates that the improvement in the error correction obtained from the optimization of equation 41 can in fact be realized. The obtained improvement of the registration problem of FIG. 4 brings the photolithographic mask within the typical specification for a critical 3x node layer.

In a second example for the application of the inventive method, registration errors in a photolithographic mask are corrected without directing the laser beam 335 in the active area 150 of the substrate 110 of the photolithographic mask 100. This constraint prevents that the correction of registration errors introduces new CDU errors in the active area 150 of the mask 100. It is possible to formulate the target to obtain the best possible improvement of the registration problem without directing the laser beam 335 or without writing pixels in the active area 150 of the photolithographic mask 100. In terms of the optimization problem defined in equation 41 this is not a problem to assign zero values to some optimization parameters $a_l^m$ and to exclude them from the optimization algorithm. It is clear that only directing the laser beam 335 in a limited area of the mask substrate 110 for the error correction procedure is less effective than not having this constraint. Moreover, the error correction is also less effective, since the area into which the pixels can be written may be far from the defective area. On the other hand, there is no limitation for the optical transmission variation induced by directing the laser beam 335 onto the non-active area 160 of the photolithographic mask 100. This advantage may partially compensate the drawbacks mentioned above.

In the previous example, the 3σ numerical value the total displacement has been optimized. Very often manufactures of photolithographic masks specify the property of their mask by indicating the maximum allowed deviation (3σ numerical value) in an x or in a y direction after a linear imaging transformation has been performed. In the following, this specification will be called X/Y specification. The optimization of the X/Y specification property requires including a non continuous condition in the target functional which makes the solution of the optimization problem more complex. Therefore, another method will be presented here in order to fulfill the condition not to write pixels in the active area 150 of the photolithographic mask 100. The defined method will assign different weight parameters $w_i$ to different components of the $\phi_i + \zeta_i$ displacements in the target functional of equation 41. Weighting parameters having an even number of the index i, $w_{2*i}$, allow controlling the displacements of pattern elements in the x direction and weighting parameters having an odd number of the index i, $w_{2*i+1}$, control the displacements of pattern elements in the y direction. The target functional of equation 41 transforms after the introduction of the weighting parameter $w_i$ to:

$$\min\left\{\sum_i w_i\left(\varphi_i + \sum_\alpha \Phi_{i\alpha} a^\alpha + \sum_k T_{ik} s_k\right)^2 + \lambda^2 \sum_k s_k^2 + \sum_k \lambda_m^a (a_k^m)^2\right\} \quad (42)$$

Figure 10:
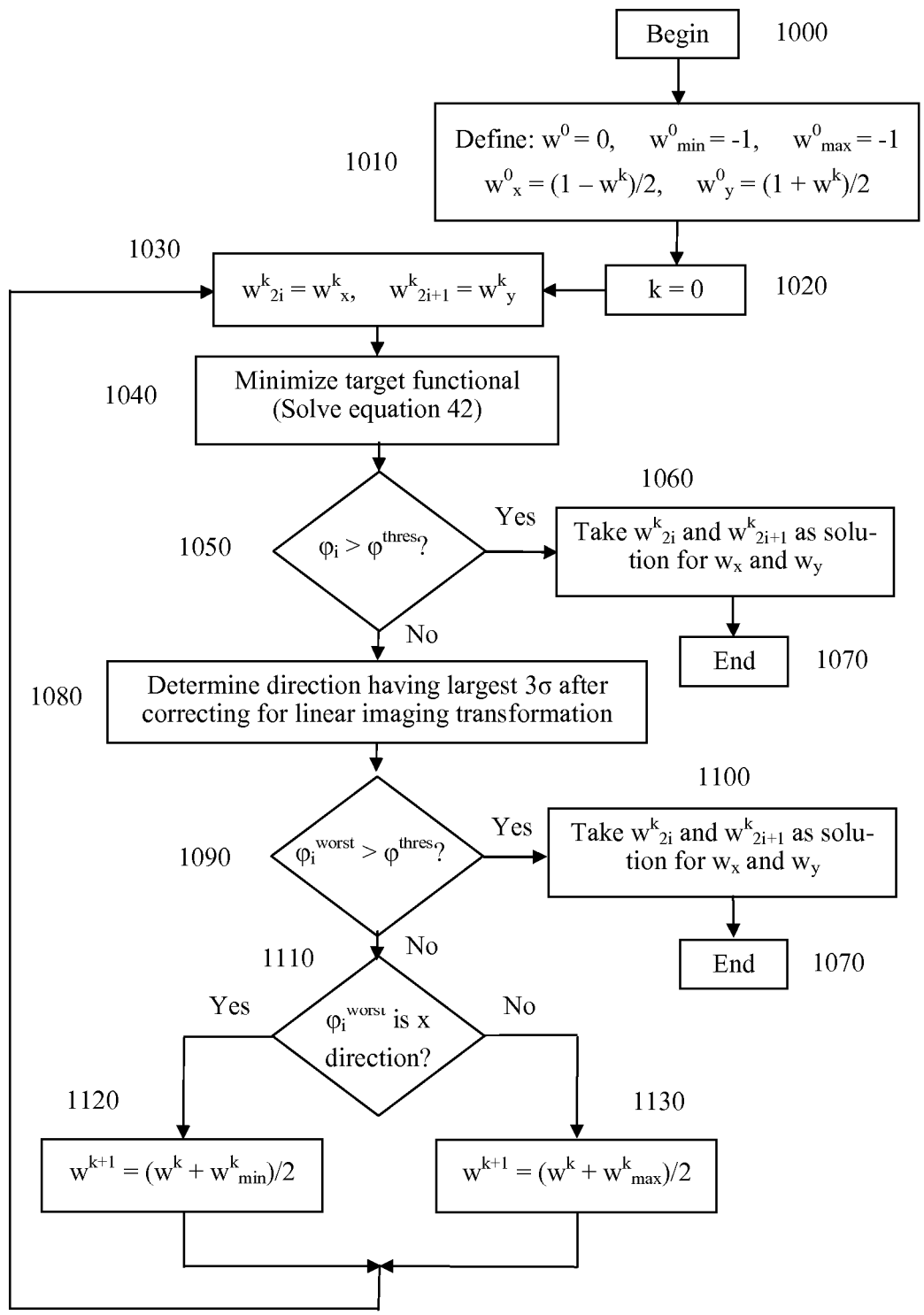
FIG. 10 indicates a flow chart of a method for correcting registrations errors without directing the laser beam in the active area of the photolithographic mask.

An example method for performing the required optimization procedure to determine $w_i$ is presented in FIG. 10. The method begins at block 1000. At block 1010, the weighting parameter $w^0=0$ and its variation limits $w_{min}^0=-1$ and $w_{max}^0=1$ as well as $w_x^0$ and $w_y^0$ are defined. After defining the iteration index k at block 1020, the general form of the weighting parameters for the x and the y direction are defined in block 1030. At block 1040, the target functional defined in equation 42 is minimized. At the decision block 1050, it is decided whether the induced displacements $\phi_i$ exceed a predetermined specification limit $\phi^{thres}$. If this condition is fulfilled, in block 1060 the present weighting parameters $w_{2i}^k$ and $w_{2i+1}^k$ are taken as the solution for the weighting parameters $w_x$ and $w_y$ and the method ends at block 1070. If this condition is not fulfilled, it is determined in block 1080 which direction has the largest deviation (3σ numerical value) of the resulting displacement variation after correction of the errors correctable by a linear imaging transformation. At decision block 1090, it is then decided whether this direction also fulfills the displacement condition of the decision block 1050. If this is true, the present weighting parameters $w_{2i}^k$ and $w_{2i+1}^k$ are taken as the solution for the weighting parameters $w_x$ and $w_y$ in block 1100 and the method ends at block 1070. If this is not correct, it is at the decision block 1110 decided whether the direction having the largest 3σ value (worst direction) is the x direction or the y direction. In block 1120, the weighting parameter for the iteration index k+1 is defined if the worst direction is the x direction and in the parallel block 1130, the weighting parameter for the iteration index k+1 is defined when the worst case direction is the y direction. Then the method returns to block 1030, and in block 1040 the target functional of equation 42 is again solved with the modified weighting parameters.

Figure 11A:
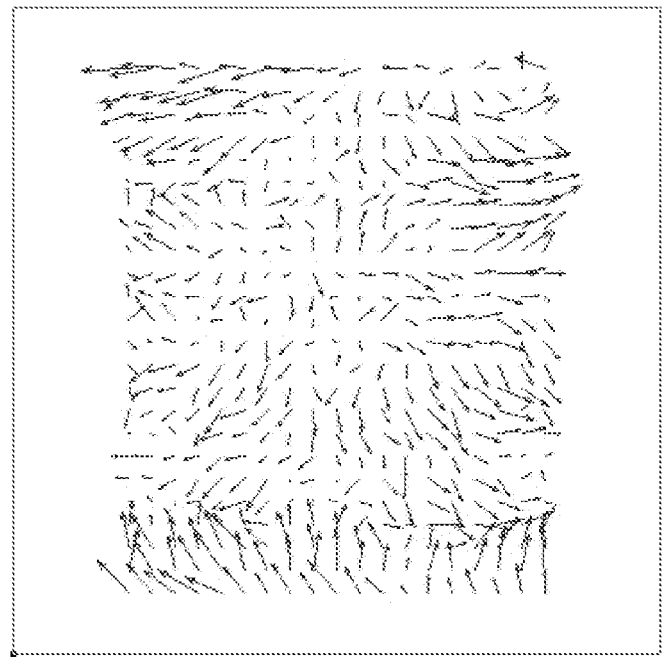
FIG. 11a schematically shows the registration problem to be corrected without writing pixels in the active area of the photolithographic mask.
Figure 11B:
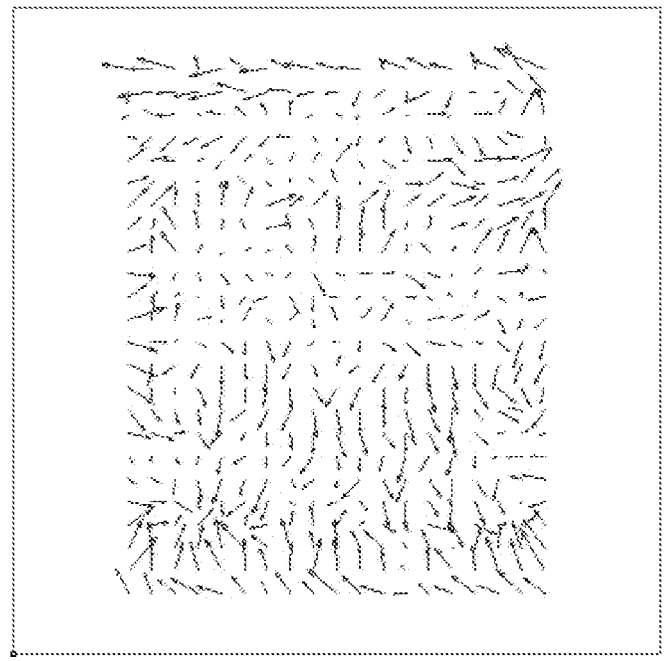
FIG. 11b schematically shows the registration problem of FIG. 11a after the execution of a linear imaging transformation.

FIG. 11a shows the registration problem underlying this second example for correcting registration errors without directing the laser beam 335 used for the correction of the registration error in the active area 150 of the mask 100. FIG. 11b represents the remaining registration problem after performing a linear imaging transformation. The measured 3σ numerical value of the registration problem of FIG. 11a is 9.73 nm for the x direction and 8.52 nm for the y direction and amounts to 12.9 nm for the absolute xy displacement. After correcting a portion of the registration error by performing a linear imaging transformation the 3σ numerical value of the residual registration problem is 6.9 nm for the x direction and 8.1 nm for the y direction which gives 10.6 nm for the xy displacement. This map of registration errors is indicated in FIG. 11b.

Figure 12:
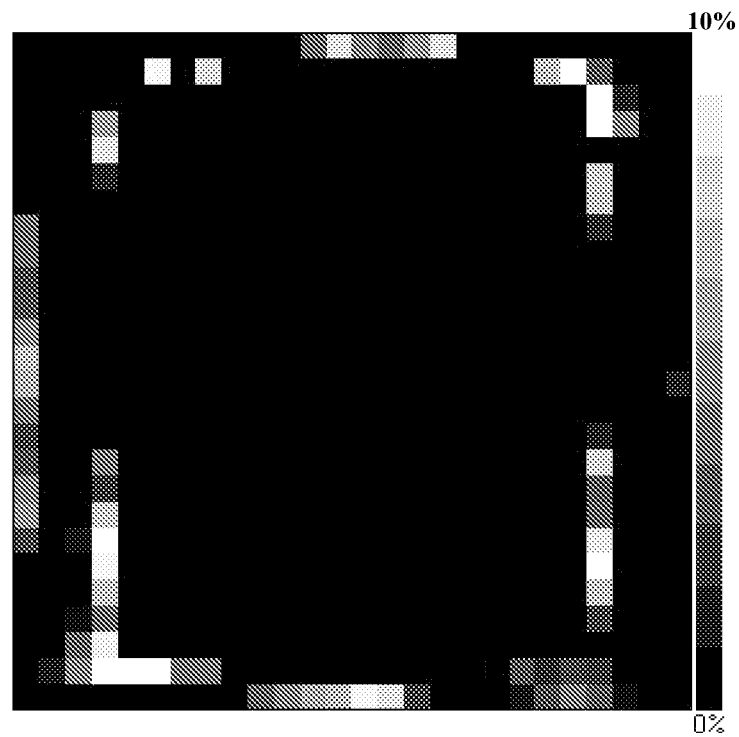
FIG. 12 represents the correction writing map obtained with the optimization loop of FIG. 10 after passing one time through the optimization loop.

Since the laser beam 335 writes pixels only in the non-active portion of the substrate of the photolithographic mask, a higher attenuation of the optical intensity induced by the pixels in the substrate can be tolerated. For the correction writing map represented in FIG. 12 the variation of the optical transmission has been limited to 10%. FIG. 12 shows the solution of the problem of this second example in form of a writing density map. The writing density map of FIG.

12 has been obtained by just passing one time through the optimization loop of FIG. 10.

Figure 13:
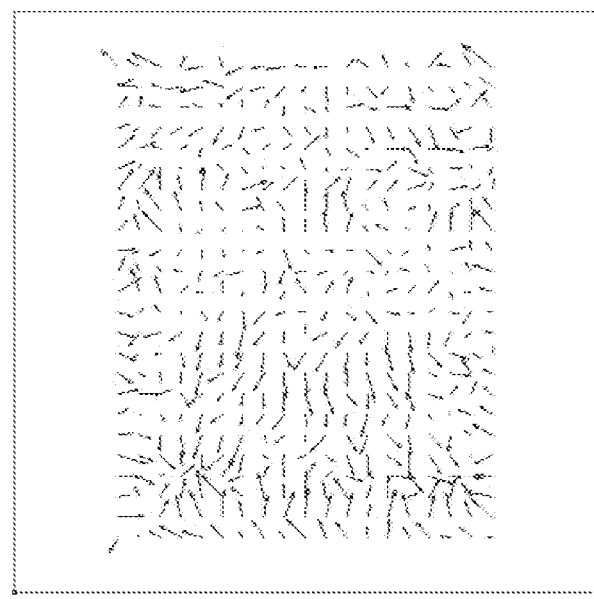
FIG. 13 shows the simulated remaining registration problem of FIG. 11 after using the correction writing map of FIG. 12 and after performing of a linear imaging transformation.

FIG. 13 depicts the simulated residual registration problem of FIG. 11a after the application of both, a linear imaging transformation and after directing the laser beam 335 onto the non-active area of the photolithographic mask to write the correcting pixels. The estimated residual registration problem, characterized by the resulting 3σ numerical value, is 5.9 nm for the x direction, 7.3 nm for the y direction and 9.37 nm for the absolute displacement. This result gives an improvement of 14.5% for the x direction, an improvement of the registration error of 9.9% for the displacement in the y direction, and hence only an improvement of 9.9% for the X/Y specification and an improvement of 11.8% for the absolute displacement. It has to be noticed that this correction gives a better result for the x direction which determines the improvement of the X/Y specification.

Figure 14:
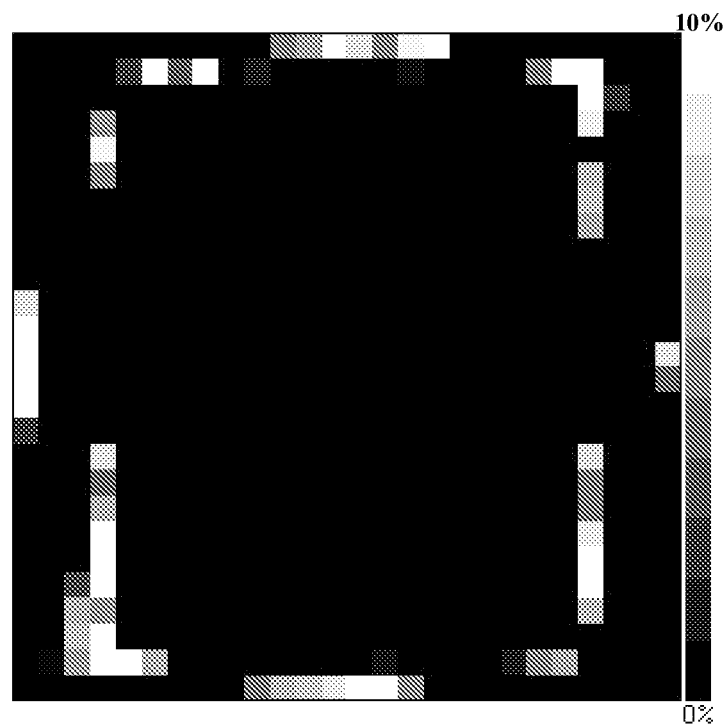
FIG. 14 represents the correction writing map after passing several times through the optimization flow chart of FIG. 10.

FIG. 14 depicts the solution for the writing density map by passing several times through the optimization loop. FIG. 14 shows a significant variation of the writing density map with respect to FIG. 12, in particular with respect to the y direction.

Figure 15:
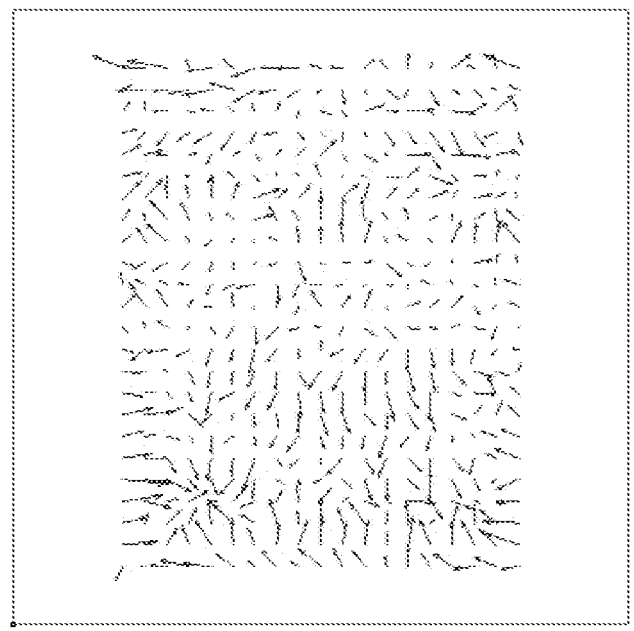
FIG. 15 shows the simulated remaining registration problem of FIG. 11 after using the correction writing map of FIG. 14 and after performing of a linear imaging transformation.

FIG. 15 represents the remaining registration errors for a repeated optimization process according to FIG. 10 after performing a linear imaging transformation. The estimated residual registration errors, again characterized by the 3σ numerical value, remaining after executing the optimized correction process is 6.8 nm for the x direction, 6.8 nm for the y direction and 9.7 nm for the absolute displacement. This result gives an improvement of 1% for the x direction, and an improvement in the displacement error of 15.5% for the y direction, and thus an improvement of 15.0% for the X/Y specification and a 9% improvement for the absolute XY displacement. The 3σ numerical value for the resulting residual registration errors has now the same numerical value in both, the x and the y direction. This demonstrates that the method of FIG. 10 significantly improves the worst direction, which is in the example of FIG. 11 the y direction, without deteriorating the registration errors for the x direction.

It has to be noted that the potential improvement of the X/Y specification of 15% is obtained by only writing pixels in the non-active area of the photolithographic mask. This result is a consequence of the high level of allowed attenuation induced by the writing laser beam. A variation of the optical transmission of up to 10% is rather aggressive as this variation might induce some local cracks in the substrate of the mask. In order to avoid the risk of a damage of the mask, the pixels are written in two different layers into the mask substrate, wherein each layer contains one half of the required number of pixels.

Figure 16:
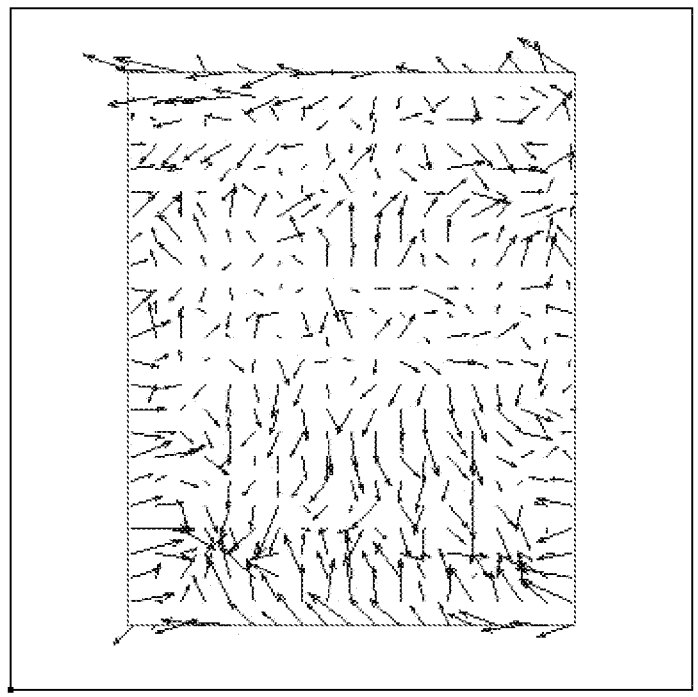
FIG. 16 represents the measured remaining registration problem of FIG. 11 after applying the correction writing map of FIG. 14 to the substrate of the photolithographic mask of FIG. 11 and after performing of a linear imaging transformation.

FIG. 16 presents the measured residual registration problem of FIG. 11 after the application of both, a linear imaging transformation and the writing of the pixels in two layers in the non-active area of the mask substrate. The measured result shows an improvement of 10.1% for the X/Y specification which is less than the value forecasted by the simulation which is 15%, as has been discussed in the context of FIG. 15. An analysis of the measured result reveals that the laser beam parameters applied for writing pixels in the mask substrate and the ones used for the simulation was significantly different. The experiment was conducted under laboratory conditions where the writing conditions for the laser beam 335 and the environmental conditions are not perfectly maintained. A significant time period passed from the calibration of the laser beam 335 to the writing of the pixels for the correction of the registration errors. This resulted in a deviation between calibrated and actually applied laser beam parameters. In an industrial environment, the laser beam parameters will be better controlled. In an industrial environment, every result of a correction pixel writing can be used to update the laser beam parameters or the writing mode signature. In the following, the laser beam parameters are also called writing mode signature or MS for mode signature as the laser beam parameters are characteristic for the type of pixels which are written with the laser beam 335 into the mask substrate. The MS is described by the deformation elements $t_i^m$ in normal directions of equation 29.

The method to optimize the X/Y specification shows the way to optimize for any specific target, as for example for only one registration critical direction or for a maximum of the resulting displacement. This optimization process can be performed by an iterative solution of the target functional in the form of equation 42 and by additionally controlling the optimization process for the weight parameters.

The correction of registration errors using only one set of laser beam parameters or only one writing mode has a limited efficiency. One writing mode can induce only one kind or one type of deformation in every point of the mask substrate varying only its amplitude. Using several sets of writing modes or different sets of laser beam parameters allows combining different writing modes to obtain different kinds or types of deformations at every point of the mask substrate.

The laser beam parameters or the writing mode is not precisely controllable since the parameter values of the laser beam 335 is permanently varying, due to for example aging of the laser source 330, intrinsic temporal fluctuations of the laser beam 335 and because of the dependency of the fluctuations on environmental parameters like temperature, pressure and humidity. These fluctuations limit the accuracy of the error correction and the repeatability of the pixel writing process. From a mathematical point of view, this limits the degree of freedom in the optimization space.

If a set of different writing modes is available and every writing mode differs in the deformation their pixels induce in the mask substrate, the resulting efficiency for controlling the overall deformation induced by the individual pixels can be significantly higher. This effect is demonstrated by using a very simple example.

The native asymmetry of induced deformations of individual pixels can favorably be used. For this purpose, the same writing conditions will be used, but the photolithographic mask will be rotated by a certain angle in order to effectively obtain a different orientation of the deformation of the individual pixels. It is very simple to rotate a photolithographic mask by 90° and this effectively results in obtaining one additional writing mode of the laser beam without any modification of the laser beam or of the laser beam parameters. The two writing modes are well defined and thus have a well defined writing mode signature on the mask substrate.

Figure 17:
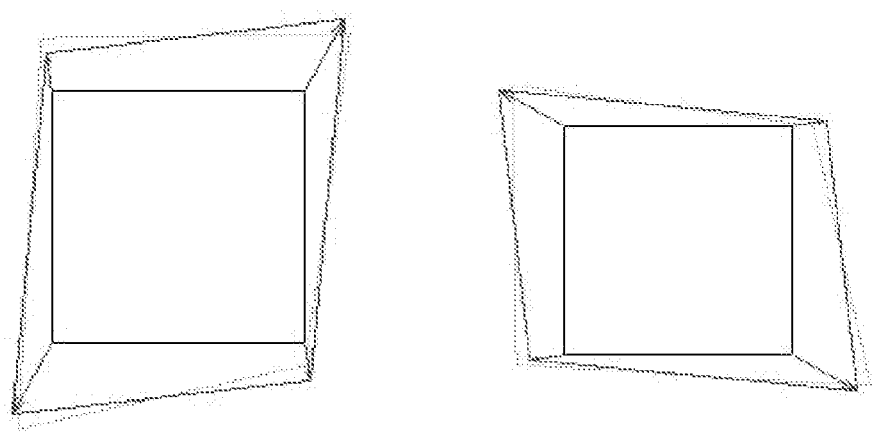
FIG. 17 schematically shows the 0° writing mode signature (left) and the 90° writing mode signature (right) of the laser beam of FIG. 3.

FIG. 17 illustrates the mode signatures for this example where a non-rotated laser beam 335 and a laser beam rotated by 90° are used having a 0° mode signature or a 90° mode signature, respectively. This diagram presents MS (mode signature) of the laser beam 335. As already discussed above, in a 2D model the deformation elements $t_i^m$ have eight components with five independent components. Only three of the five independent ones are affecting the bulk potential energy, and are thus important for the description of the deformation induced by the laser beam 335. In order to present the relevant independent components of $t_i^m$, these components are transformed using $N_{kl}t_l^m$ which actually show the effective deformation of an elementary area α. FIG. 17 illustrates the initial element area α prior to directing the laser beam onto the element area α (black square). The dark parallelogram represents the normalized resulting element area as only three components of $t_l^m$ have numerical values different from zero. The grey parallelogram is the normalized resulting element area with all five parameters of the independent parameter set.

Figure 18A:
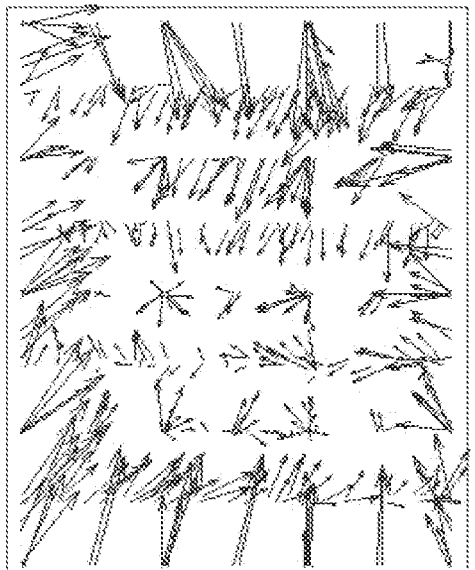
FIG. 18a schematically shows the registration problem to be corrected using two different writing modes of the laser beam of FIG. 3.
Figure 18B:
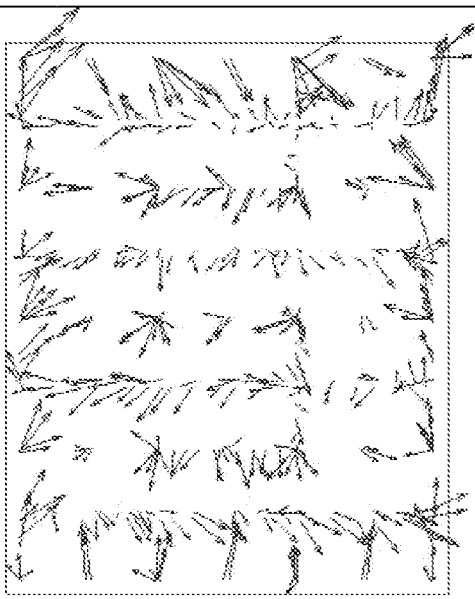
FIG. 18b schematically shows the registration problem of FIG. 18a after performing a linear imaging transformation.

FIG. 18a shows the measured initial mask registration problem applied to demonstrate the effect of using two different writing modes of the laser beam 335 for the error correction process. The registration problem presented in FIG. 18a has a very chaotic character and a correction which uses only one mode of writing pixels does not allow improving the chaotic character by more than 22%. This is not enough to bring this photolithographic mask within the typical specification for a critical 3x layer. FIG. 18b shows the mask registration problem of FIG. 18a after performing a linear imaging transformation.

By solving equation 38 two maps for the writing modes with a 0° writing mode signature and a 90° writing mode signature are obtained.

Figure 19A:
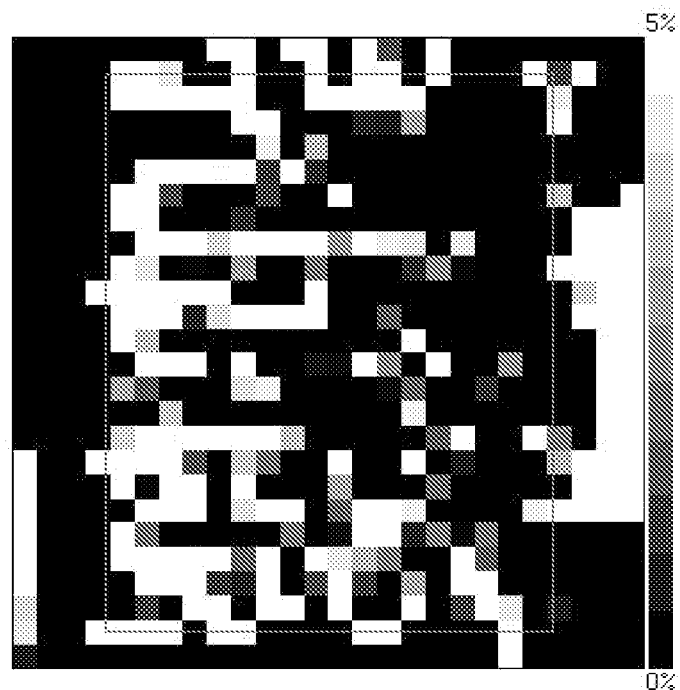
FIG. 19a presents the correction writing map for the 0° writing mode signature.
Figure 19B:
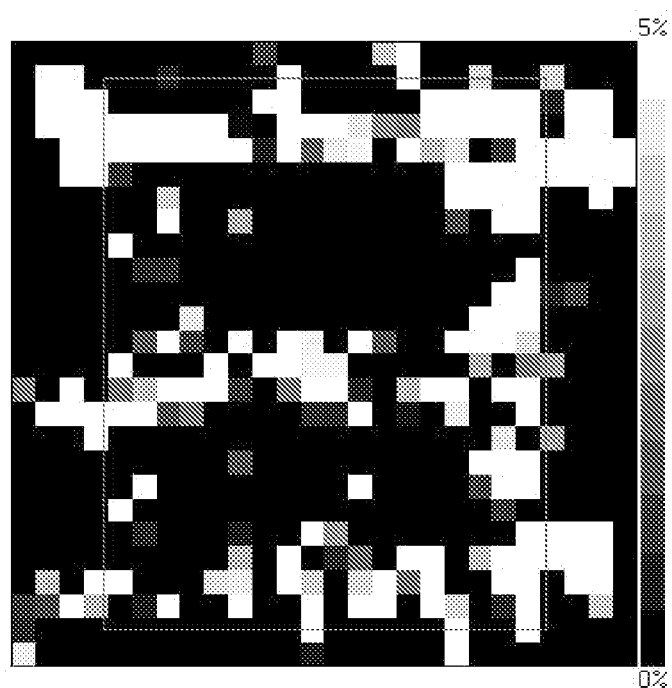
FIG. 19b represents the correction writing map for the 90° writing mode signature.
Figure 20:
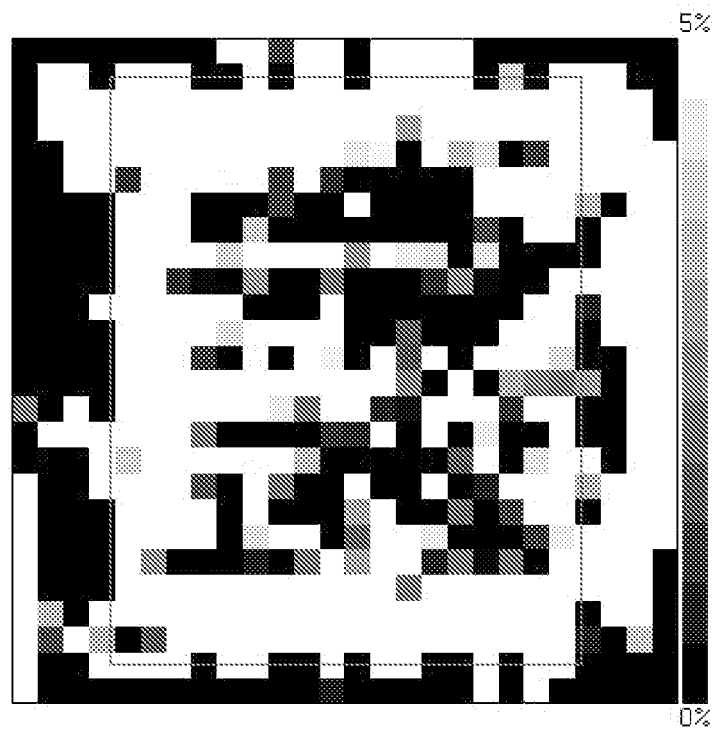
FIG. 20 shows the combined correction writing map of FIGS. 19a and 19b.

FIG. 19a shows the proposed correction writing map for the 0° writing mode signature and FIG. 19b presents the proposed correction writing map for the 90° writing mode signature. A condition has been added to equation 38 which limits the sum of writing pixel densities or the attenuation of the optical intensity for both writing modes to 5%. FIG. 20 shows the correction writing map when both modes of FIGS. 19a and 19b are added. It should be noted that for both modes pixels have been written in the active as well as in the non-active area of the mask substrate.

Figure 21A:
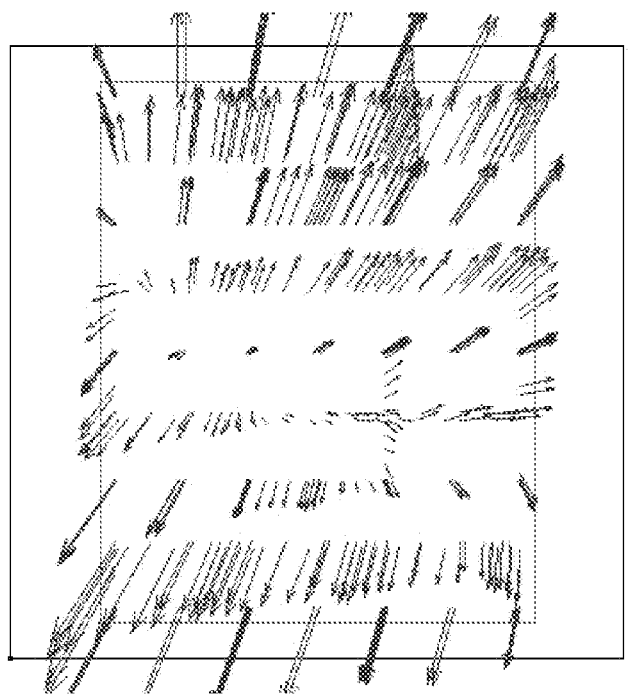
Figure 21B:
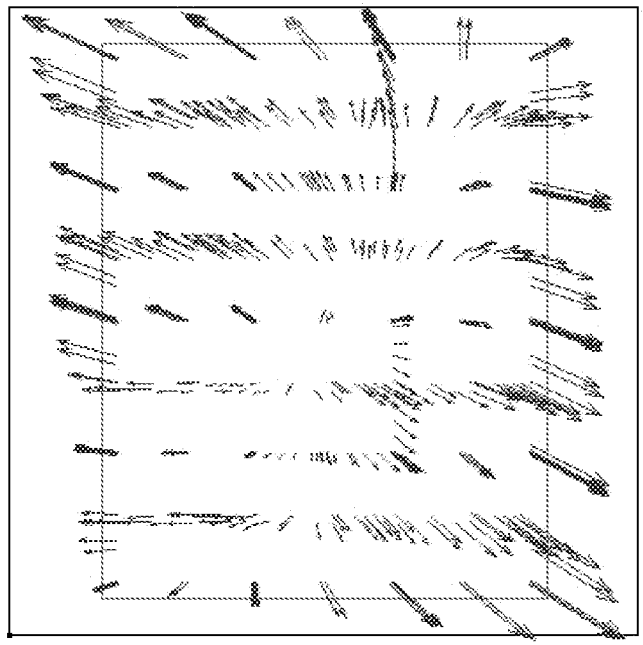
FIG. 21b schematically shows the registration change induced by the correction writing map of FIG. 19b.
Figure 21C:
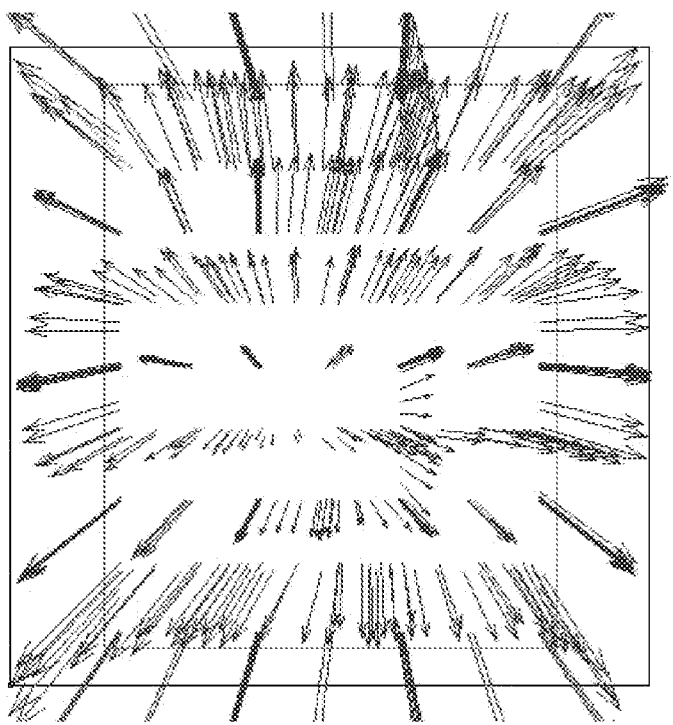
FIG. 21c schematically shows the sum of the registration change induced by the correction writing maps of FIGS. 19a and 19b.

FIG. 21a illustrates the change induced by the registration correction by applying the 0° writing mode signature which is shown in FIG. 19a. Further, FIG. 21b depicts the change induced by the error correction when using the 90° writing mode signature of FIG. 19b. Finally, FIG. 21c presents the registration correction change simulated with the combined writing correction map of FIG. 20.

Figure 22A:
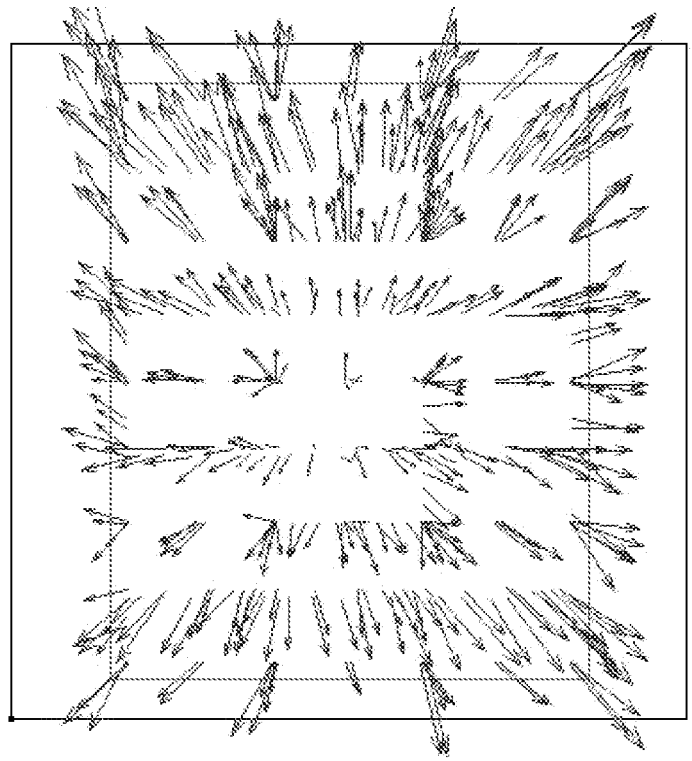
FIG. 22a schematically indicates the forecasted result of the registration correction of FIG. 18a using the writing correction map of FIG. 20.
Figure 22B:
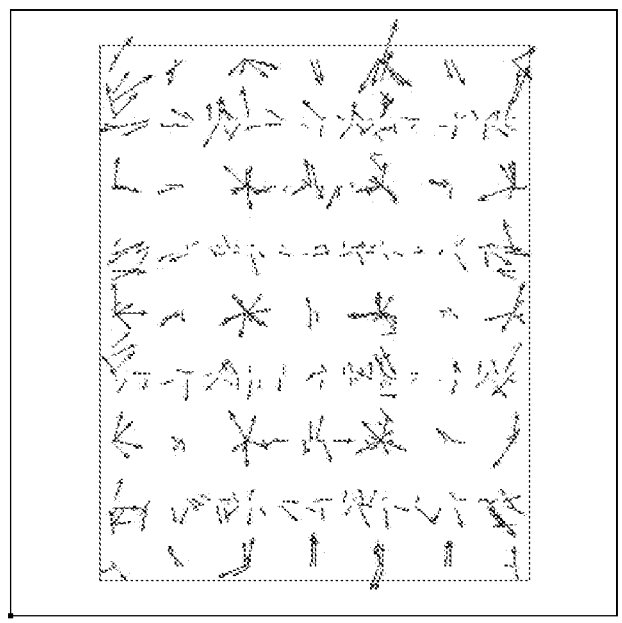
FIG. 22b depicts the registration correction of FIG. 22a after performing of a linear imaging transformation.

FIG. 21a shows that the 0° writing correction map induces a larger shift in the y direction, whereas FIG. 22b indicates that the 90° writing correction map induces a larger induced shift in the x direction. This finding is in line with the diagrams of the writing mode signatures for these modes in FIG. 17.

In FIG. 22a the forecast of the combined action of both laser writing modes to the registration problem of FIG. 18a is represented, and FIG. 22b shows the remaining registration errors of FIG. 18a after performing a linear imaging transformation.

The simulation results reveal that a reduction of the registration errors by 43% can be obtained when the maximum allowed attenuation of the optical intensity is limited to 5%. This means that the amount of registration error correction can approximately be doubled when using two writing modes of the laser beam instead of a single one. This improvement definitely brings the photolithographic mask within the X/Y specification.

Figure 23:
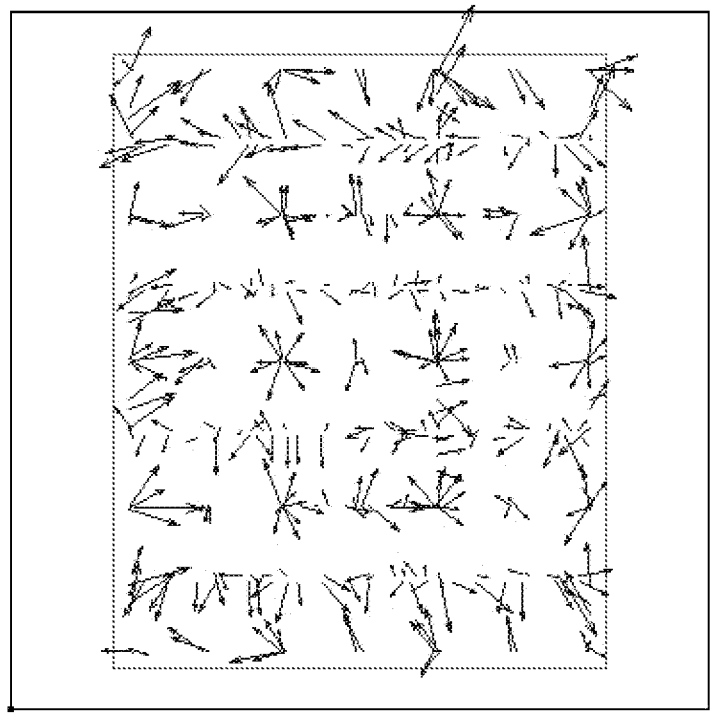
FIG. 23 schematically illustrates the measured registration correction using the writing correaction map of FIG. 20.

The measured improvement of the registration problem of FIG. 18b is depicted in FIG. 23. The registration error of FIG. 18b has been diminished by 35% which is a bit smaller than the simulated improvement discussed in the preceding section.

This example proves the high efficiency of the multimode approach when writing pixels for the correction of registration errors. The 90° rotation of the photolithographic mask and/or of the laser beam permits defining another helpful approach, which is a fruitful simplification of the multi-mode correction, which can be implemented on a regular critical dimension correction (CDC) tool. The introduction of several writing modes can also lead to a significant extension of the error correction capabilities; however, this extension requires the development of a dedicated registration control (RegC) tool having an advanced control system for the laser beam 335.

In the following, it is now demonstrated that it is possible to control the CD or the optical attenuation when introducing pixels in the mask substrate for registration correction. In a first example, it is useful if there is no significant CD problem, or when CD information is not available. From the theory of the CD control it is known that the CD distribution will not be changed when the writing of pixels introduces a constant shading density in the substrate of the photolithographic mask. Therefore, it is the plan to use the laser beam 335 for writing pixels with multiple laser beam parameters or with multiple writing modes with one additional condition or constraint that makes sure that the sum of all the writing densities for all the writing modes is constant across the active area of the photolithographic mask. It is already known that the application of laser beams having different pulse energies without changing the focusing conditions result in writing modes of the laser beam 335 which have different writing densities but simultaneously have the same writing mode signature.

In order to demonstrate this effect only two writing modes are used in the following example for simplicity reasons. When introducing two different writing modes the target functional of equation 41 changes to: (equation 43)

$$\min\left\{\sum_i \left(\varphi_i + \sum_\alpha \Phi_{i\alpha}^1 a_1^\alpha + \sum_\alpha \Phi_{i\alpha}^2 a_2^\alpha + \sum_k T_{ik}s_k\right)^2 + \lambda^2 \sum_k s_k^2 + \lambda_1^\alpha \sum_k a_k^{1^2} + \lambda_2^\alpha \sum_k a_k^{2^2}\right\}$$

The condition of the constant writing density is expressed by the equation:

$$a_1^\alpha + a_2^\alpha = c \quad (44)$$

where c is an arbitrary constant. Again for simplification reasons, it is now assumed that the CDC ratio is identical for both writing modes; otherwise it would be necessary to introduce proportional factors for the writing densities in equation 44 like for example $r_1 \cdot a_1^\alpha + r_2 \cdot a_2^\alpha = c$ in order to ensure neutrality of the CD writing. The numerical value of the constant c is defined by the illumination level which guarantees that no degradation is induced in the substrate of the photolithographic mask. The larger the parameter c can be the better improvements for both, the registration correction and the CD correction can be reached; but on the other hand, the more significant is the attenuation of the optical intensity at the illumination wavelength.

By using the equation 44 the target functional of equation 43 can be transformed to a problem of one writing mode:

$$\min\left\{\sum_i \left(\varphi_i + \sum_\alpha (\Phi_{i\alpha}^1 - \Phi_{i\alpha}^2)a_1^\alpha + a\sum_\alpha \Phi_{i\alpha}^2 + \sum_k T_{ik}s_k\right)^2 + \right. \quad (45)$$

-continued $$\lambda^2 \sum_k s_k^2 + \lambda^\alpha \sum_k a_k^{l^2} \}$$

The equation 45 can be solved in the same way as the target functional of equation 41 for a single writing mode.

In the following example, the registration problem of FIG. 4 will again be used. For the optimization process of equation 45, the pixels are introduced or written in the substrate of the photolithographic mask wherein the laser beam 335 has two different pulse energies, or it is applied with two different sets of laser beam parameters. The laser beam 335 having a pulse energy of 0.52 µJ is called regular or standard writing mode and the laser beam 335 having a pulse energy of 0.36 µJ will be called low registration (LowReg) writing mode (see tables 2 and 3). The pulse length for both writing modes is 8 ps. The pulse repetition rate is 50 kHz. The focal spot is 920-950 µm for both writing modes. The numerical value of the focal spot size is a nominal value as there is a significant amount of self focusing at these power densities. The number of pulses applied to write a single pixel is 1. The distance between neighboring pixels in the x and the y direction amounts 1-10 µm. A Ti:Sapphire laser system having a wavelength of about 800 nm or a Nd—YAG laser system with frequency doubled laser pulses can be used for the writing of the pixels into the substrate of the photolithographic mask for the previously discussed example as well as for the further examples presented in this specification.

It is noted that the registration change of the LowReg writing mode is about four times smaller than the one of the regular writing mode. As already indicated in the previous paragraph, the LowReg writing mode defines a writing of pixels with the laser beam 335 having a smaller pulse energy per pixel than for the regular writing mode. Thus, the LowReg writing mode results in a much smaller expansion of the mask substrate at the same writing density than the application of the regular writing mode. The reason for this large difference in the expansion of the mask substrate between the regular and the LowReg writing mode is that the LowReg pulse energy is close to the threshold of the optical breakdown, whereas the regular mode pulse energy significantly exceeds this threshold.

Figure 24:
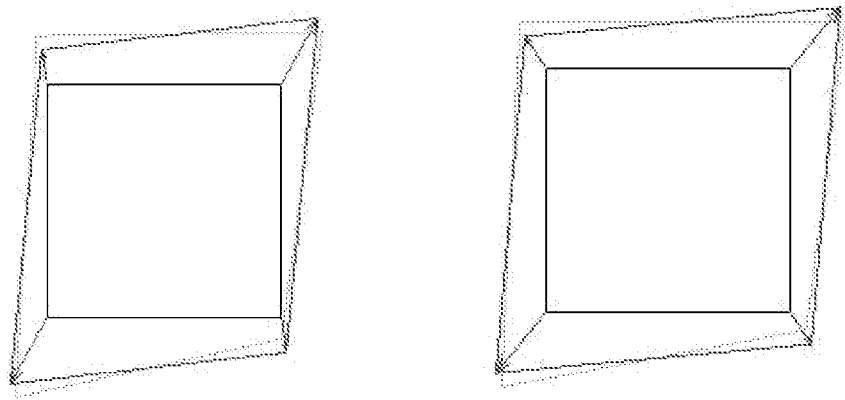
FIG. 24 schematically shows the signatures of a regular writing mode (left) and of a low registration (LowReg) writing mode (right) of the laser beam of FIG. 3.

FIG. 24 indicates the signatures of the regular writing mode (left part) and the signature of the LowRec writing mode (right part) in a normalized representation.

These different pulse energies for the signatures of the regular writing mode and the LowReg writing mode are selected in order to have clear responsibilities for the two writing modes of the laser beam 335. The regular writing mode inducing stronger deformations is responsible for the registration correction, whereas the LowReg writing mode complements the shading of the mask substrate by the regular writing mode in order to keep the shading or the attenuation of the optical intensity at the illumination wavelength uniform across the image field of the photolithographic mask.

Figure 25A:
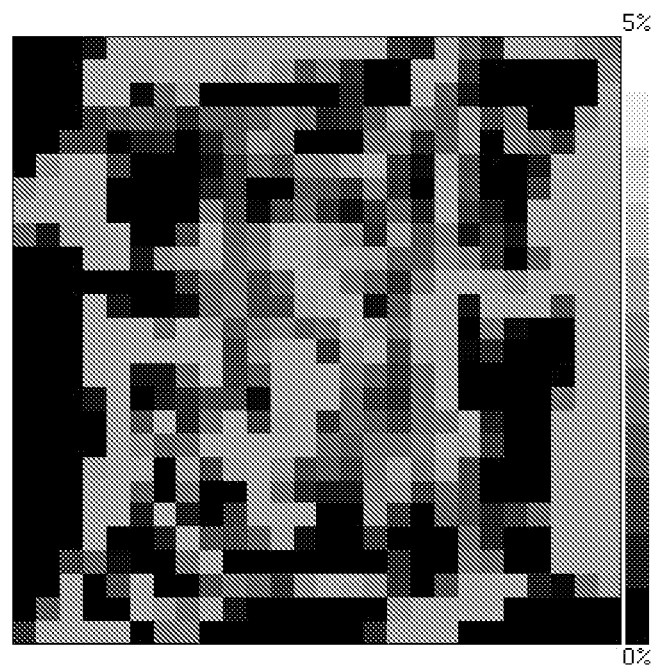
FIG. 25a presents a writing correction map for a first writing mode.
Figure 25B:
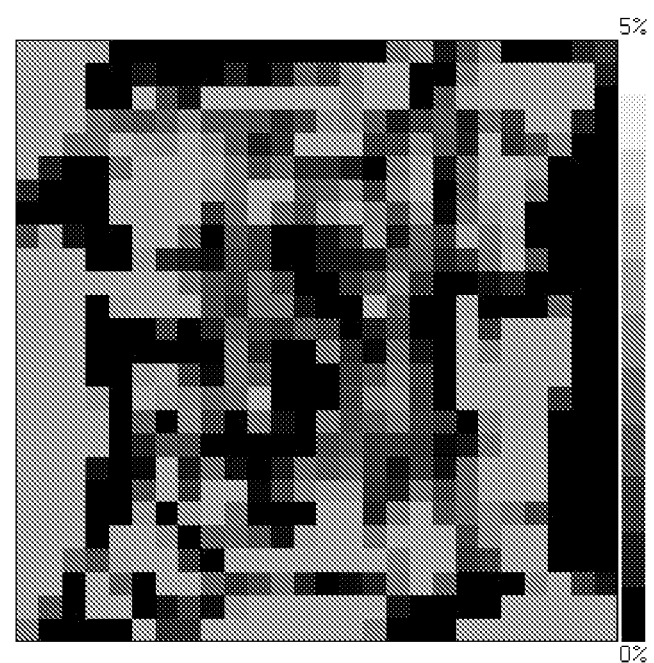
FIG. 25b represents a writing correction map for a second writing mode.

The calculated correction writing map of the regular writing mode is presented in FIG. 25a, and FIG. 25b shows the correction writing map for the LowReg writing mode. It is easily recognized from FIGS. 25a and 25b that the sum of the writing density maps leads to a constant shading of the active area of the substrate of the photolithographic mask. The attenuation level for the optical beam at the illumination wavelength of the mask is selected to be 3% in FIGS. 25a and 25b. The writing of pixels which induce an optical attenuation of 3% is selected since comprehensive investigations revealed that this numerical value does not affect the printing with the photolithographic mask. The effect of the constant attenuation of 3% has to be compensated by a corresponding increase of the dose of the optical intensity used for the illumination of the photolithographic mask.

The calculated improvement of the correction of the registration error of FIG. 4 is 39%. This percentage is slightly less than the calculated improvement for a single mode correction process which is 41%.

Figure 26:
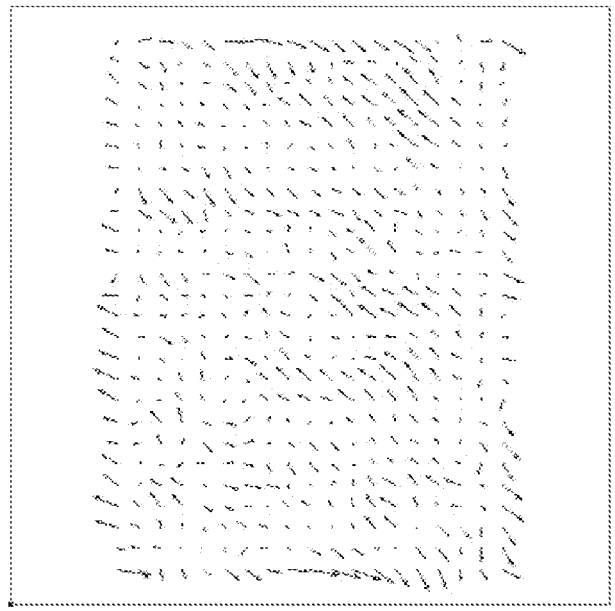
FIG. 26 schematically illustrates the remaining registration problem of FIG. 4 after performing a CD correction.

The correction writing map of FIG. 25a is similar to the correction writing map of FIG. 6. This similarity reflects the fact of the selected artificial separation of the responsibilities of the two writing modes. The regular writing mode is dedicated for the correction of the registration problem of FIG. 4, whereas the LowReg writing mode serves to preserve the shading uniformity across the photolithographic mask. The simulated or forecasted change used for the correction of the registration problem in FIG. 4 is indicated in FIG. 26. As expected from the writing correction maps in FIGS. 6 and 25a, the shifts of the pattern elements induced by the writing of pixels in the substrate of the photolithographic mask are also similar for FIGS. 7 and 26.

In the following example a further application of the inventive method is presented. It is now assumed that the photolithographic mask has the registration problem of FIG. 4 and additionally has a CD uniformity (CDU) problem. The CD uniformity problem is presented in FIG. 27a. FIG. 27b shows the CD correction writing map required to correct the CD uniformity problem of FIG. 27a. The CD correction map is determined by the known critical dimension correction (CDC) ratio factor and a predetermined target CD value. In the following, it is assumed that that the target CD is the smallest CD and that the CDC ratio is 1.2 nm per percent of optical attenuation. The resulting CD correction map $M_{CDC}$(x,y) is presented in FIG. 27b.

Figure 27A:
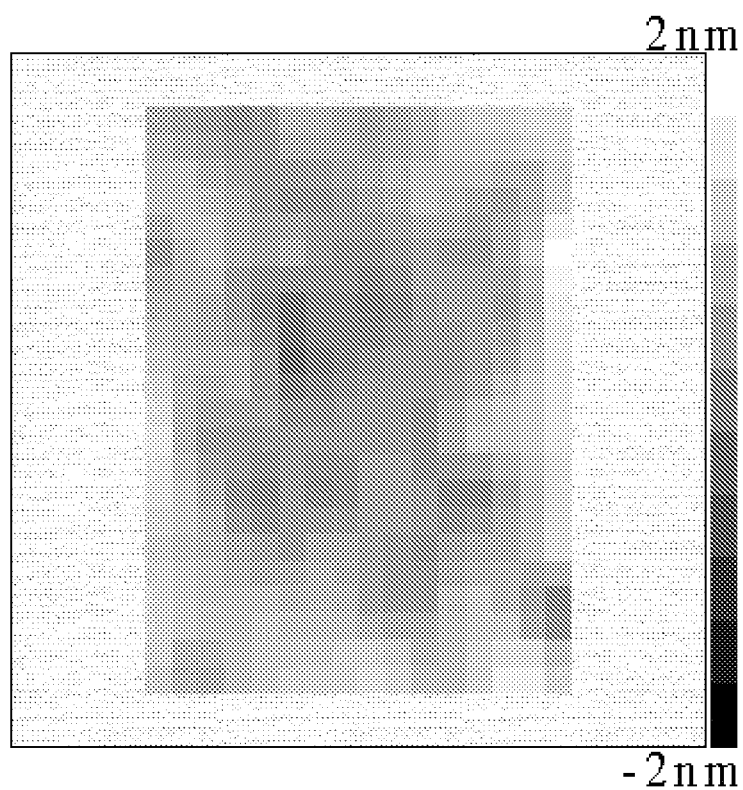
FIG. 27a shows a measured CD uniformity map.
Figure 27B:
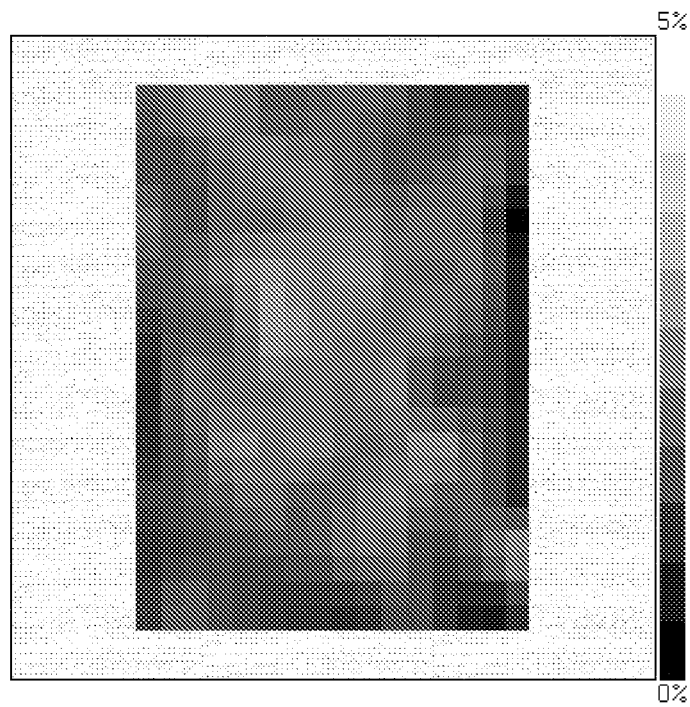

As already mentioned, it is assumed that the mask of FIG. 27a has additionally the registration problem of FIG. 4. Again for the sake of the simplicity, it is further assumed that the different writing modes have an identical CDC ratio. This assumption allows the specification of a value for the target density, which was in equation 44 simply a constant, as the mean value of the writing modes used for the writing of the CD correction in the element area α. Outside of the active area of the photolithographic mask, any behavior of the writing density can be selected. For simplicity reasons, the same condition is also chosen for the accumulated writing density as is selected for a target attenuation, which is 5%.

Within the active area: $a^\alpha = \int_\alpha M_{CDC}(x,y)dxdy / \int_\alpha dxdy$
Within the non-active area: $a^\alpha = 5$ $$a_1^\alpha + a_2^\alpha = a^\alpha \quad (46)$$

Figure 28A:
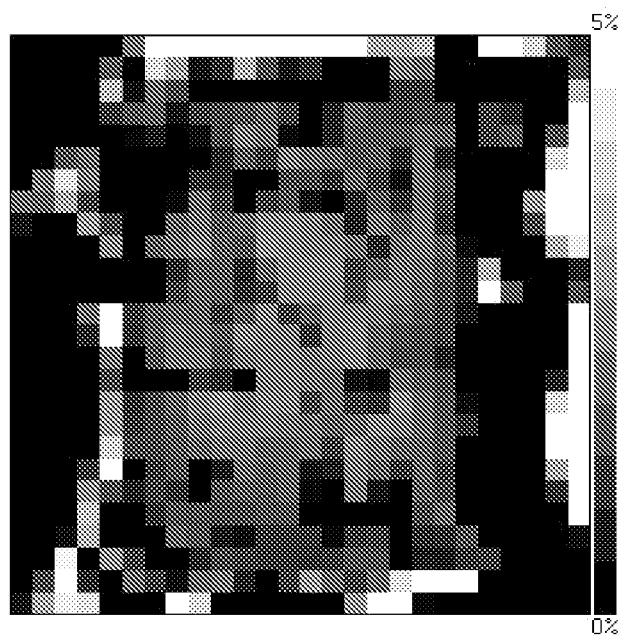
Figure 28B:
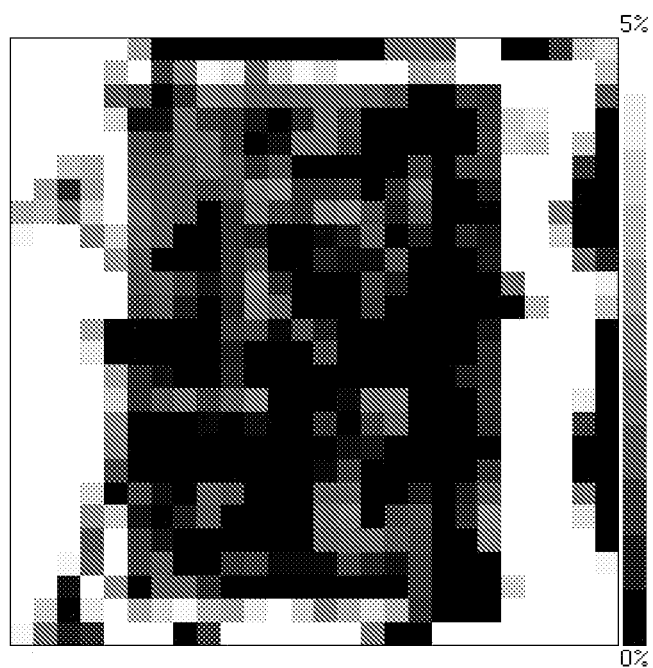
Figure 28C:
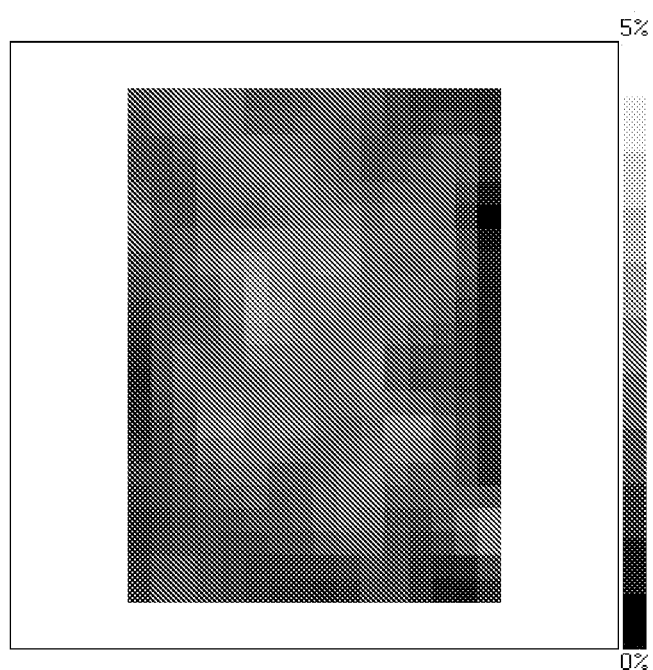

The target functional of equation 45 is now solved with the constraint of equation 46. The result of this optimization is given in FIG. 28a for the first writing mode, in FIG. 28b for the second writing mode of the laser beam 335, and FIG. 28c shows the combined correction writing modes of FIGS. 28a and 28b.

From these Figures it can easily be recognized that the sum of the writing densities of the first writing mode and of the second writing mode is exactly required for the writing of the pixels within the active area necessary for the CD correction. An estimation of the improvement of the registration error resulting from the optimization process of equations 45 and 46 is 36%, which is again very similar to the best possible improvement when using a single writing mode (cf. discussion of FIG. 7). This finding is comprehensible as the degree of freedom in the optimization space is increased by using a second writing mode for the laser beam 335. In the present example, this capability is dedicated to improve the CD uniformity. The resulting CDU has to be perfect with the accuracy of the input CDU data and within the stability of the pixel writing process.

Figure 29:
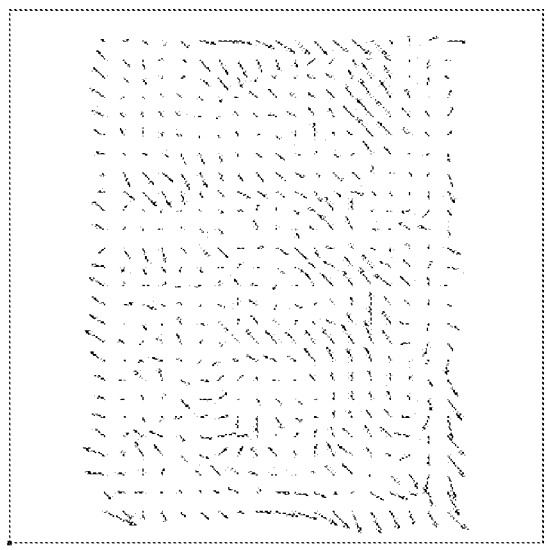
FIG. 29 schematically illustrates the residual registration problem after performing writing of pixels according to the correction writing map of FIG. 28c and after performing a linear imaging transformation.

The residual registration problem of FIG. 4 resulting from a simulation is depicted in FIG. 29. As it is expected, the residual registration problem of FIG. 29 has the same fingerprint as that in FIG. 7. However, the writing of the corrections of FIGS. 28a and 28b, on the one hand, and FIG. 6, on the other hand, differs more significantly because of the additional problem to simultaneously correct the CD uniformity of FIG. 27b with the writing correction maps of FIGS. 28a and 28b.

It is possible to use a multi-mode approach and to potentially remove 80% of the registration errors. A possible choice of the used writing modes could be the application of a regular writing mode with a 0° mode signature and of a further regular writing mode with a 90° mode signature and the application of a LowReg writing mode as a third writing mode. The parameter values for the regular and the LowReg writing modes are summarized in Tables 2 and 3. The high potential for the improvement of both, the registration errors and the CD uniformity errors is a result of the very systematic initial registration problem of FIG. 4.

The person skilled in the art will appreciate that the application of the inventive method with respect to registration problems of photolithographic masks is not limited to the examples discussed above. These examples are presented to just illustrate some of the beneficial aspects of the inventive principle for the solution of registration problems of photolithographic masks.

CDU Problems

In the following examples, the inventive method will be applied to involved critical dimension uniformity (CDU) problems. Equation 29 of the part "theoretical background" describes the node displacements $\xi_i$ induced by the application of the laser beam 335 having writing density amplitudes $a_m^\alpha$ and deformation elements $t_l^m$ in the normal directions 1. Similar to the above discussed correction of registration problems, pixels are also written in the substrate of the photolithographic mask for the CD correction. Thus, for any predefined CDC problem, equation 29 can be used in order to compute the displacements resulting from the writing of the pixels. The displacements resulting from a CDC process may change positions of the pattern elements of the photolithographic mask and may potentially degrade the performance of the mask. In the following, it is discussed how CDC can be performed without negatively influencing the positions of the pattern elements, or in other words, without introducing registration errors while correcting CD uniformity problems.

A typical CDC process does not require the application of multiple writing modes for the laser beam 335. Rather, the CDC process is performed by using only a single writing mode which is also called the Process Window (PW). By using the equations 29 and 32, it is possible to forecast the changes induced by the writing mode for the CD correction to the positions of the pattern elements at the important locations. For a single CDC writing mode the displacements are given by:

$$\zeta_i^{cdc} = \sum_j \Phi_{ij}^{cdc} a_j^{cdc} \quad (47)$$

where the matrix $\Phi_{ij}$ is defined in equations 40 and 41.

A typical CDC task contains the writing of pixels by the laser beam 335 across the image field of the photolithographic mask which is the active area 150 of the photolithographic mask 100. Normally no pixels are written in the non-active area 160 of the substrate 110 of the photolithographic mask 100. For CD correction pixels are typically written in the middle of the depth or of the height of the substrate of the photolithographic mask which has a distance of about 3.175 mm from pattern elements. For this example it has been assumed that the depth or height of the mask substrate is 6.35 mm. The objective used for the illumination has a NA of 0.25 in the air and about 0.17 in substrate 110 of the photolithographic mask 100. It can be shown from simple geometry considerations that the generated shading element has to be about 0.5 mm wider than the pattern element area in order to shade homogeneously all of the illumination of the photolithographic mask. To ensure a homogeneous shading of the illumination CD correction, pixels are typically written in an area exceeding the pattern element area by 1 mm.

In the following, pixels are also written in the non-active area in order to generate deformations which leave, in combination with the equation 47 and a linear imaging transformation executed by the scanner or the stepper of the photolithographic illumination system, a smaller amount of the induced registration change. In other words, it is the objective to generate an apodization of the induced registration change. This approach is called smart apodization (smart APO). This name is chosen as already the writing of pixels according to a simple fading periphery can also be used as an apodization. Analogous to the equation 47, the registration change induced by the writing of the apodization pixels is:

$$\zeta_i^{apo} = \sum_j \Phi_{ij}^{apo} a_j^{apo} \quad (48)$$

It is here assumed that it is possible to select a writing mode of the laser beam 335 for the apodization task different from the one used for the CDC process. This writing mode is in the following called apodization writing mode. This writing mode normally uses high power pulses of the laser beam 335. The reason for using a different writing mode is for example an increase of the apodization writing throughput, or an optimization means for the apodization compensation. Hence, it is the target to find apodization amplitudes $a_j^{apo}$ and linear imaging transformation parameters or scanner compensation parameters $s_j$ which minimize the following target functional:

$$\min\left\{\sum_i\left(\sum_j \Phi_{ij}^{cdc} a_j^{cdc} + \sum_j \Phi_{ij}^{apo} a_j^{apo} + \sum_j T_{ij} s_j\right)^2 + \lambda^s \sum_k s_k^2 + \lambda^a \sum_k a_k^{apo^2}\right\}. \quad (49)$$

Equation 49 is a simple optimization problem. The apodization amplitudes $a_j^{apo}$ are only defined in the cells of the non-active area 160 of the substrate 110 of the photolithographic mask 100. The efficiency of the smart apodization procedure is now demonstrated on the basis of several examples.

Figure 30:
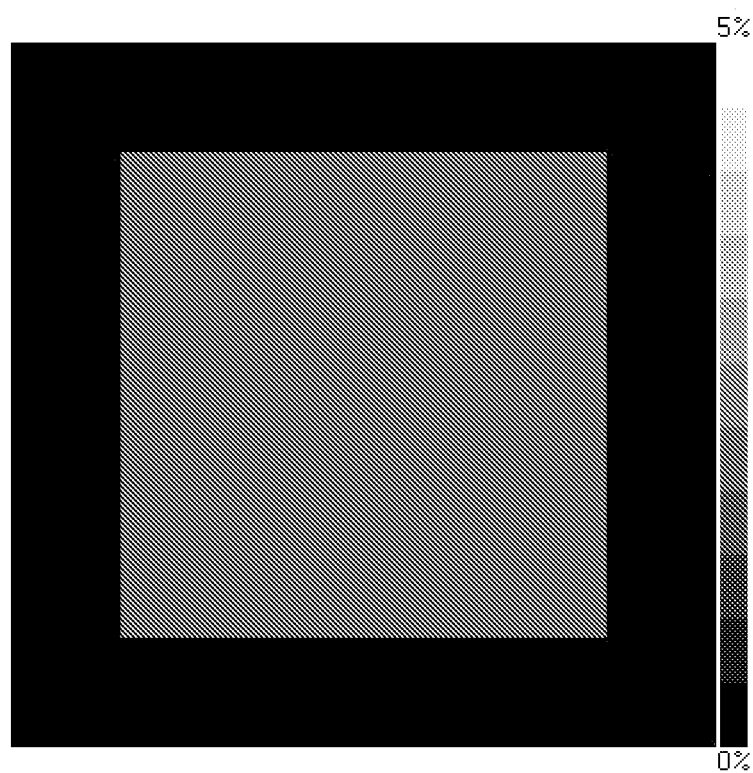
FIG. 30 represents a standard CDC test writing map for a constant writing density of 2%.

In a first example, the apodization is shown resulting from a standard test writing. A standard test writing is designed in order to control the writing uniformity and the induced deformation for the specified PW (process window). FIG. 30 shows a constant writing density in the rectangular grey area which induces an attenuation of 2% of the optical intensity.

Figure 31A:
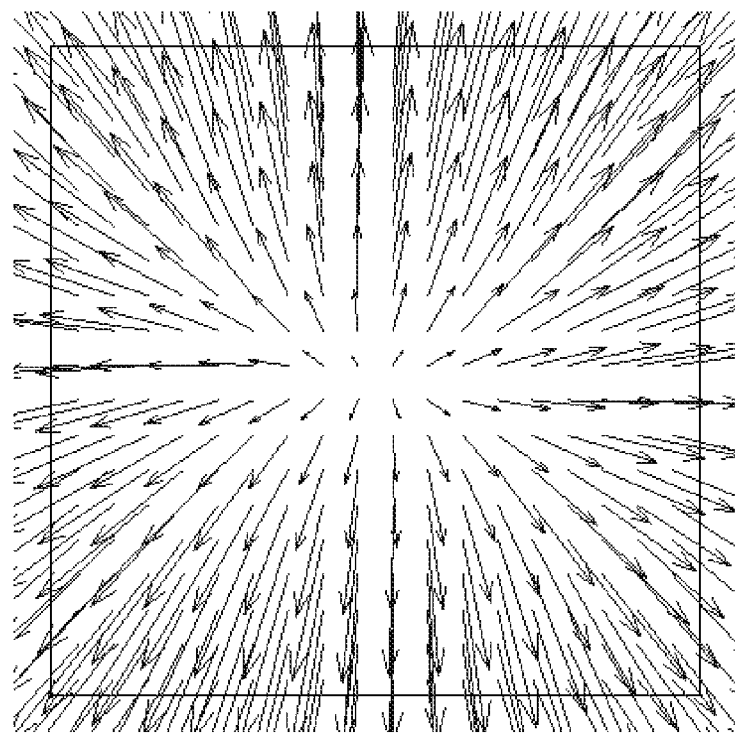
FIG. 31a schematically shows the measured registration change induced by the writing map of FIG. 30.
Figure 31B:
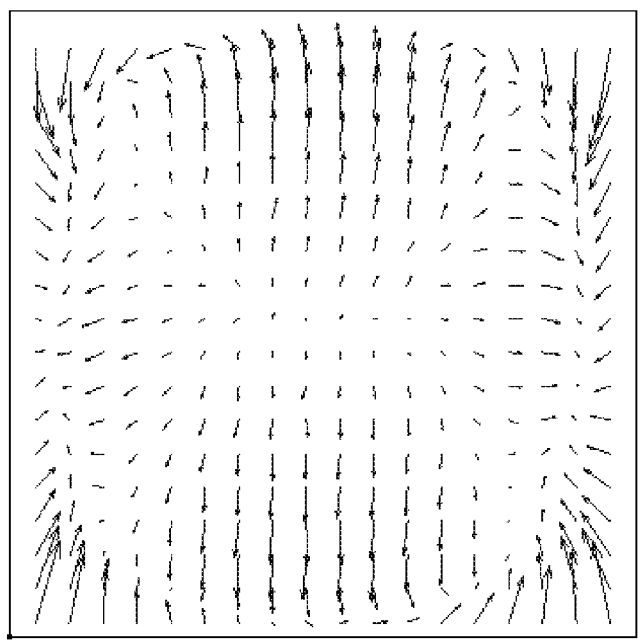
FIG. 31b schematically shows the measured registration change induced by the writing map of FIG. 30 after performing a linear imaging transformation.

FIG. 31a depicts the measured registration change which is induced by the test CDC writing, and FIG. 31b illustrates the remaining registration change after performing a linear imaging transformation. In FIG. 31a, the 3σ numerical value of the registration error is 41.5 nm for the x direction and is 69.2 nm for y direction. After performing a linear imaging transformation (S/O correction), a residual error remains of 5.4 nm for the x direction and of 14.9 nm for the y direction. For demonstration purposes, the selected test writing is chosen to be very aggressive, and it does obviously induce a significant registration change. Since the test pixels are uniformly written across the active area of the photolithographic mask, a large portion of the resulting registration change can be compensated by a linear imaging transformation performed by the scanner (or for a stepper) of the photolithographic illumination system.

Figure 32A:
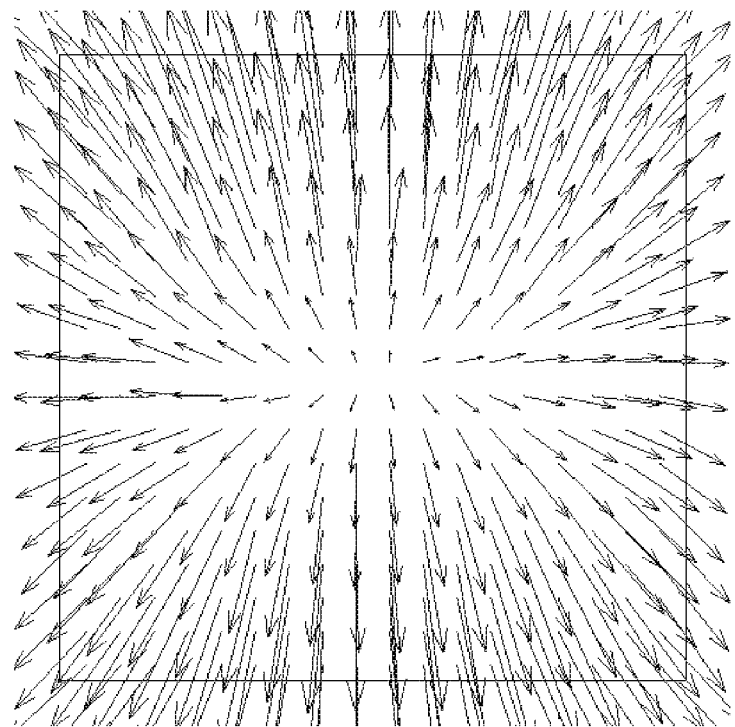
FIG. 32a schematically indicates the simulated registration change induced by the writing map of FIG. 30.
Figure 32B:
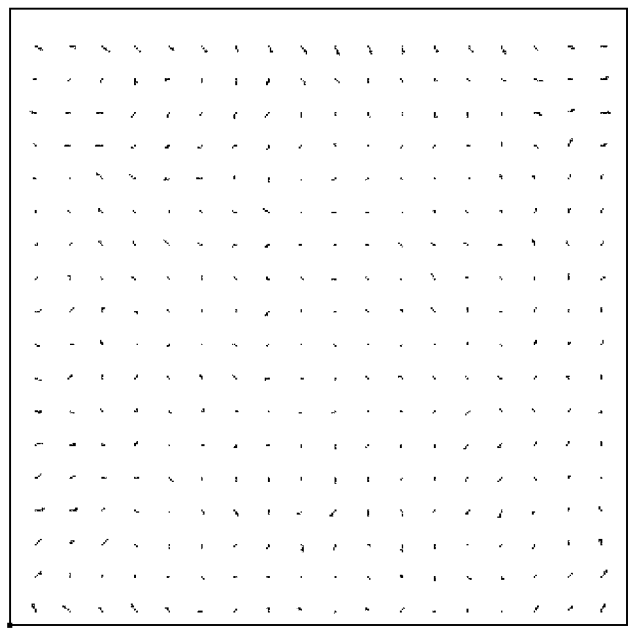
FIG. 32b schematically depicts the difference between simulated registration change and measured registration change for the CDC (critical dimension correction) test writing of FIG. 30.

Since the CDC writing mode signature is known from equation 47 the registration change resulting from the standard test writing map of FIG. 30 can be simulated. The results of this simulation are presented in FIGS. 32a and 32b. The simulated results show a very good agreement with the measured registration change of FIGS. 31a and 31b. This agreement clearly demonstrates that it is possible to forecast an induced registration change without performing a respective measurement.

With this result it is possible to compute the amount of apoidzation which is required to minimize the residual registration error, i.e. the registration change induced by the CDC process is not measured, instead this registration change is simulated and the obtained result is used for the computation of the best apodization parameters. For this purpose, it is only necessary to consider the registration changes in the active area of the photolithographic mask.

Figure 33A:
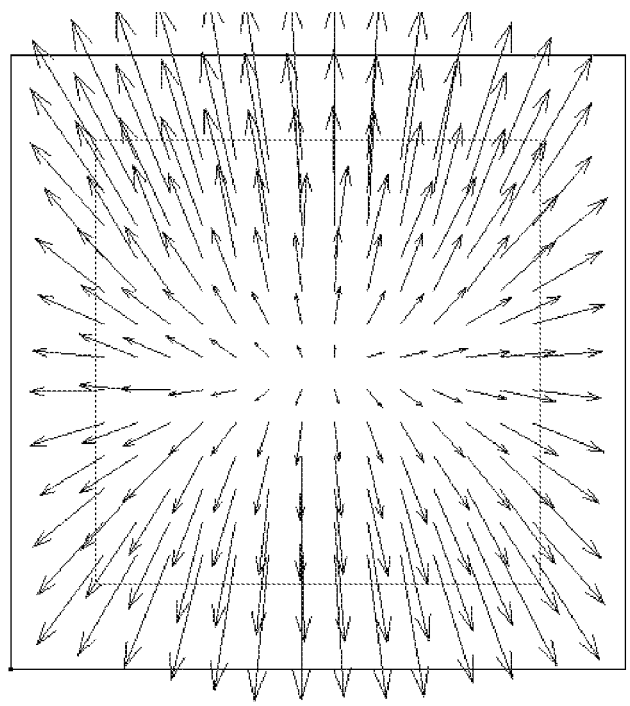
FIG. 33a schematically shows the simulated registration change induced by the writing map of FIG. 30.
Figure 33B:
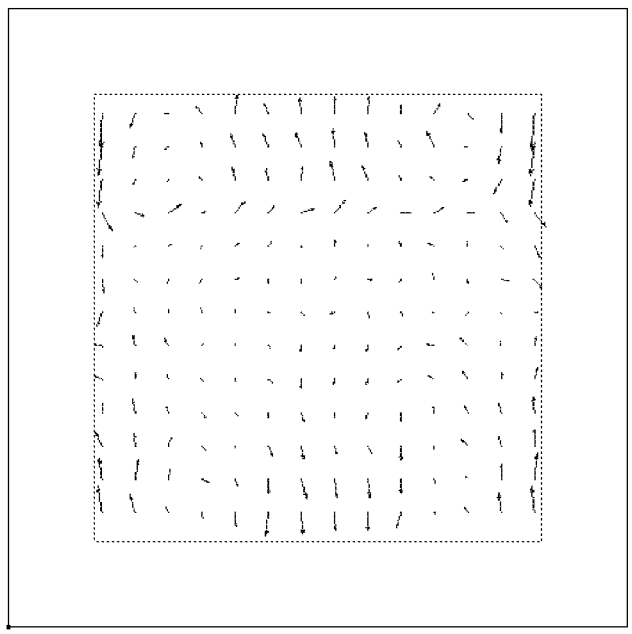
FIG. 33b schematically indicates the registration change of FIG. 33a after performing of a linear imaging transformation.

FIG. 33a shows the simulated registration change within the active area of the photolithographic mask. The simulated registration change in the mask active area characterized by the 3σ numerical value is 22.5 nm for the x direction and 47.1 nm for the y direction. FIG. 33b presents the residual registration error after a linear imaging transformation has been performed by the scanner of the photolithographic illumination system. The remaining registration error amounts to 2.1 nm for the x direction and 6.2 nm for the y direction.

Figure 34A:
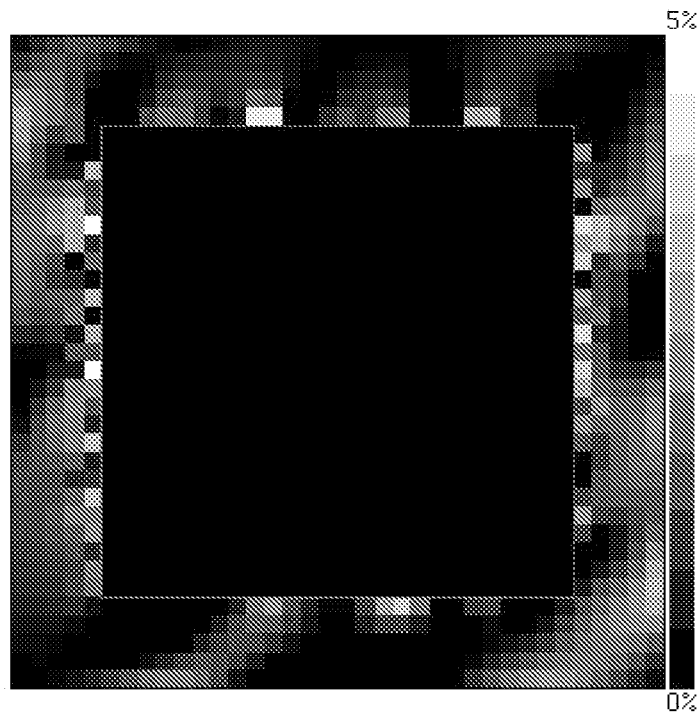
FIG. 34a shows the calculated apodization writing map to correct registration errors induced by the CDC test writing of FIG. 30.

Using this data an apodization writing map can be computed which will decrease the registration change induced by the CD correction. FIG. 34a shows the calculated apodization writing map. A variation of the optical intensity in the non-active area of the photolithographic mask of 5% has been allowed in the computation of this apodization writing map.

Figure 34B:
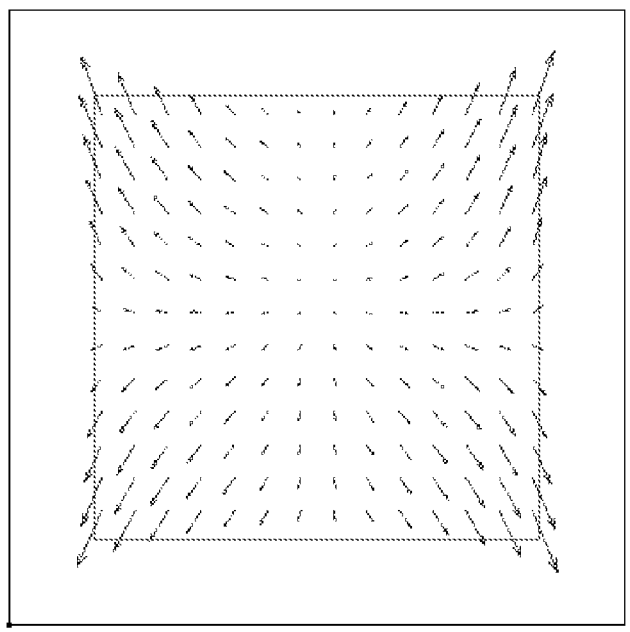

FIG. 34b indicates the registration changes in the active area of the photolithographic mask induced by the apodization writing of pixels in the non-active mask area.

Figure 35A:
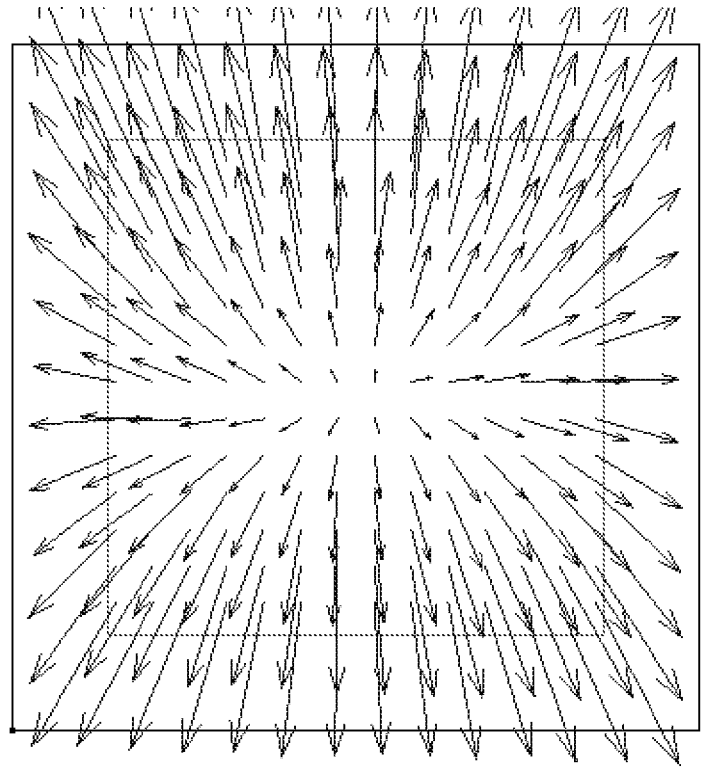
Figure 35B:
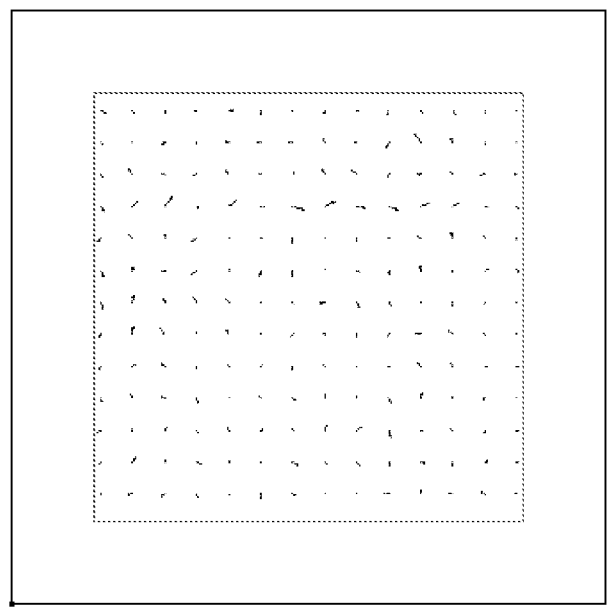
FIG. 35b represents the registration change of FIG. 35a after performing a linear imaging transformation.

FIG. 35a presents the registration change resulting from the registration changes of the CD correaction (FIG. 33a) and of the apodization writing (FIG. 34), and FIG. 35b indicates the residual registration changes of FIG. 35a after performing a linear imaging transformation.

After the CDC and the APO writing maps are written the mask substrate, the simulated registration changes in the active area (3σ numerical value) add up to 27.3 nm for the x direction and to 54.3 nm for the y direction. After a linear imaging transformation is performed (S/O correction) a residual registration error remains of 1.72 nm for the x direction and of 1.78 nm for the y direction. This is an improvement of 71% with respect to the situation of FIG. 31. Hence, the residual registration error in the area of the photolithographic mask is reduced by a factor of three to four. Thus, the apodization process can to a large extent reduce registration errors introduced by the CD correction process.

In a further example, the effect of a standard apodization procedure is now demonstrated. The standard apodization procedure comprises the writing of pixels in the non-active area of the photolithographic mask which fades out from the CDC level to a level having a zero writing density.

Figure 36A:
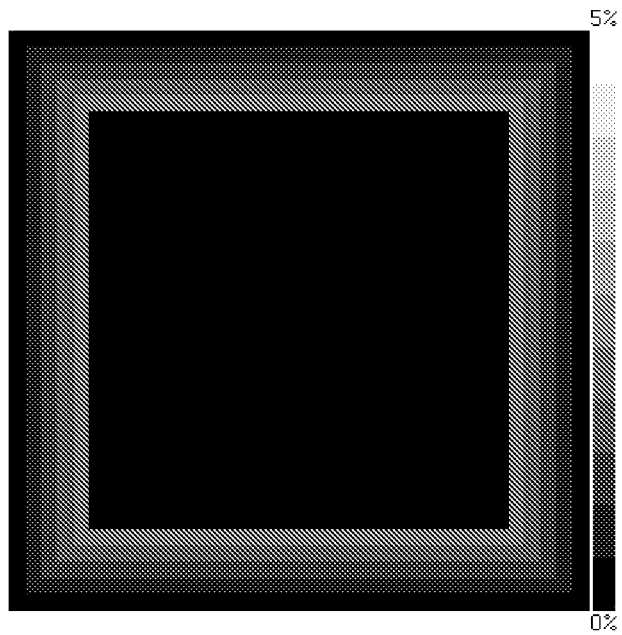
FIG. 36a presents a fading apodization writing map.
Figure 36B:
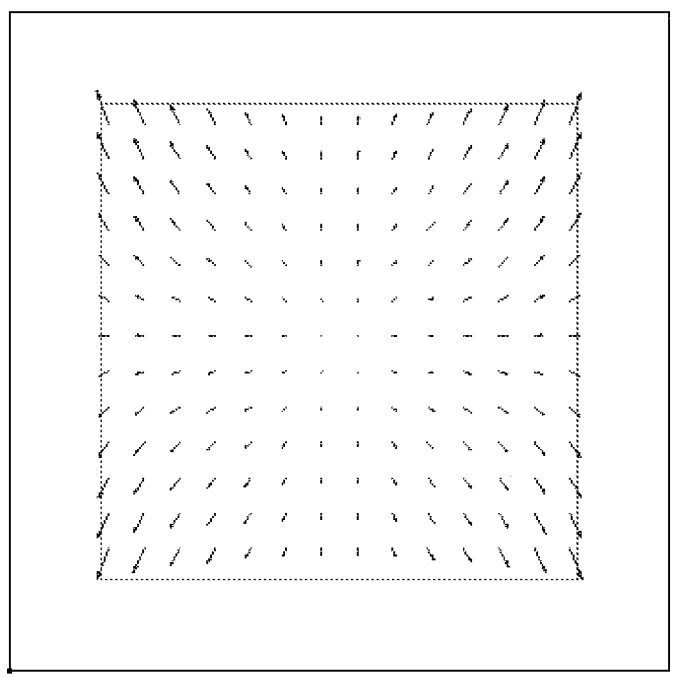

In FIG. 36a the writing of this fade out apodization is depicted. FIG. 36b shows simulation results of the registration changes induced by the fading apodization writing map of FIG. 36a. FIG. 36b depicts a similar compensation of the registration change at the corners of the active area as FIG. 34b.

Figure 37A:
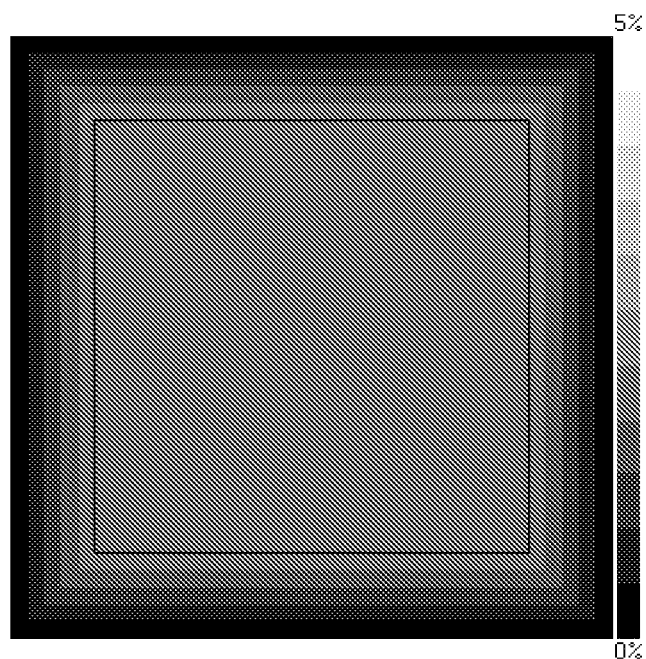
Figure 37B:
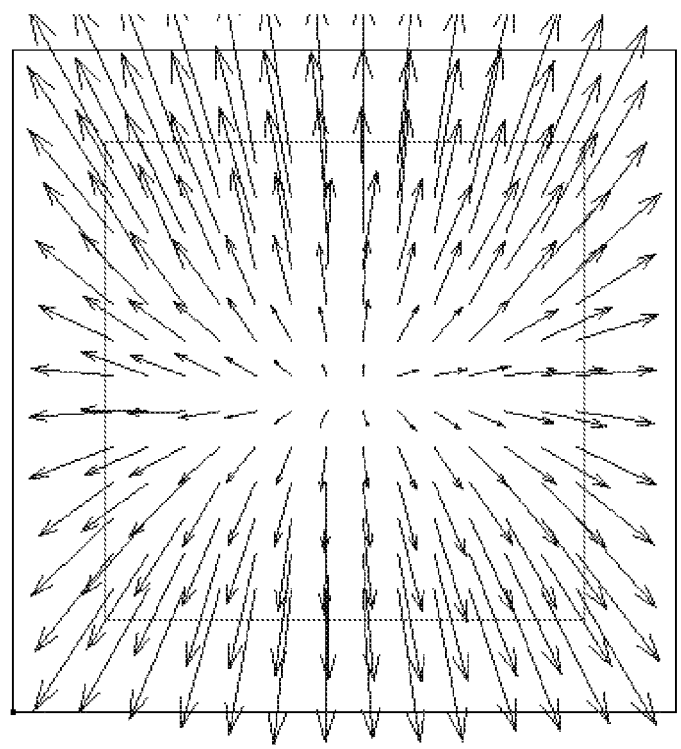
Figure 37C:
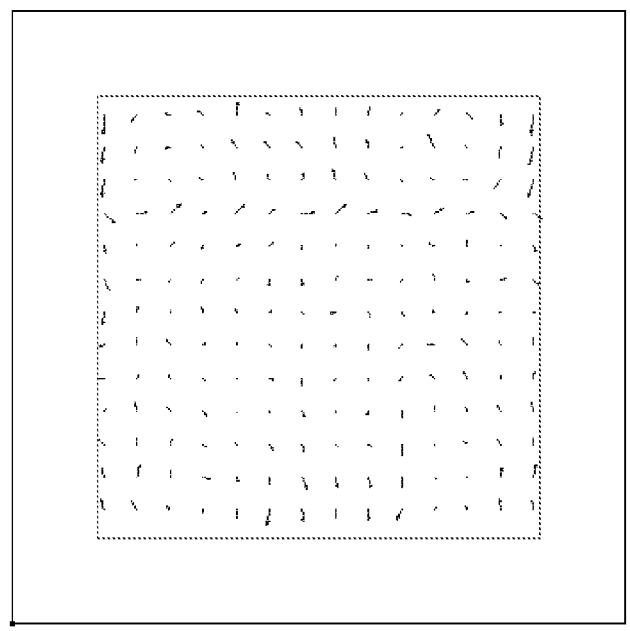
FIG. 37c schematically shows the registration change of FIG. 37b after performing of a linear imaging transformation.

In the following, the effect of the fade out apodization on the registration errors induced by the test CDC writing will be analyzed. FIG. 37a presents a writing map combining both, the test CDC writing of FIG. 30 and the fading apodization of FIG. 36a. FIG. 37b depicts the resulting registration change of the writing map of FIG. 37a. The resulting registration change obtained by executing a corresponding simulation is for the active area of the photolithographic mask (3σ numerical value) 26.3 nm for the x direction and 52.3 nm for the y direction. As indicated in FIG. 37c, after performing a linear imaging transformation (S/O correction), the remaining registration error amounts to 2.1 nm for the x direction and to 3.8 nm for the y direction. This results in an improvement of 38% compared to the simulated registration change within the active area of the photolithographic mask which is illustrated in FIG. 33a.

Thus, by just applying the fading apodization, a reduction of the registration error within the active area of the photolithographic mask by a factor of 1.5 can be obtained. This result is extraordinarily good due to the fact that a very symmetric and uniform test CDC writing has been used. For the general case, the achieved improvement varies from 5% to 30%; however, even this improvement is important enough in order to justify the effort for executing a fading apodization. There is no need to know the exact value of the writing mode signature for the fading apodization and no additional computation is necessary. These items are serious advantages of the presented approach. It is only required to write a uniform fading apodization in the non-active area of the photolithographic mask. On the other hand, a smart apodization approach certainly offers a more effective compensation method which in addition requires less writing time.

Figure 38A:
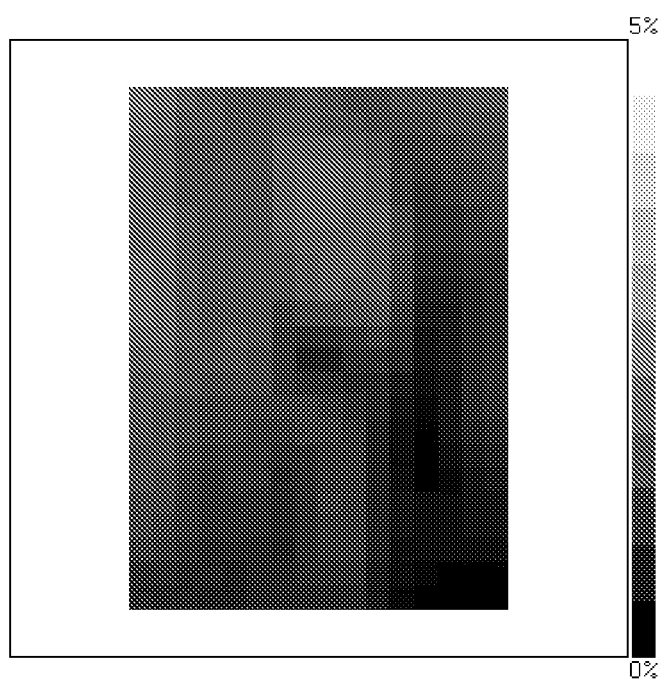
FIG. 38a presents a writing map for CD correction.
Figure 38B:
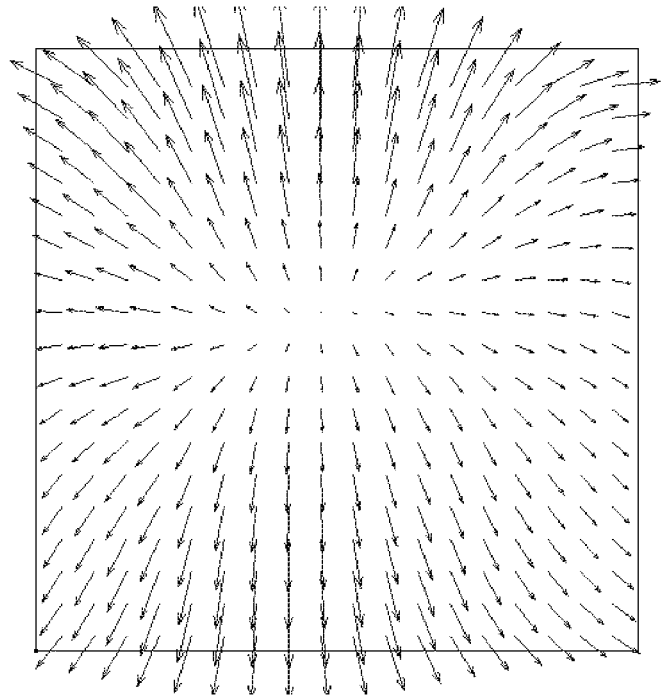
Figure 38C:
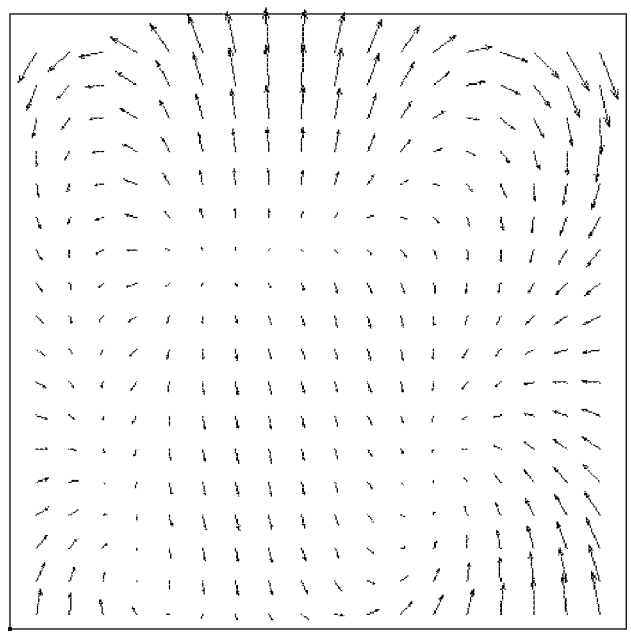
FIG. 38c schematically shows the registration change of FIG. 38b after performing of a linear imaging transformation.

In a second example, it will now be demonstrated how smart apodization can be applied to a realistic CDC task. FIG. 38a shows a CD correction writing map for the active area of a photolithographic mask. FIG. 38b presents the registration changes induced by the writing of the CD correaction pixels, and FIG. 38c illustrates the residual induced registration changes of FIG. 38b after a linear imaging transformation has been performed (S/O correction).

The CD correction writing density is relatively low and has a maximum attenuation of the optical intensity of only 2.1% and the average attenuation is less than 1%. The CDC task induces a registration change of 15.2 nm in the x direction and of 35.7 nm in the y direction in the active area of the photolithographic mask. Even with this small writing density relative to the CDC task of FIG. 40a below, the CDC task of FIG. 38a induces a relatively significant registration change. After performing a linear imaging transformation (S/O correction) the residual registration change adds to 4.6 nm for the x direction and 8.4 nm for the y direction.

Figure 39A:
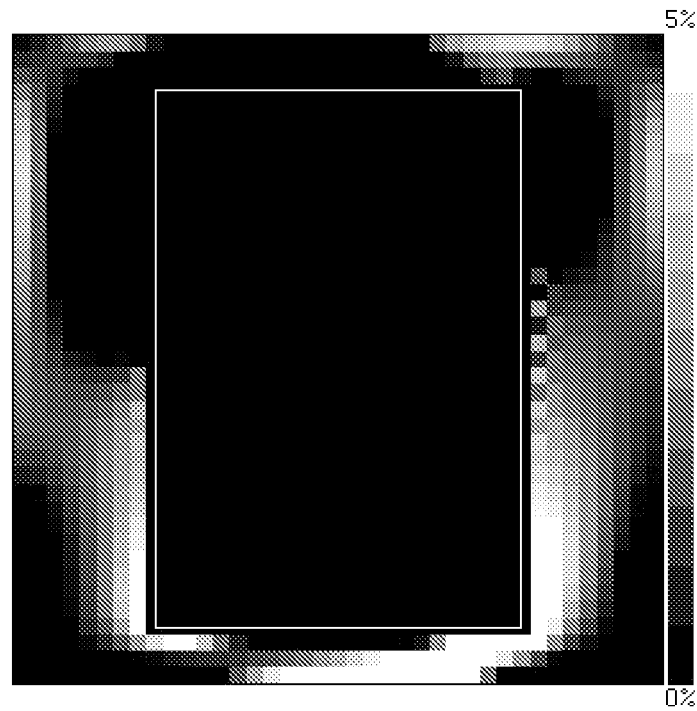
FIG. 39a presents an apodization writing map.
Figure 39B:
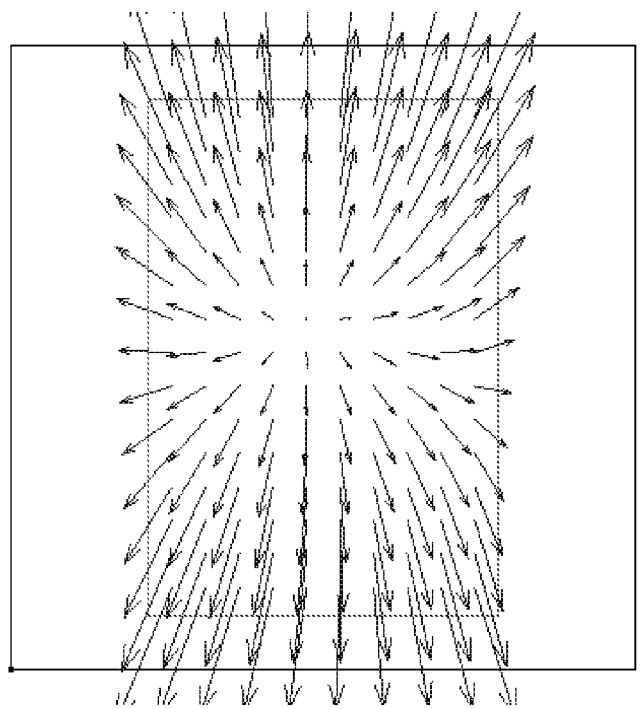
Figure 39C:
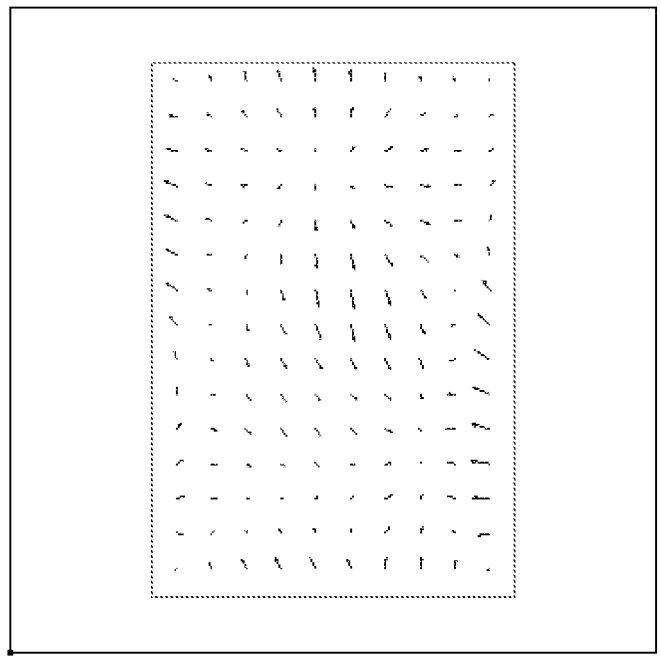
FIG. 39c schematically shows the registration change of FIG. 38b after performing of a linear imaging transformation.

FIG. 39a shows the apodization map corresponding to the CDC task of FIG. 38a. FIG. 39b illustrates the registration changes induced by the apodization map of FIG. 39a in the active area of the photolithographic mask, and FIG. 39c depicts the residual registration changes after performing a linear imaging transformation. The resulting residual registration change of the CDC task of FIG. 38a in combination with the apodization task of FIG. 39a results in a residual registration change (3σ numerical value) of 3.15 nm for the x direction and 3.54 nm for the y direction. The improvement is 58% which approximately halves the registration change induced by the CD correction which is presented in FIG. 38b.

Figure 40A:
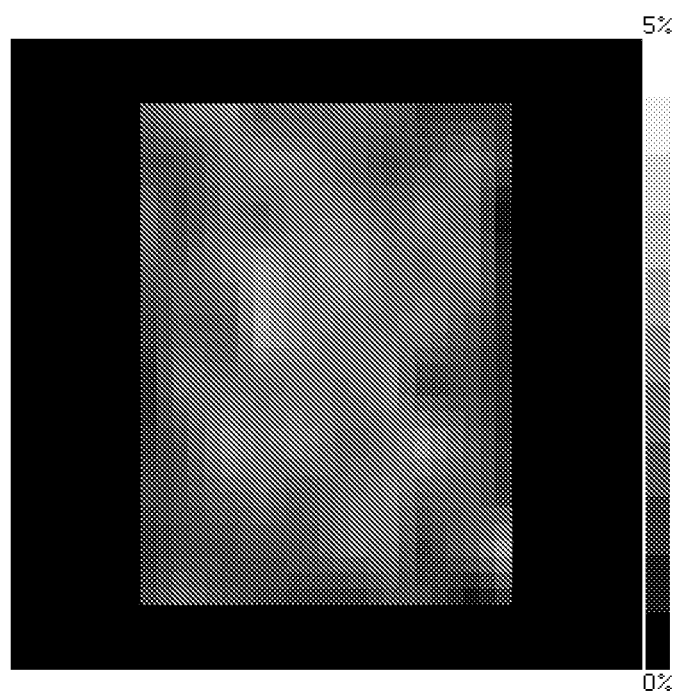
FIG. 40a presents a further writing map for CD correction.
Figure 40B:
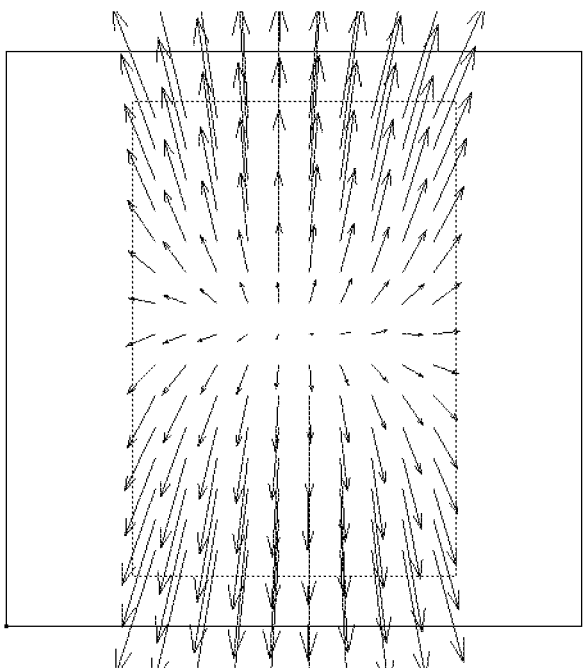
Figure 40C:
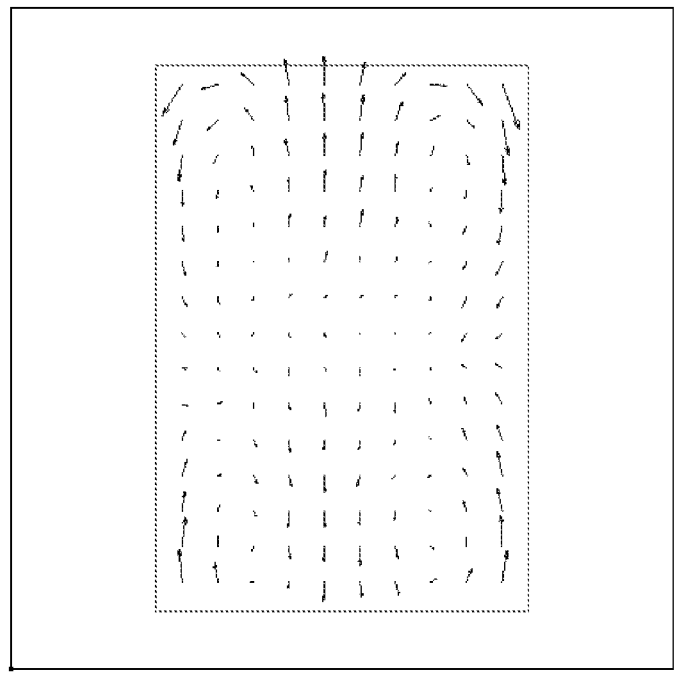
FIG. 40c schematically shows the registration change of FIG. 40b after performing of a linear imaging transformation.

By means of a third example the effect of the smart apodization approach will now be demonstrated for another typical CDC task. FIG. 40a shows a CD correction writing map for the active area of a photolithographic mask for a typical CDC problem. FIG. 40b presents the registration changes induced by the writing of the CD correction pixels, and FIG. 40c illustrates the residual induced registration changes of FIG. 40b after a linear imaging transformation has been performed (S/O correction).

The maximum attenuation induced by the CDC writing density is 2.8% and in the average the CDC writing density introduces an attenuation of the optical intensity at the exposure wavelength of 1.7%. This change in the attenuation is much larger than that of the CDC task in FIG. 38a. The simulated registration change in the active area (3σ numerical value) is 12.2 nm for the x direction and 53.4 nm for the y direction. The registration change induced by the writing of the CD correction is also much larger than that of the CDC task of FIG. 38a. After performing a linear imaging transformation (S/O correction), it remains a registration change of 2.3 nm in the x direction and of 7.0 nm for the y direction. It can be seen that the residual registration change for the CDC task of FIG. 40a is less than that for the task of FIG. 40a. This is due to a more uniform CDC writing map.

Figure 41A:
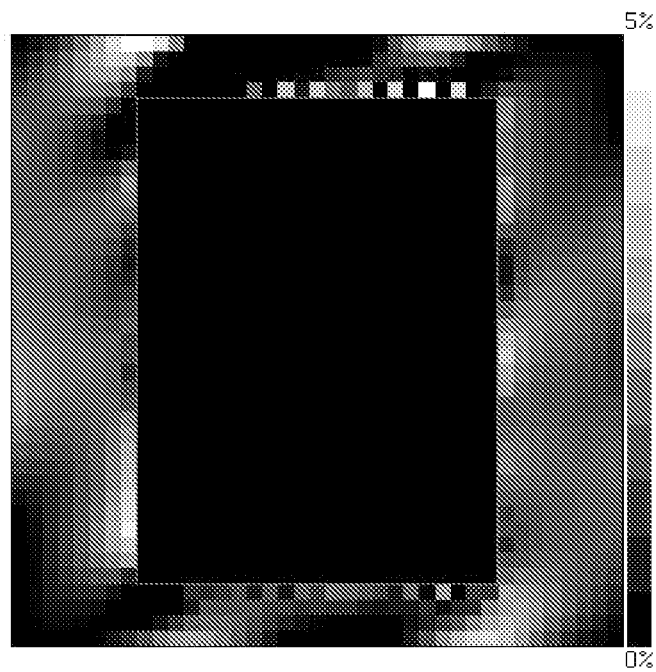
Figure 41B:
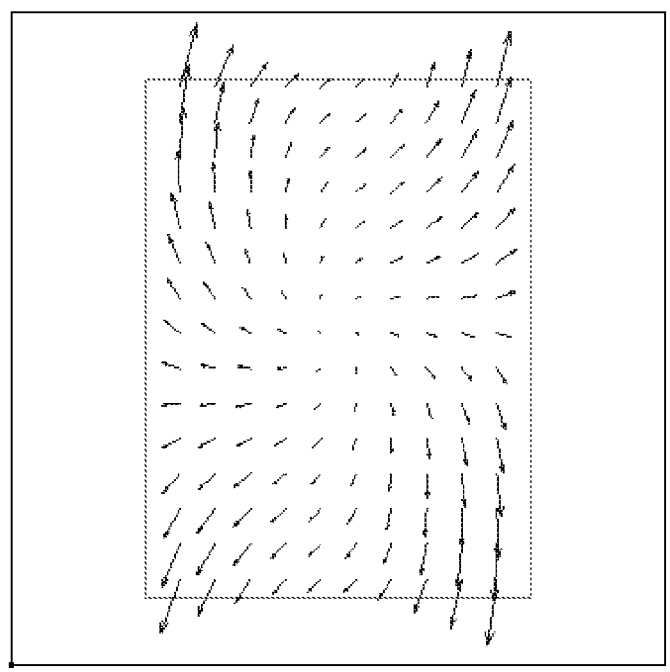
FIG. 41b schematically presents the registration change induced by the apodization writing map of FIG. 41a in the active area of the photolithographic mask.

FIG. 41a shows the apodization map calculated for the CDC task of FIG. 40a. FIG. 41b presents the registration changes induced in the active area of the photolithographic mask by the apodization map of FIG. 41a.

Figure 42A:
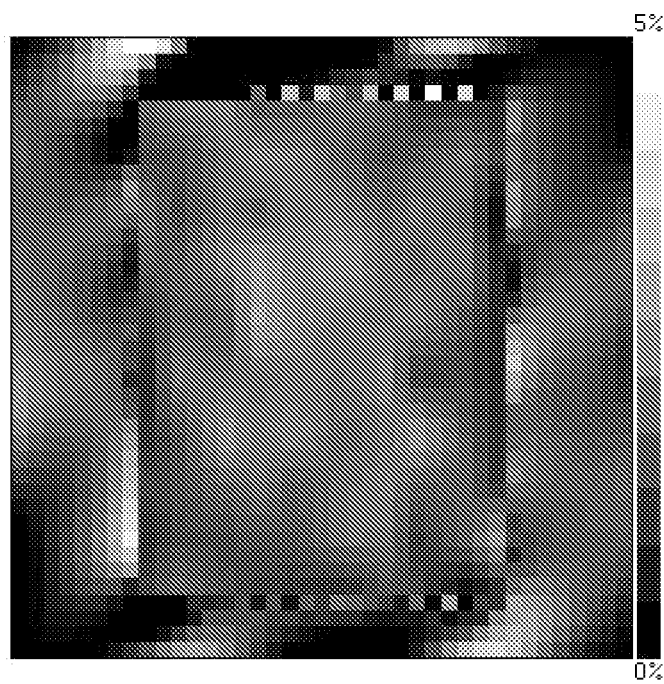
Figure 42B:
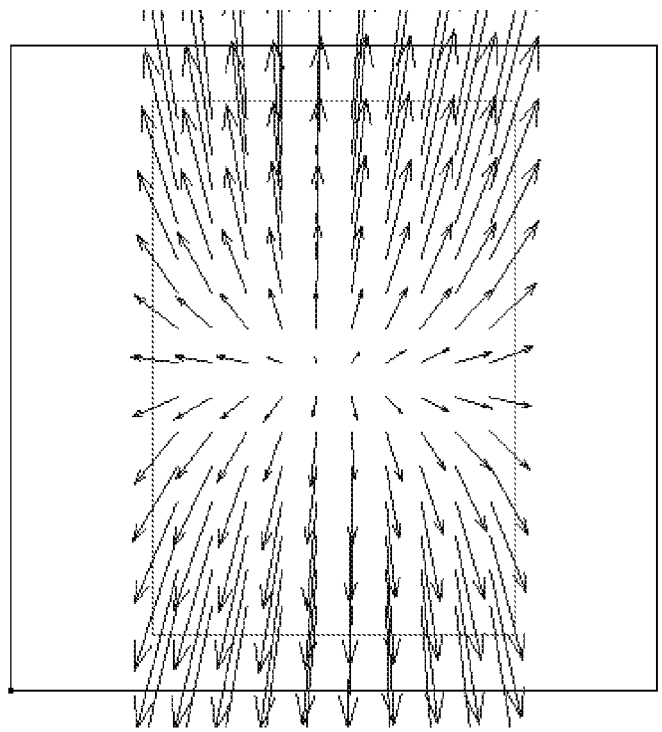
Figure 42C:
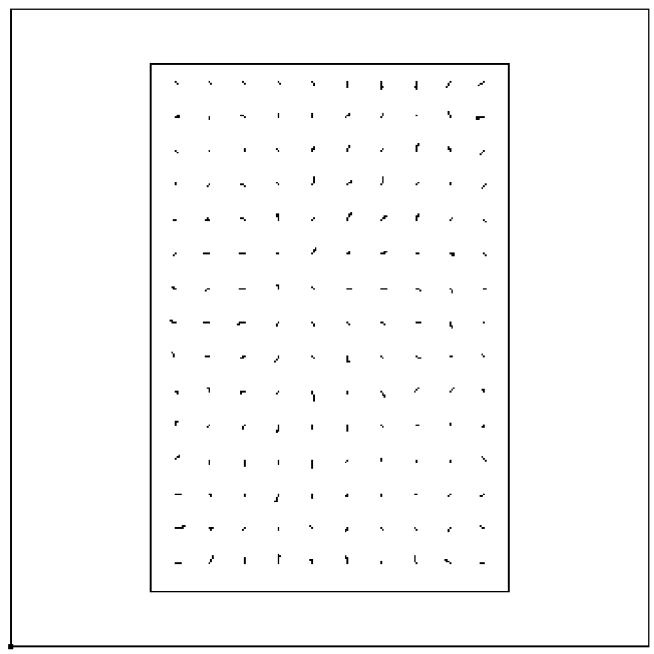
FIG. 42c schematically shows the residual registration change of FIG. 42b after performing of a linear imaging transformation.

FIG. 42a presents a writing map combining both, the CDC task of FIG. 40a and the computed apodization task of FIG. 41a. FIG. 42b depicts the resulting registration change of the writing map of FIG. 42a, and FIG. 42c shows the residual registration change after performing a linear imaging transformation (S/O correction). The simulated registration change after applying the CDC and the APO writing to the active area is 15.6 nm for the x direction and 67.0 nm for the y direction (3σ numerical value). After performing a linear imaging transformation for S/O correction the remaining registration change amounts to 1.5 nm for the x direction and 1.95 nm for the y direction. This data shows an improvement of 69% of the registration change induced by the CDC task of FIG. 40a. The improvement for the CDC task of FIG. 40a is higher than for the CDC task of FIG. 38a, and thus the resulting standard deviation (3σ) is also significantly smaller. It is therefore possible to reduce the residual registration change induced by the CDC task of FIG. 40a by a factor of three.

Figure 43A:
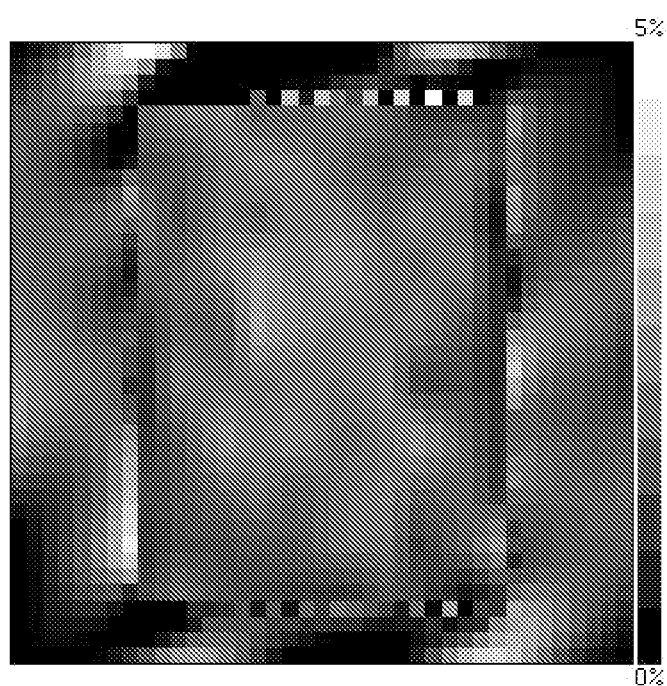
Figure 43B:
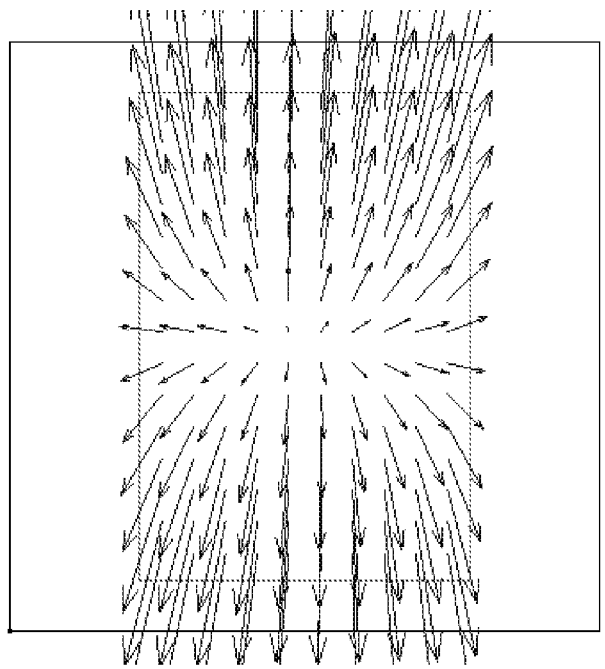
Figure 43C:
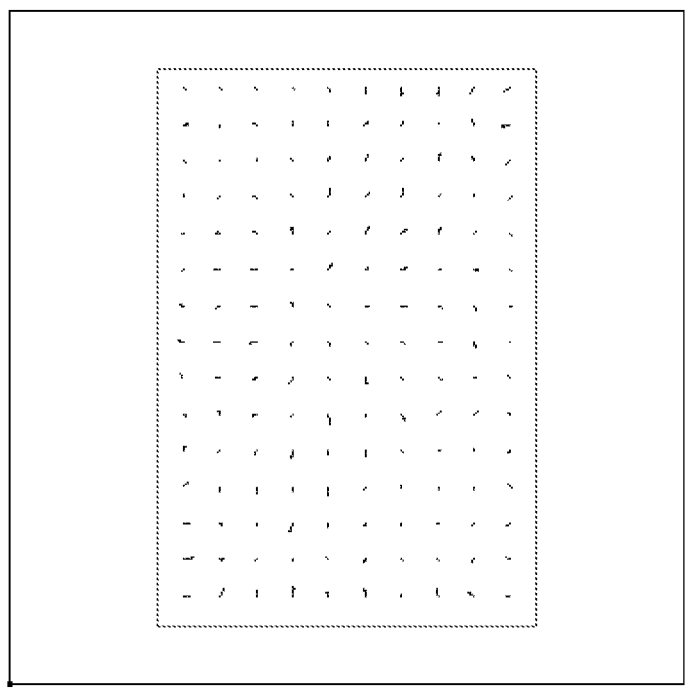
FIG. 43c schematically shows the registration change of FIG. 42b after performing of a linear imaging transformation.

In FIG. 43, the results of FIG. 42 obtained by simulation are checked experimentally. FIG. 43a represents the writing map combining both, the CDC task of FIG. 40a, which is actually applied to the photolithographic mask of FIG. 41a. FIG. 43b show the measured registration change arising from the writing map of FIG. 43a, and FIG. 43c shows the residual registration change after performing a linear imaging transformation (S/O correction) to the registration problem of FIG. 43b.

A measurement of the registration change after the CDC and the APO correction writing map has been written in the mask substrate results in a registration change of (3σ numerical value) 15.1 nm for the x direction and 65.0 nm for the y direction (FIG. 43b). After performing a linear imaging transformation (S/O correction), the remaining registration changes are 1.45 nm for the x direction and 2.31 nm for the y direction (FIG. 43c). This data shows an improvement of 67% of the registration changes induced by the CDC task of FIG. 40a.

The next example demonstrates the application of the multi-mode CDC writing which gives the required magnitude of the optical attenuation and which simultaneously minimizes a registration degradation introduced by the CD correction. To simplify the following estimations, only two writing modes are applied for the optimization of the registration change.

The example for the test CDC task of FIG. 30 is again used. The resulting registration change in the active area of the photolithographic mask is presented in FIG. 33a. From this Figure, it is noted that the residual registration change after performing a linear imaging transformation for an S/O correction is not symmetric. In the x direction the registration error (3σ numerical value) is 2.1 nm, whereas it is 6.2 nm in the y direction. In this extreme case, the selected writing mode generates a much higher expansion in the y direction compared to the x direction. Similar to the part "registration problems", the resulting degradation is now minimized by writing one half of the pixels using a standard mask orientation, and then rotate the photolithographic mask by 90° in order to write the remaining second half of the pixels with this mask orientation. By using the above introduced terminology, this situation can be expressed by saying that the first half of the pixels are written with a 0° mode signature and the second half of the pixels are written with a 90° mode signature.

Figure 44A:
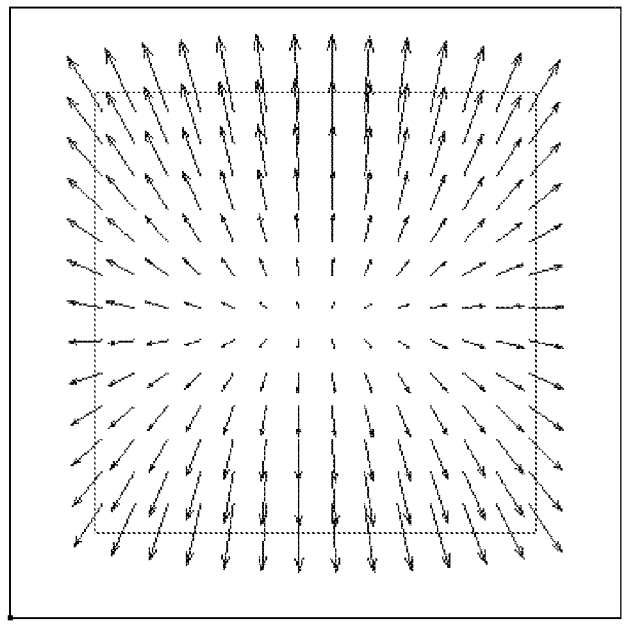
FIG. 44a schematically depicts the registration change induced by the test CD correction map of FIG. 30 where a first half of the pixels are written using a 0° mode signature.
Figure 44B:
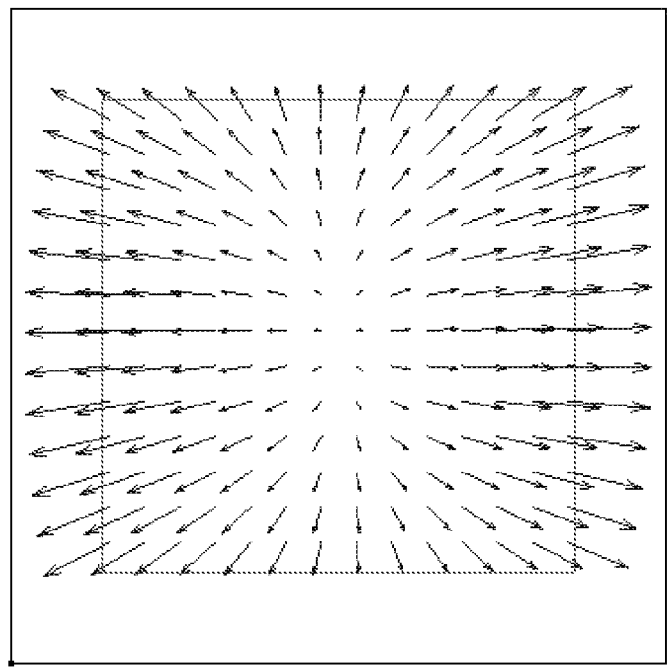
FIG. 44b schematically depicts the registration change induced by the test CD correction map of FIG. 30 where a second half of the pixels are written using a 90° mode signature.

FIG. 44a shows the registration change induced when half of the pixels of the test CDC writing map are written using the laser beam 335 with a 0° mode signature, and FIG. 44b depicts the registration change induced when half of the pixels of the test CDC writing map are written using the laser beam 335 with a 90° mode signature. FIGS. 44a and 44b show a predictable result. Every mode having its own mode signature generates the same displacements, but FIG. 44b is rotated by 90° with respect to FIG. 44a. The pictures in FIGS. 44a and 44b do not look perfectly identical due to the fact that the selected grid was asymmetric with respect to the x and the y direction. A better result is expected after writing of the full CDC task split into two writing modes.

Figure 45A:
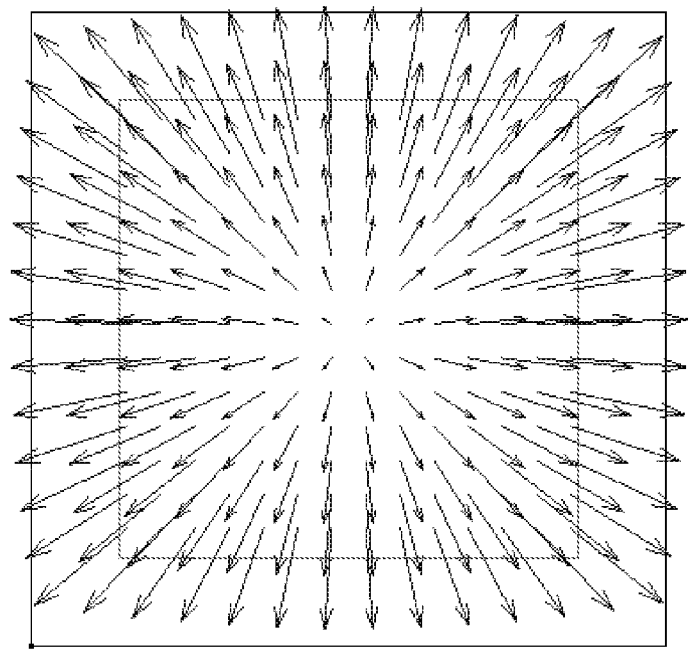
FIG. 45a schematically shows the registration change induced by the test CD correction map of FIG. 30 where a first half of the pixels are written using a 0° mode signature and a second half of the pixels are written using a 90° mode signature.
Figure 45B:
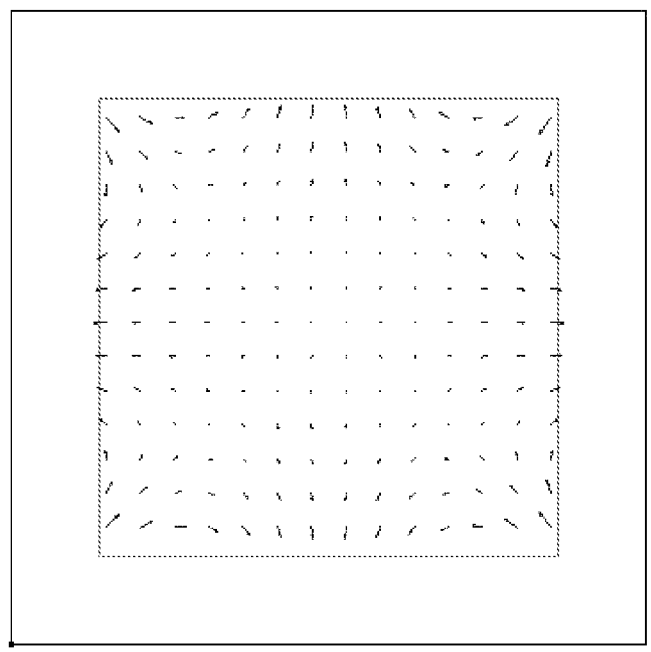
FIG. 45b schematically indicates the remaining registration change of the test CD correction map of FIG. 45a after performing a linear image transformation.

FIG. 45a shows the registration change induced by the test CDC writing of FIG. 30, where a first half of the pixels is written using a 0° mode signature and a second half of the pixels is written using a 90° mode signature. FIG. 45b depicts the remaining registration change after a linear imaging transformation is performed for the S/O correction.

The remaining registration change in FIG. 45b is less than that in FIG. 34b. The residual displacements (3σ numerical value) are 2.9 nm for the x direction and 3.0 nm for the y direction. As it is expected, there is an improvement by a factor of 2 compared to the CD correction using a single writing mode as is discussed in the previous page. The small remaining asymmetry is a result of the asymmetrically selected grid.

In the example of FIG. 44, the split between the two writing modes was 50:50. In the following the optimal split between the writing modes for the CD correction with the 0° and 90° mode signatures is computed in order to obtain the minimal effect of the CD correction on the induced registration change. The extension of equation 47 for the application of two writing modes is:

$$\zeta_i^{cdc} = \sum_j \Phi_{ij}^{cdc00} a_j^{cdc00} + \sum_j \Phi_{ij}^{cdc90} a_j^{cdc90} \quad (50)$$

The constraint, to obtain in every element area α the requested CDC writing density, is expressed by the equation:

$$a_j^{cdc00} + a_j^{cdc90} = a_j^{cdc} \quad (51)$$

The resulting displacement of equation 50 and the density condition of equation 51 lead to a target functional of the form:

$$\min\left\{ \sum_i \left( \sum_j (\Phi_{ij}^{cdc00} - \Phi_{ij}^{cdc90}) a_j^{cdc00} + \sum_j \Phi_{ij}^{cdc90} a_j^{cdc} + \sum_j T_{ij} s_j \right)^2 + + \lambda^s \sum_k s_k^2 + \lambda^a \left( \sum_k (a_k^{cdc00^2} + (a_k^{cdc} - a_k^{cdc00})^2) \right) \right\} \quad (52)$$

Figure 46A:
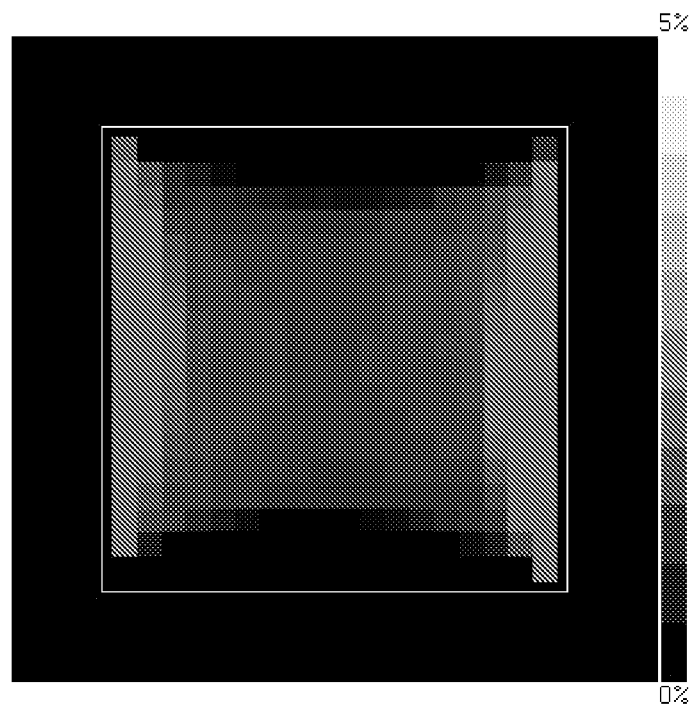
FIG. 46a shows the CD correction writing map for the test CDC writing map of FIG. 30 for the writing mode having a 0° mode signature.
Figure 46B:
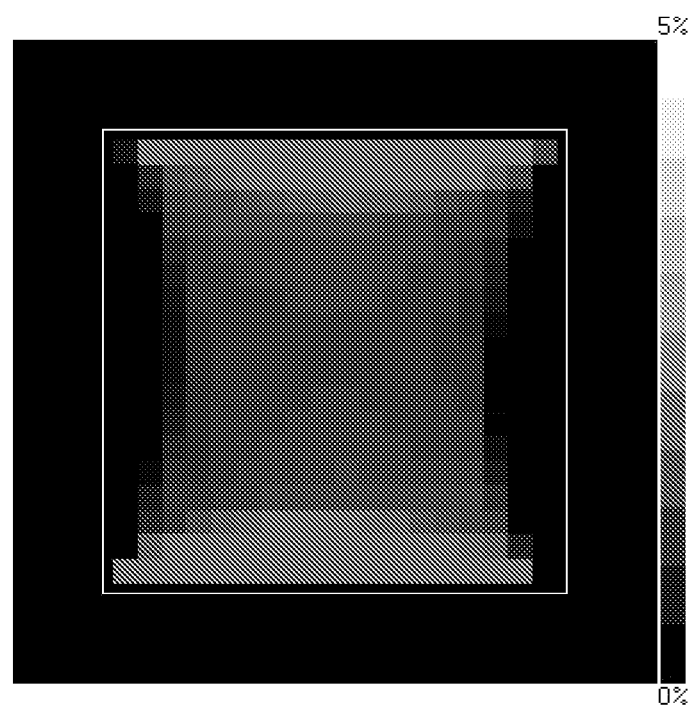
FIG. 46b represents the CD correction writing map for the test CDC writing map of FIG. 30 for the writing mode having a 90° mode signature.
Figure 47A:
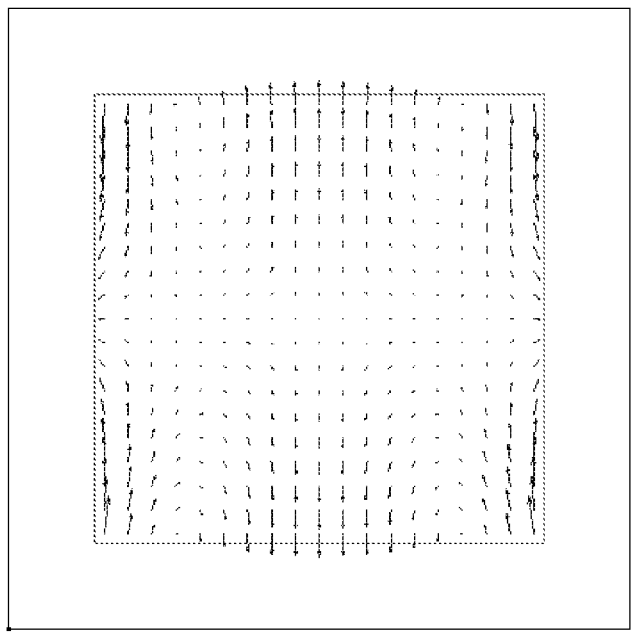
Figure 47B:
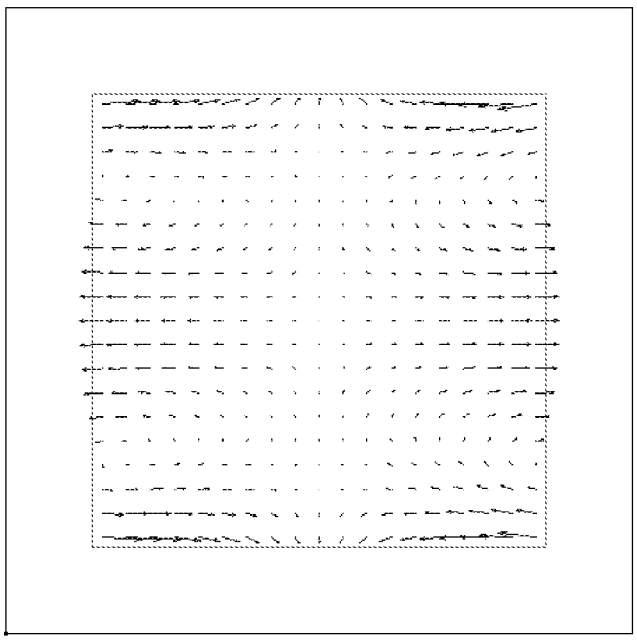
FIG. 47b schematically depicts the registration change induced by the CD correction writing map of FIG. 46b.

The optimization of the target function of equation 52 gives a very interesting solution. The CD correction writing map for the writing mode having the 0° mode signature is represented in FIG. 46a. FIG. 46b shows the CD correction writing map for the writing mode having the 90° mode signature. The resulting registration change induced by the CD correction writing map of FIG. 46a is depicted in FIG. 47a, whereas FIG. 47b presents this result for the CD correction writing map of FIG. 46b.

Figure 48A:
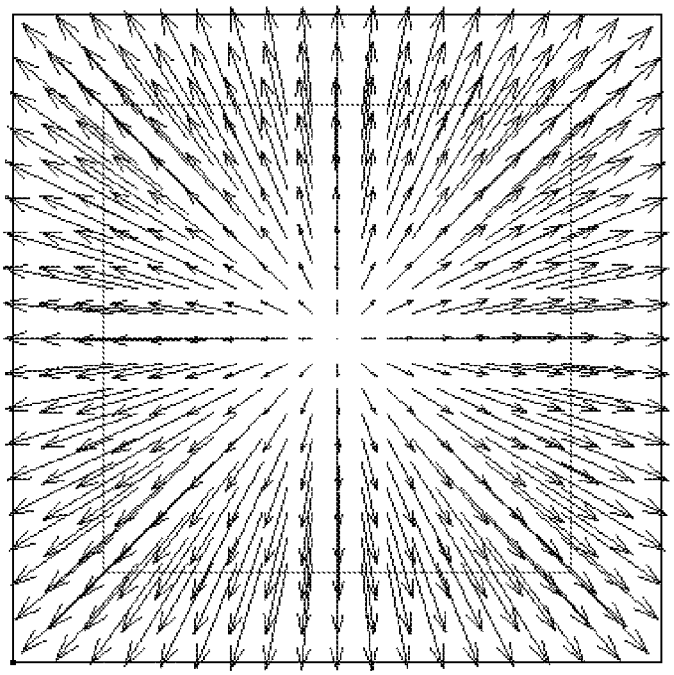
FIG. 48a schematically shows the registration change induced by the combined CD correction writing maps of FIGS. 46a and 46b.
Figure 48B:
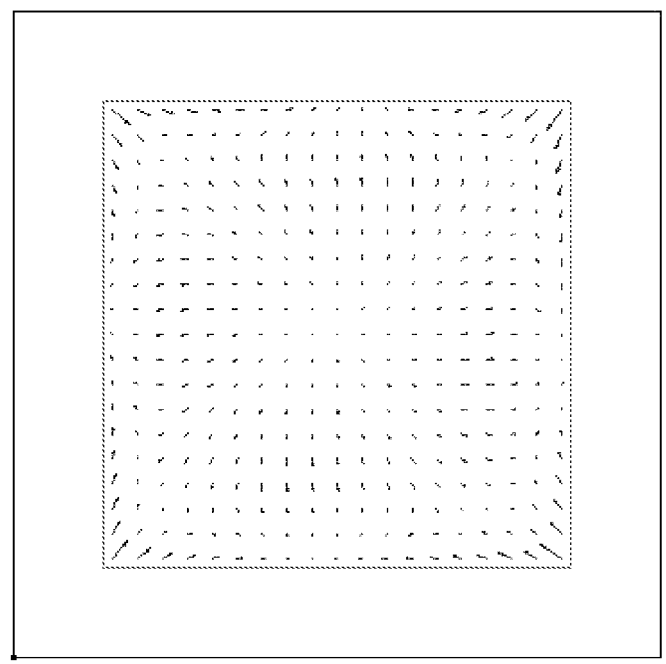
FIG. 48b schematically depicts the residual registration change of FIG. 48a after performing a linear imaging transformation.

The computed combined registration change is presented in FIG. 48a; and FIG. 48b represents the remaining registration change after performing a linear imaging transformation for the S/O correaction. The residual displacements in FIG. 48b (3σ numerical value) are 2.3 nm for the x direction and 2.3 nm for the y direction. This result is 33% better than a simple 50:50 split of the two writing modes.

It can be summarized that an optimal split into two writing modes having a 0° and a 90° mode signature enables reduction of the degradation of the registration by a factor of 3 compared to the regular CDC writing. On the other hand, this approach has approximately the same throughput as the regular CDC writing.

Further, it has to be noticed that all of the improvement is actually resulting from the asymmetry of the writing mode signature. Thus, the improvement can be much less if the writing mode signature is symmetric. Typically a normal CD correction has an asymmetric mode signature, and thus allows the application of the above discussed split into two writing modes with a 0° and a 90° mode signature. In fact, the result is actually broader than presented above. The CDC process can be split into a different pair of the writing modes. The presented example has been selected in order to just illustrate the underlying principle.

In the next example, the approach discussed by means of the previous example is now applied to the CDC problem of FIG. 38a. The improvement achievable due to an optimal split into two writing modes with a 0° and a 90° mode signature will be investigated.

Figure 49A:
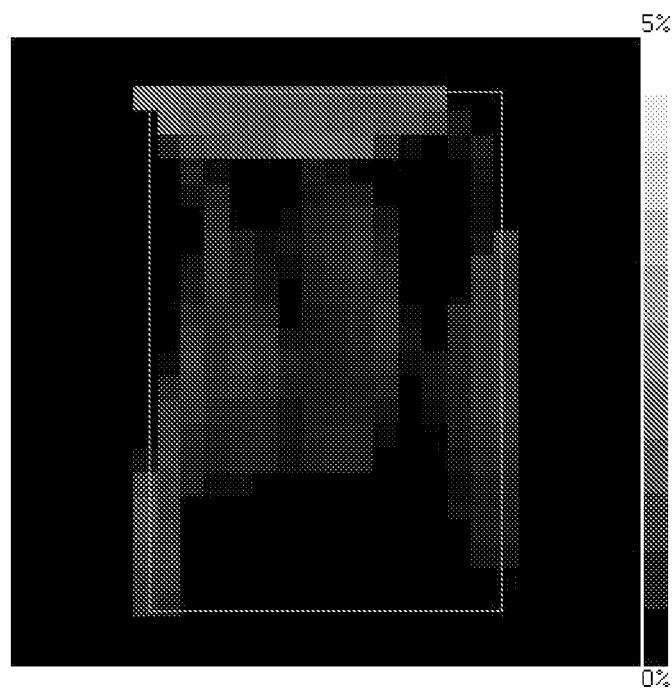
FIG. 49a represents the CD correction writing map for the CDC problem of FIG. 38a for the writing mode with the 0° mode signature.
Figure 49B:
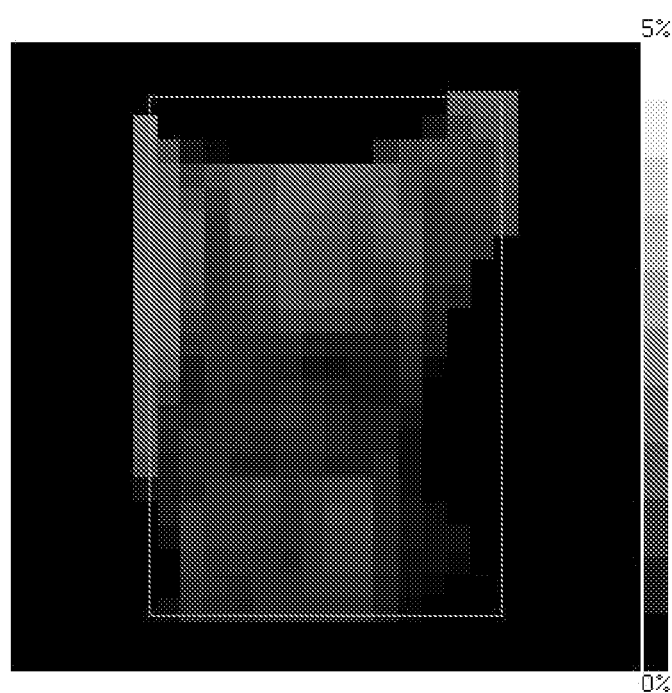
FIG. 49b represents the CD correction writing map for the CDC problem of FIG. 38a for the writing mode with the 90° mode signature.

FIG. 49a shows the CD correction writing map for the writing mode with the 0° mode signature for the CDC problem of FIG. 38a, and FIG. 49b presents the CD correction writing map for the writing mode with the 90° mode signature again for the CDC problem of FIG. 38a. The correction writing maps for both Figures have been calculated by minimizing the target functional of equation 52.

Figure 50A:
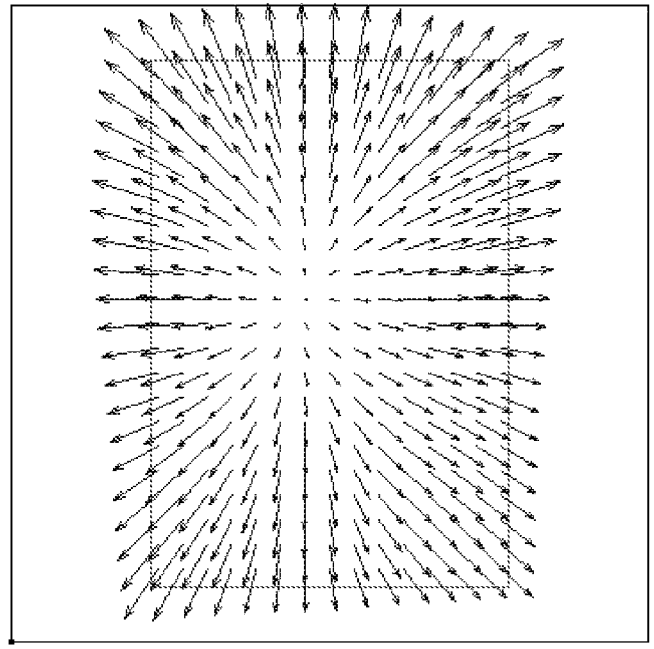
FIG. 50a schematically shows the registration change induced by the combined CD correction writing maps of FIGS. 49a and 49b.
Figure 50B:
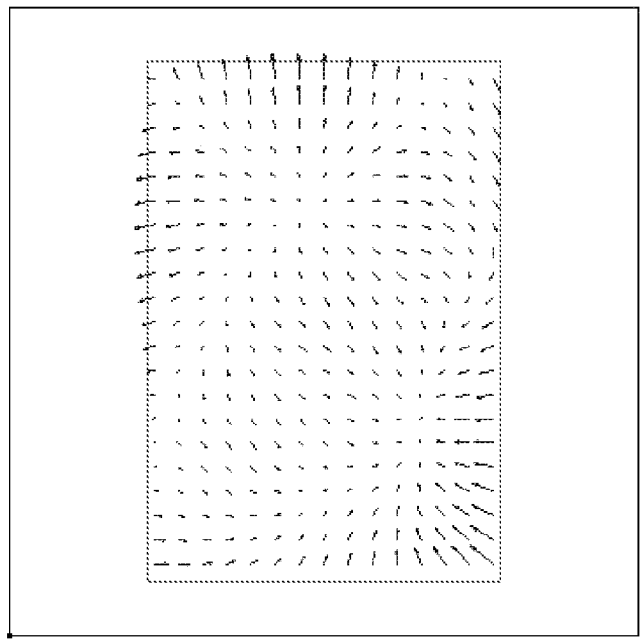
FIG. 50b schematically depicts the residual registration change of FIG. 50a after performing a linear imaging transformation.

FIG. 50a depicts the registration change induced by an optimal split between the two writing modes and FIG. 50a represents the residual registration change after performing a linear imaging transformation. The resulting induced registration change (3σ numerical value) is 18.2 nm for the x direction and 17.3 nm for the y direction. After performing a linear imaging transformation, the residual registration change amounts to 4.1 nm for the x direction and 3.8 nm for the y direction. Thus, by splitting the CDC writing task into two different writing modes the remaining registration change can be reduced by almost a factor of 4 with respect to performing the CD correction with a single writing mode.

In the following, the CDC problem of FIG. 38a is again solved using now a different set of the writing modes. As already discussed in the previous part "registration problems", different pulse energies lead to different mode signatures of the laser beam 335. The different mode signatures mainly differ in their induced deformation magnitude. When performing a CDC task having a minimum registration change, typically the so-called LowReg writing mode is used. The Low-Reg writing mode typically leads to an expansion of the mask substrate which is a factor of two to four smaller than when using the regular writing mode, but results in the same CDC shading. The throughput for the LowReg writing mode is much lower, and thus a compromise has to be found between the required productivity, on the one hand, and the admitted level of the registration change, on the other hand. In the following, it will be shown that a double mode combination can provide an even better result.

Figure 51A:
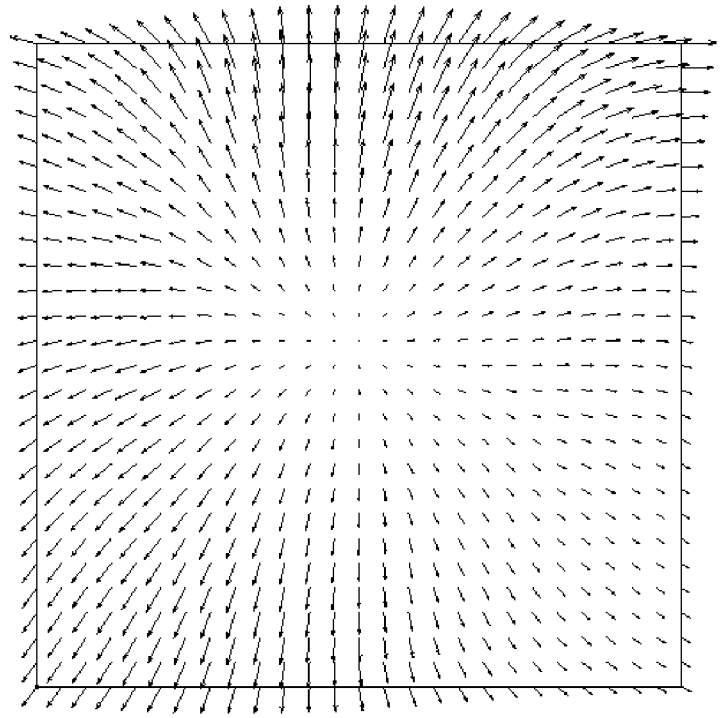
FIG. 51a schematically shows the registration change induced by using a LowReg (low registration) writing mode.
Figure 51B:
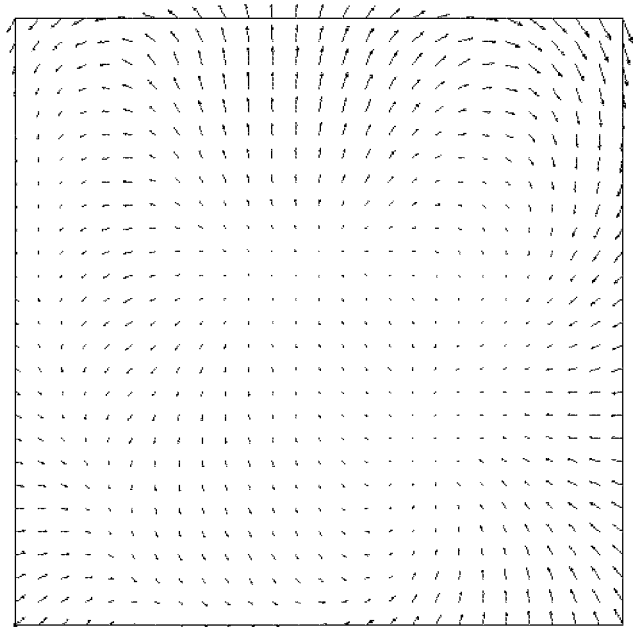
FIG. 51b schematically depicts the residual registration change of FIG. 51a after performing a linear imaging transformation.

FIG. 51a shows the registration change which is induced when the overall CD correction is performed by using the LowReg writing mode. FIG. 51b depicts the remaining registration change after a linear imaging transformation has been performed. The resulting registration change is less than the one which results from a standard PW (process window). The registration change is determined to be 9.6 nm for the x direction and 11.1 nm for the y direction and after performing a linear imaging transformation (S/O correction), a residual registration error remains of 3.7 nm for the x direction and 4.9 nm for the y direction. This is about two times less than for the standard PW. An optimal split similar of equation 52 is defined by the following target functional:

$$\min\left\{ \sum_i \left( \sum_j (\Phi_{ij}^{std} - \Phi_{ij}^{le}) a_j^{std} + \sum_j \Phi_{ij}^{le} a_j^{cdc} + \sum_j T_{ij} s_j \right)^2 + + \lambda^s \sum_k s_k^2 + \lambda^a \left( \sum_k (a_k^{std^2} + (a_k^{cdc} - a_k^{std})^2) \right) \right\} \quad (53)$$

The operators $\Phi_{ij}^{std}$, $\Phi_{ij}^{le}$ and the amplitudes $a_j^{std}$, $a_j^{le}$ denote equation components for the standard (or regular)

and the LowReg PW, respectively. The parameters of the laser beam for the standard and the LowReg PW are given in Tables 2 and 3.

Figure 52A:
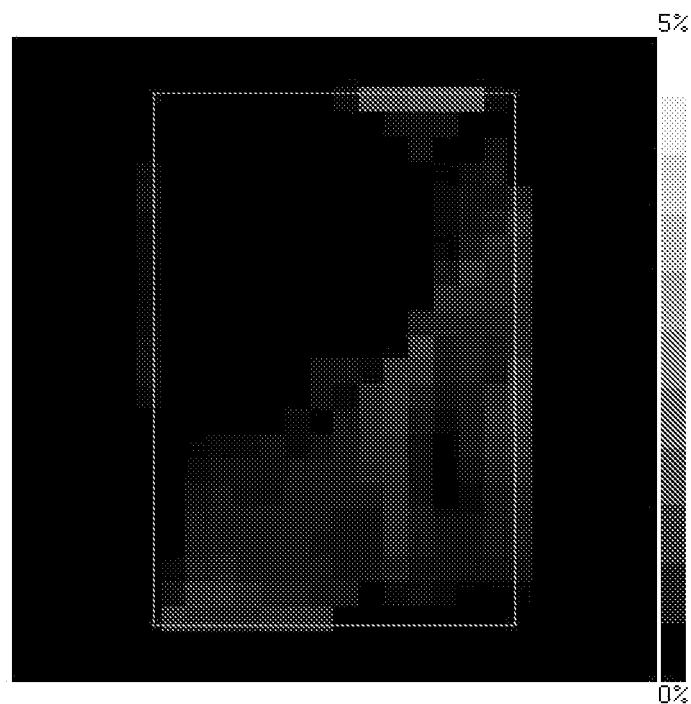
FIG. 52a presents the CD correction writing map for the CDC problem of FIG. 38a for the standard or regular writing mode.
Figure 52B:
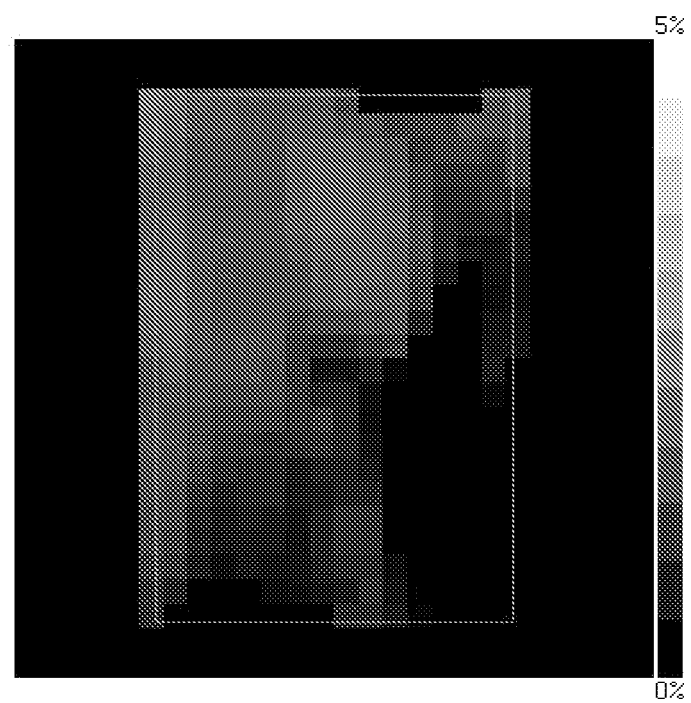
FIG. 52b shows the CD correction writing map for the CDC problem of FIG. 38a for the Low-Reg writing mode.

FIG. 52 presents the solution of equation 53 for the CDC problem of FIG. 38a split in the standard or regular writing mode and the LowReg writing mode. FIG. 52a shows the CD correction writing map for the standard or regular writing mode, and FIG. 52b shows the CD correction writing map for the LowReg writing mode.

After performing a linear imaging transformation, the optimized split among the two writing modes results in a residual registration error of 1.4 nm for the x direction and 1.6 nm for the y direction. This error is 60% smaller than the residual registration error when simply using a LowReg writing mode. Considering the fact of the higher throughput for the standard writing mode, it is even possible to obtain some increase of the overall productivity of the CD correction process when using a combination of the standard and the LowReg writing modes. This example clearly demonstrates that the application of a standard writing mode and a LowReg writing mode is also a powerful tool in order to control the induced registration change. It can be used when a CDC task requires a very low change of the registration.

In a third approach, an example for a combination of a smart apodization and a safe CDC will now be presented. A simple implementation of the smart apodization procedure over a safe CDC procedure can give some improvement. However, an optimization of the split of the CDC writing task and the writing of pixels in the non-active area allows achieving a better result. It is clear that a split into a standard writing mode and a LowReg writing mode is not optimal for the writing in the non-active area. However, this selection is made in order to keep the computational effort low, and also to be able to compare the obtained results to previous results. From the most generic point of view, it is necessary to find amplitudes for the writing in the non-active area of the photolithographic mask and to split them in proportion to the active area of the mask in order to minimize the residual registration change.

The extension of equation 53 for this approach leads to the following target functional:

$$\min\left\{\sum_i\left(\sum_j(\Phi_{ij}^{std}-\Phi_{ij}^{le})a_j^{std}+\sum_j\Phi_{ij}^{le}a_j^{cdc}+\sum_j\Phi_{ij}^{apo}a_j^{apo}+\right.\right.$$
$$\left.\left.\sum_j T_{ij}s_j\right)^2 ++\lambda^s\sum_k s_k^2+\lambda^a\left(\sum_k\left(a_k^{std^2}+(a_k^{cdc}-a_k^{std})^2+a_k^{apo^2}\right)\right)\right\} \quad (54)$$

Figure 53A:
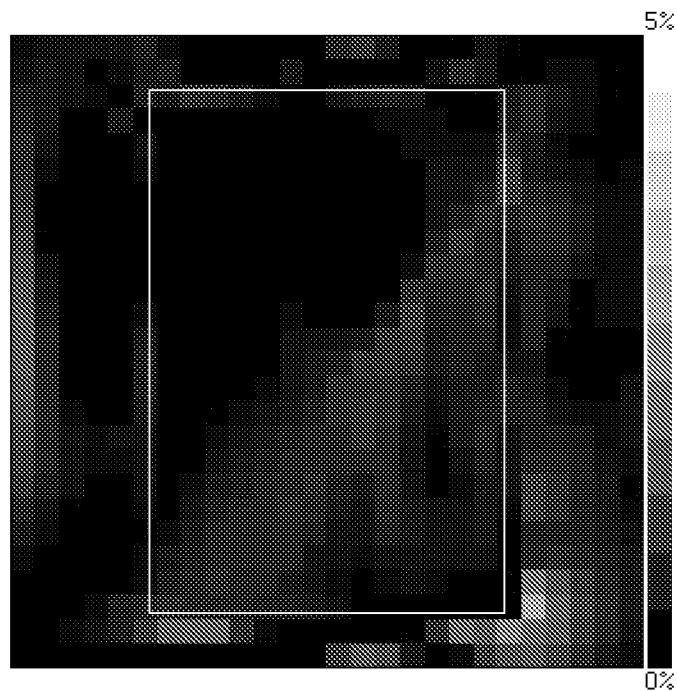
FIG. 53a presents the CD correction writing map for the CDC problem of FIG. 38a for the standard or regular writing mode.
Figure 53B:
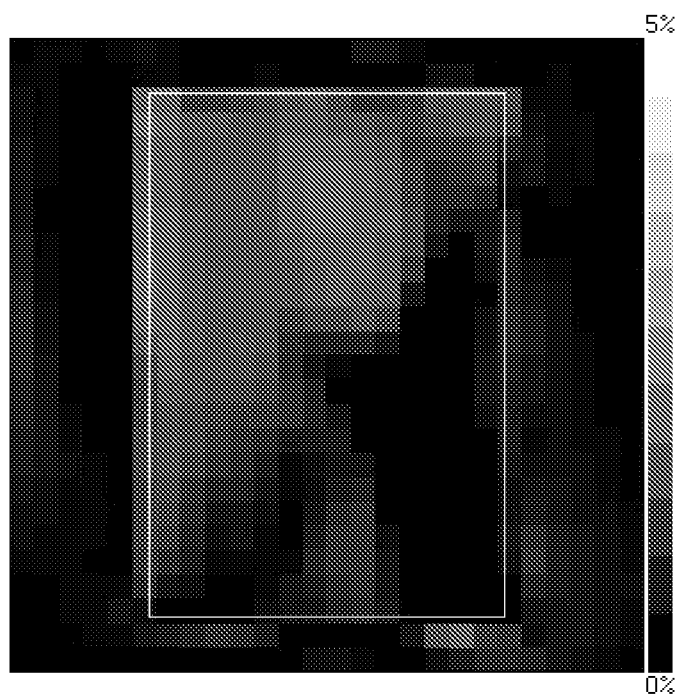
FIG. 53b represents the CD correction writing map for the CDC problem of FIG. 38a for the LowReg writing mode.

As an example for this approach, the CDC problem of FIG. 38a is again used for the optimization of equation 54. FIG. 53 presents the obtained split of the writing modes. FIG. 53a shows the CD correction writing map for the standard or regular writing mode, whereas FIG. 53b depicts the CD correction writing map for the LowReg writing mode. This split of the writing modes theoretically allows obtaining a resulting registration change (3σ numerical value) as small as 0.36 nm for the x direction and 0.38 nm for the y direction.

This is a perfect achievement and practically does not induce any registration change. The results for the CDC problem of FIG. 38a obtained from all the different approaches discussed above are summarized in the following table.

TABLE 7

Residual registration change for the CDC problem of FIG. 38a for different correction approaches

|  | X [nm] | Y [nm] | Improvement |
|---|---|---|---|
| Std. PW (standard process window) | 4.6 | 8.4 |  |
| Smart apodization | 3.2 | 3.5 | 55% |
| Std. PW split in 0°-90° mode signatures | 4.1 | 3.8 | 45% |
| LowReg PW (low registration) | 3.7 | 4.9 | 40% |
| Split LowReg PW and Std. PW | 1.4 | 1.6 | 80% |
| Smart CDC (critical dimension correction) | 0.36 | 0.38 | 95% |

Table 7 shows that the smart apodization, the task split into two writing modes, and LowReg PW result in about the same advantage. The split into two rotated writing modes is more time effective. The smart CDC process provides the highest improvement and practically does not induce any new or additional registration change.

The person skilled in the art will appreciate that the application of the inventive method is not limited to the above discussed CDU problems. Rather, the presented examples are only intended to demonstrate some of the various aspects of the inventive principle in view of CDU problems of photolithographic masks. In particular, it has to be stressed that the above separation in registration problems and CDU problems is arbitrary and that the inventive method can be applied in order to simultaneously correct both types of errors of photolithographic masks.

Overlay Problems

Finally, the inventive method can also be applied for the correction of overlay problems. As already mentioned in the second part of this specification, very often the absolute design location of the pattern elements of a photolithographic mask is not as important as a relative location of the pattern elements on adjacent layers, through a stack of the layers or on the same layer, but printed from two or more different photolithographic masks. It is also relevant for pattern elements printed using a double patterning approach.

The overlay correction approach is illustrated by just using two different photolithographic masks which are in the following called mask B and mask C. It will be appreciated that the discussed approach can also be applied for the correction of overlay errors of more than two photolithographic masks.

Figure 54A:
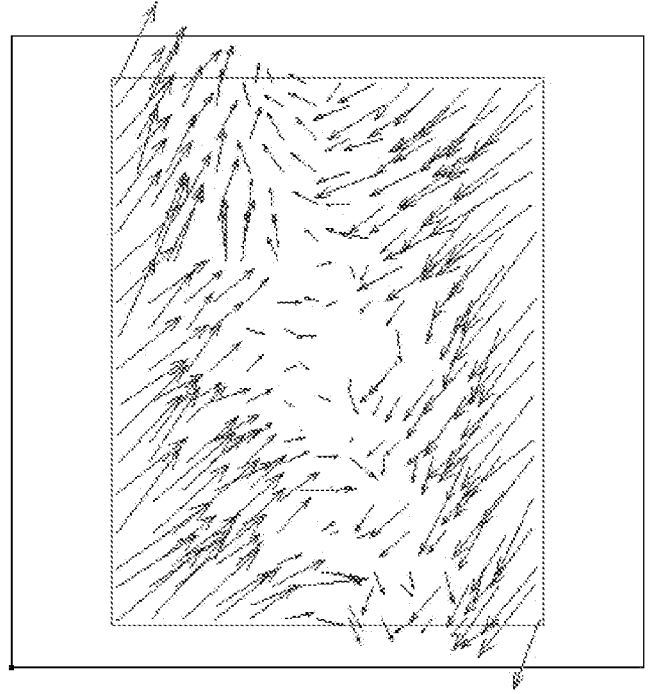
FIG. 54a schematically presents the initial registration problem of mask B.
Figure 54B:
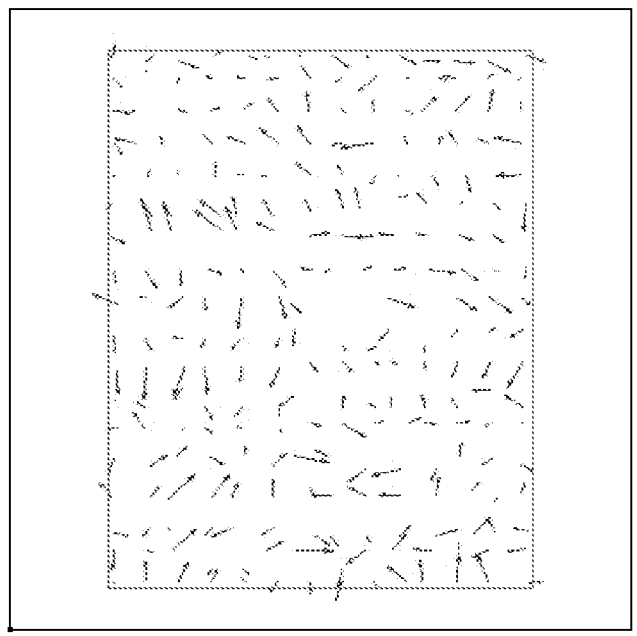
FIG. 54b schematically depicts the residual registration problem of mask B of FIG. 54a after performing of a linear imaging transformation.

FIG. 54a presents the initial registration problem of mask B, and FIG. 54b depicts the residual registration problem of FIG. 54a after performing a linear imaging transformation. The initial X/Y specification for mask B of FIG. 54a is 6.59 nm.

Figure 55A:
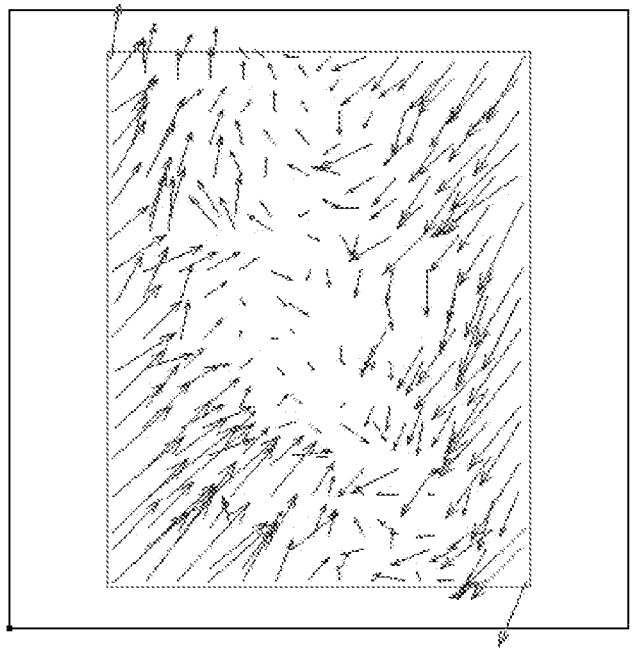
FIG. 55a schematically presents the initial registration problem of mask C.
Figure 55B:
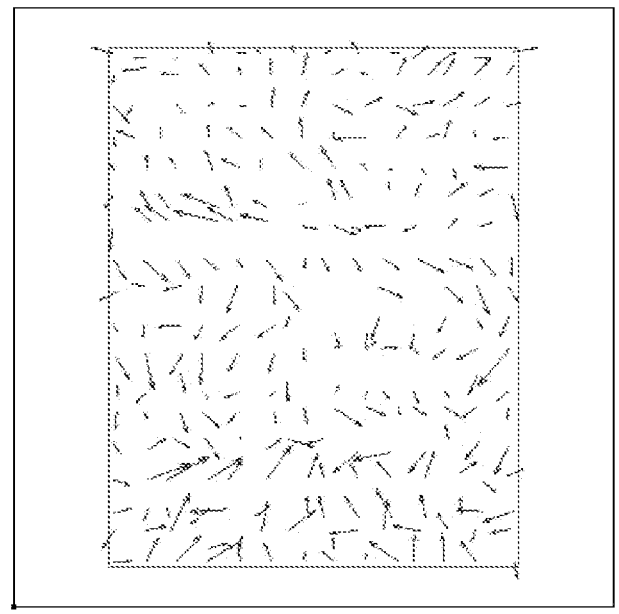
FIG. 55b schematically depicts the residual registration problem of mask C of FIG. 55a after performing of a linear imaging transformation.

FIG. 55a shows the initial registration problem of mask C, and FIG. 55b illustrates the residual registration problem of FIG. 55a after performing a linear imaging transformation. The initial X/Y specification for mask C of FIG. 55a is 8.52 nm.

From FIGS. 54 and 55 it can be seen that the initial registration problem of masks B (FIG. 54) and C (FIG. 55) look very similar. The execution of a linear imaging transformation for S/O correction reduces this similarity of the underlying registration problems. However, FIGS. 54b and 55b still show a similar behavior.

Figure 56:
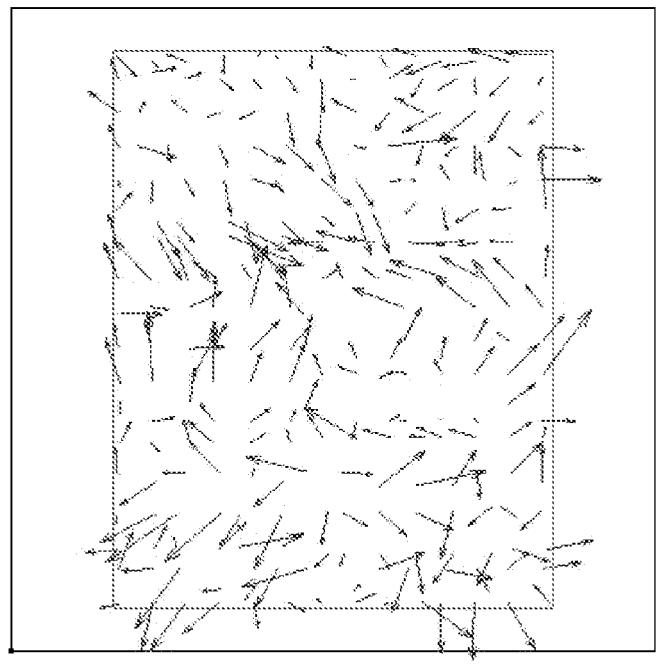

FIG. 56 presents the initial overlay problem of masks B and C. The initial X/Y specification for the overlay error of masks B and C is 14.03 nm. This large value of the overlay problem indicates the fact that there is a serious mismatch between mask B and mask C. The residual significant difference has to be corrected.

Figure 57A:
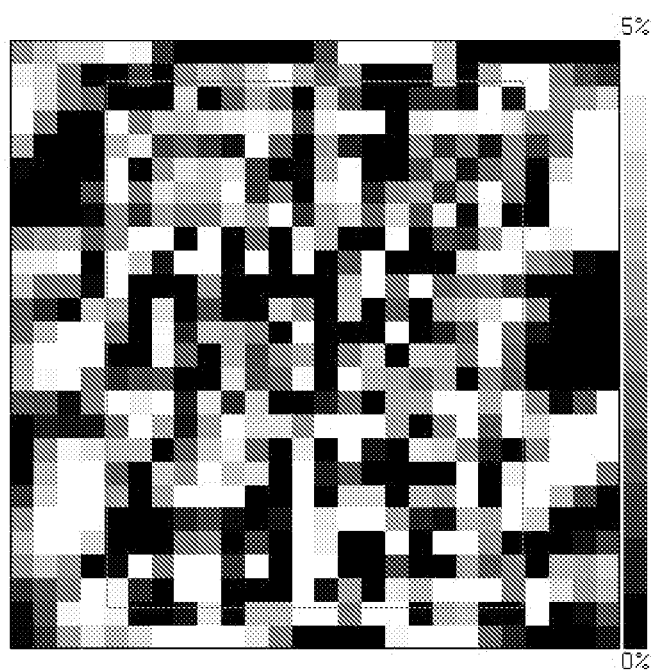
FIG. 57a shows the computed correction writing map for mask B.
Figure 57B:
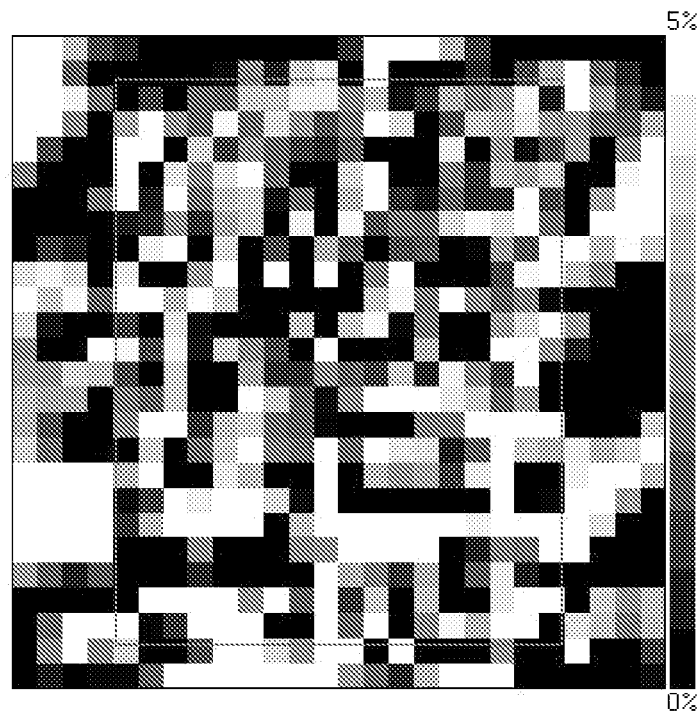
FIG. 57b depicts the computed correction writing map for mask C.
Figure 58:
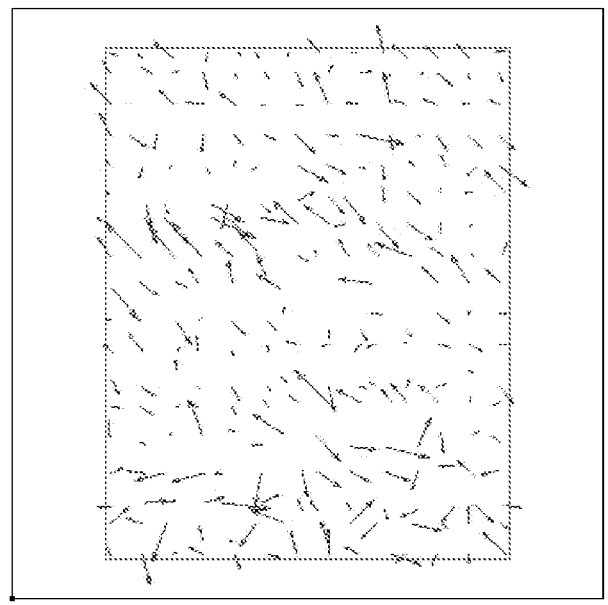
FIG. 58 schematically shows the resulting overlay errors of mask B and mask C after performing a linear imaging transformation.

In order to obtain the best possible correction for both masks, the mode target functional for a single writing mode (equation 40) will be minimized. FIG. 57a shows the computed correction writing map for mask B, and FIG. 57b presents the computed correction writing map for mask C. The mean writing density or the mean attenuation of the optical intensity of the correction writing maps presented in FIG. 57a is 2.35% for mask B and is 2.65% for mask C depicted in FIG. 57b. The resulting residual X/Y specification for mask B amounts to 4.33 nm and for mask C to 5.28 nm.

However, this is not the parameter determining the overlay problem between mask B and mask C. For this purpose, it is necessary to know the X/Y specification of the overlay of mask B and mask C or their registration difference.

The resulting overlay X/Y specification of masks B and C is 8.83 nm which is better than the XY specifications of the individual masks. However, this numerical value is still too large and needs to be improved.

It is now the objective to find a correction writing map which will specifically improve the overlay between masks B and C. This means that it is not the target to bring mask B to the best match with a predetermined design, but to achieve the best match with mask C.

Figure 59:
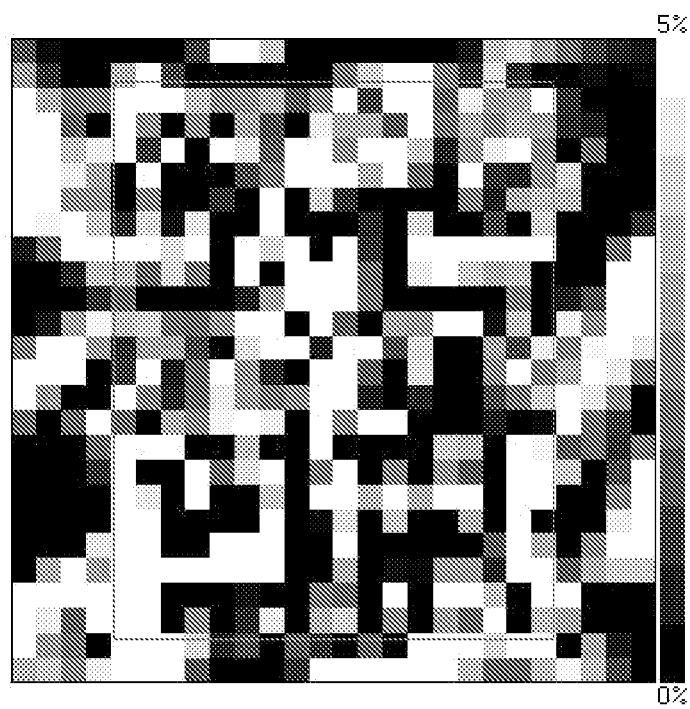
FIG. 59 presents the computed correction writing map to improve the overlay between mask B and mask C.
Figure 60:
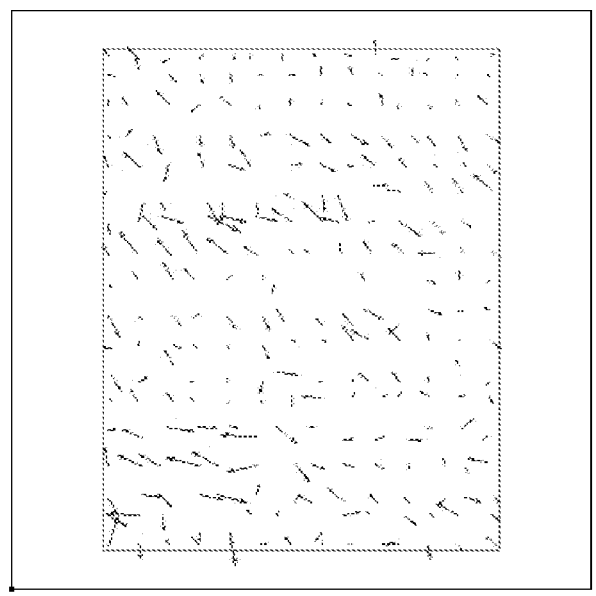
FIG. 60 schematically depicts the remaining overlay error after mask B has been optimized with respect to mask C.

FIG. 59 presents the calculated correction writing map to improve the overlay between mask B and mask C. The mean value of the attenuation by the writing density is 2.34% which is approximately half of the writing density required to correct the registration errors of mask B (FIG. 57a) as well as of mask C (FIG. 57b). The resulting 2D map of the remaining overlay errors when mask B is optimized with respect to mask C is shown in FIG. 60. The resulting residual overlay error of FIG. 60 has an X/Y specification of 6.53 nm. This result is 26% better than when individually correcting the registration errors in mask B (FIG. 57a) and in mask C (FIG. 57b).

In the above approach the correction capabilities of mask C have not been used up to now. Mathematically the overlay is the difference of the registration of masks B and C. So whatever deformations mask B and mask C are inducing, only the difference of the deformations between both masks is relevant. At a first glance, it looks like if it is not possible to benefit from the ability to write pixels into the substrates of both photolithographic masks. However, there is a physical constraint which has to be considered at the formulation of the problem. It is not possible to write pixels with a negative writing density or to improve the optical transmission of the photolithographic mask when writing pixels in its substrate. This statement means that it is possible to solve the target functional of equation 41 by using the following constraint instead of the constraint expressed by equation 40:

$$-a < a_l^m < a \quad (55)$$

The solution resulting for the optimal correction writing map has to be split into two different maps. The first one, which is the positive part of the optimal correction writing map, forms the correction writing map for mask B, and the second one, which is the negative part of the map, forms the correction writing map for mask C.

Figure 61A:
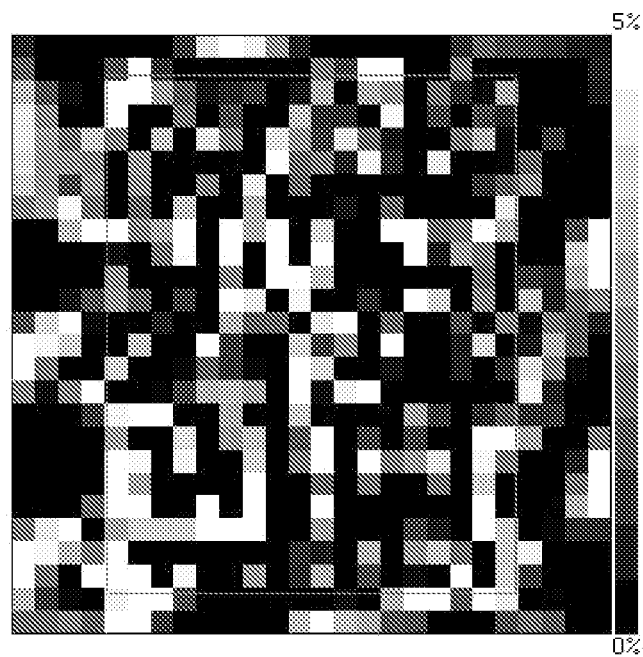
FIG. 61a shows the computed overlay correction writing map for mask B.
Figure 61B:
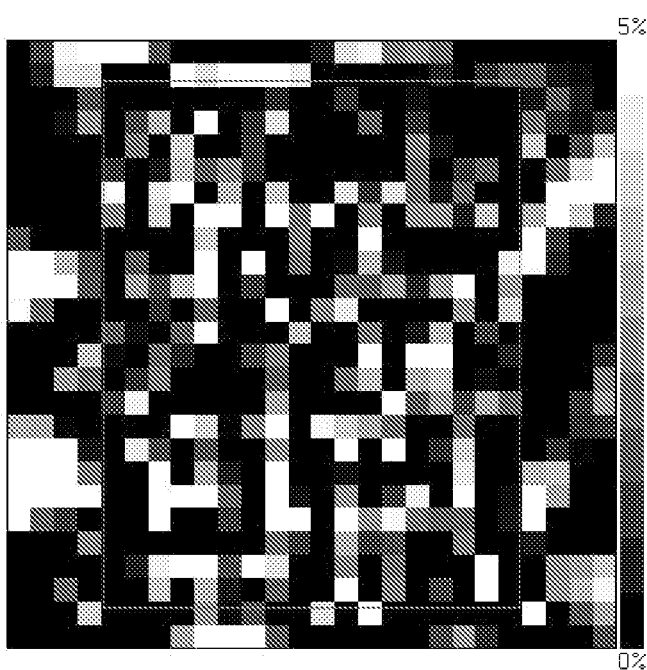
FIG. 61b depicts the computed overlay correction writing map for mask C.

FIG. 61a shows the calculated overlay correction writing map for mask B realizing the positive part of the writing density amplitudes $a_l^m$, and FIG. 61b represents the calculated overlay correction writing map for mask C realizing the negative part of the writing density amplitudes $a_l^m$.

Figure 62:
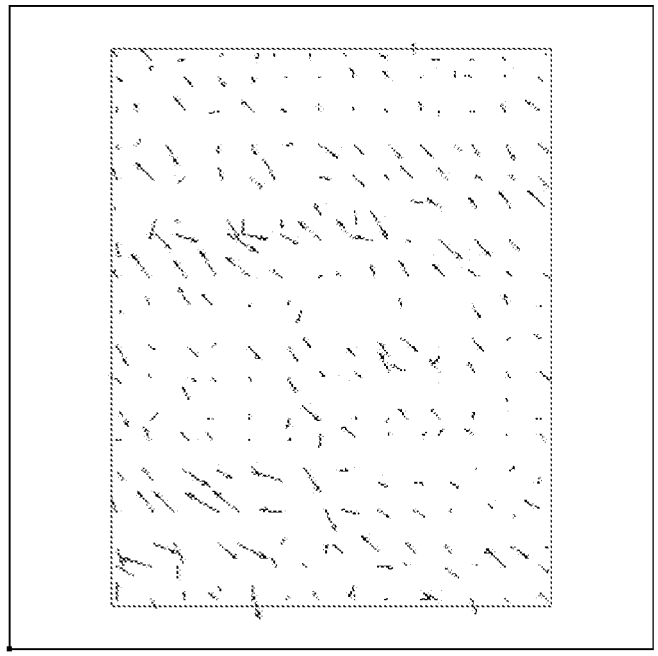
FIG. 62 schematically represents the simulated residual overlay errors of masks B and C after performing of a linear imaging transformation.

The simulated resulting residual overlay error after performing a linear imaging transformation is presented in FIG. 62. The estimation of the resulting error for the overlay X/Y specification (3σ numerical value) is 5.5 nm which is 16% better than the result of the correction process presented in FIG. 60.

The following statements summarize this part: The initial overlay problem is 14.03 nm, after individually correcting mask B and mask C with respect to the design location, a residual overlay problem remains of 8.83 nm (approach 1). The correction of mask C targeted for a best overlay with mask B results in an overlay error of 6.53 nm (approach 2). Finally, after a correction of both masks the remaining overlay error reduces to 5.5 nm (approach 3).

It is clear that the approach 2 is better than approach 1 because it may occur that different photolithographic masks may have similar non-correctable parts of the registration problem, as for example electron-beam writer fingerprints. The approach 3 is even more effective because correactions are performed on both photolithographic masks in order to fulfill the common overlay target.

Figure 63:
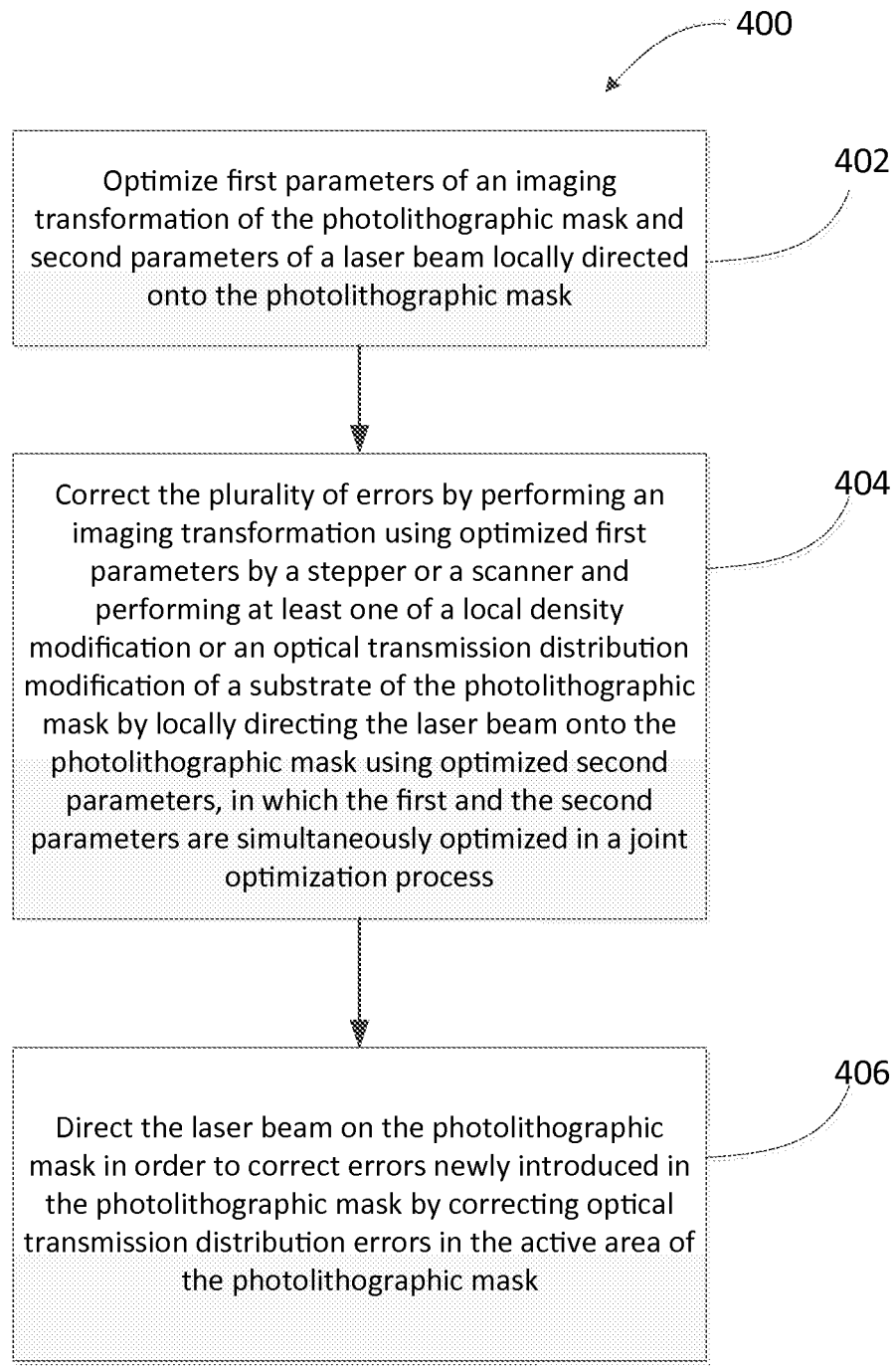
FIG. 63 is a flow diagram of a process for correcting a plurality of errors of a photolithograghic mask.

FIG. 63 is a flow diagram of a process 400 for correcting a plurality of errors of a photolithographic mask. The process 400 includes optimizing first parameters of a imaging transformation of the photolithographic mask and second parameters of a laser baem locally directed onto the photolithographic mask (402). The process 400 includes correcting the plurality of errors by performing an imaging transformation using optimized first parameters by a stepper or a scanner and performing at least one of a local density modification or a optical transmission distribution modification of a substrate of the photolithographic mask by locally directing the laser beam onto the photolithographic mask using optimized second parameters, in which the first and the second parameters are simultaneously optimized in a joint optimization process (404). The process 400 further includes directing the laser beam on the photolithographic mask in order to correct errors newly introduced in the photolithographic mask by correcting optical transmission distribution errors in the active area of the photolithographic mask (406).

Figure 64:
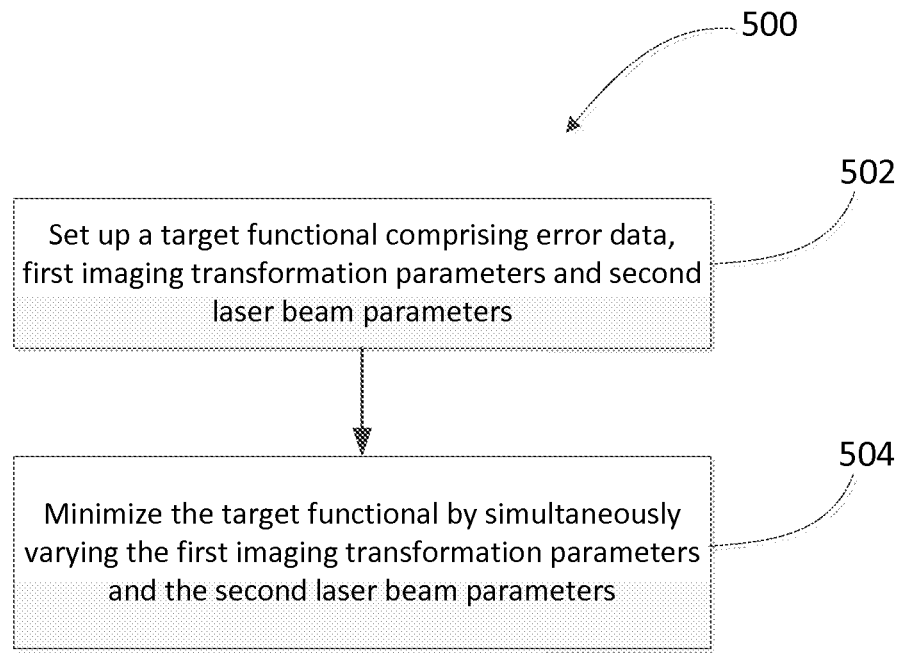
FIG. 64 is a flow diagram of a joint optimization process.

FIG. 64 is a flow diagram of a joint optimization process 500. The process 500 includes setting up a target functional comprising error data, first imaging transformation parameters and second laser beam parameters (502). The process 500 further includes minimizing the target functional by simultaneously varying the first imaging transformation parameters and the second laser beam parameters (504).

In this section, the application of the inventive method to just a single, simple overlay problem is presented in order to illustrate the general principle. The person skilled in the art will appreciate that the inventive method is not restricted to the discussed example. Rather, the presented example is only intended to demonstrate the applicability of the inventive principle for the solution of this kind of problems of photolithographic masks.

THEORETICAL BACKGROUND

In the following, some of the theoretical background is outlined underlying the discussion of different aspects of the inventive method presented in the preceding section.

In order to correct registration errors of a photolithographic mask different kinds of pixels are used. The application of different kinds of pixels allows adjusting the relation between the attenuation or the variation of the optical transmission distribution and the shift of pattern elements on the substrate of the photolithographic mask by writing a certain kind of pixels. For example, it is possible to introduce pixels of different kinds in the substrate of the mask or simply expressed to write pixels of different kinds by introducing the same attenuation or variation of the optical transmission distribution, but having a different shift of the pattern elements on the first substrate surface or having a different registration change.

In general, as already outlined in the preceding section, pixels introduce stress into the substrate material, normally fused silica, of the photolithographic mask by locally changing the density of the substrate material. Expanding pixels and contracting pixels can be introduced into the substrate or can be written into the substrate by varying several parameters of the laser beam of the femtosecond laser source, such as pulse duration and/or pulse energy and/or repetition rate. By writing expanding pixels the density of the substrate material is reduced, whereas by writing contracting pixels the density of the substrate material is increased.

The different modes of writing are defined as the writing of pixels into the substrate of the photolithographic mask with different physical conditions resulting in different kinds of pixels with different properties and/or different shapes. Different writing modes can be performed by changing one or more of the following parameters:

(a) Laser beam pulse power: The pulse power of the light beam of the laser source changes the size of the pixels. Reducing the laser pulse energy results in smaller pixels. The effect of smaller pixels can be compensated by increasing the pixel density. Reducing the pixel size without changing the pixel density leads to a smaller shift of the pattern elements on the surface of the photolithographic mask. Actually, the minimum pulse energy is limited by the breakdown threshold of the substrate material of the photolithographic mask. By varying the pulse duration, the NA (numerical aperture) of the light beam and/or the beam divergence and the number of pulses incident to one location, the breakdown threshold of the substrate material can be controlled, and hence it is possible to decrease the pulse energy of the light pulses of the femtosecond laser system.

(b) Laser beam pixel density: The writing of a different linear pixel density in different directions parallel to the surface of the substrate of the photolithographic mask can result in a nonsymmetrical expansion of the mask substrate. This means that pixels are written with different linear pixel densities in different two perpendicular directions parallel to the surface of the mask, for example in x and y direction. This effect provides a useful tool for controlling the shift of the pattern elements on the mask substrate or for the registration control.

(c) Laser beam uniform density: Pixels can be written with a laser beam wherein a distance between neighboring pixels is much less than the individual pixel size. Thus, a quasi continuous structure is written into the mask substrate. For this kind of pixels, preferably a very low laser pulse power is used. The advantage of using such a kind of pixels is that they do not cause any registration change, but only changes the optical transmission of the substrate of the photolithographic mask. This structure having no visible pixels in the visible spectral range resembles more a layer in the bulk of the material with different physical properties. If this layer is homogeneous enough, it less affects UV or DUV beam properties, no scattering occurs, and the layer does not introduce any artificial periodicity and hence does not generate any diffraction effects. Directing the laser beam onto the photolithographic mask having such laser beam parameters is called pixel-less writing.

In order to reliably correct registration errors, the effects of the femtosecond light pulses having different parameters onto the substrate of the photolithographic mask has be known. For this purpose, the femtosecond light pulses having different parameters or the writing modes and the pixel densities of the laser beam have to be determined for the whole substrate of the photolithographic mask. To perform further calculations, the surface of the mask substrate is partitioned in arbitrary elements. Within one element or one elementary area pixels are written having a single writing mode and a single density.

The solution of the direct problem would compute the deformation resulting from the action of the laser beam, i.e. it would compute the registration change as a function of the writing mode and the pixel density or of the laser beam parameters. In order to determine the registration correaction to be applied, the inverse problem has to be solved. This means, it is the problem to compute a map of writing modes and writing densities or laser beam parameters that gives the desired change of the registration and/or the desired variation of the optical transmission distribution or of the attenuation of the mask substrate.

The substrate of photolithographic masks is normally made of a very rigid material such as quartz. The deformations necessary for the correction of registration errors and/or optical transmission errors are very small in amplitude and do not exceed the elastic limit of the substrate material. Three different groups of equations are important for the following approach: static equations, geometrical equations and physical equations. In static equations, state equilibrium of surface forces, bulk forces and stresses act at any elementary element of the mask, as for example in static Newton's law. It is possible to derive the strain tensor from the displacement field by utilizing Cauchy formulas, which are geometrical equations. Since not every strain field can result from a displacement field, it is necessary to consider compatibility conditions. In thermal equilibrium and in an adiabatic approximation, the generalized Hooke's law (physical equation) states that for an elastic body there is linear connection between the strain and the stress tensors. Without loss of generality the complete substrate of the photolithographic mask body can be described as a system of rectangular areas or elementary areas, where every elementary area has a constant writing mode and a uniform pixel density. Every element or elementary area can be characterized by a new or modified equilibrium shape having new or modified physical parameters of the mask substrate such as Young's modulus, Poisson's ratio, etc. The induced changes are in a good approximation proportional to the writing load, i.e. to the physical parameters of the mask substrate.

To compute the resulting displacement field as a function of the laser beam parameters or of the writing mode and the pixel density (i.e. the direct problem), one of the following two approaches could be used (there are some more approaches such as Euler's):

1. computation of the strain field that equalizes all the internal forces/stresses acting at the boundary of the elementary areas, or
2. computation of the strain field by finding a minimum of the potential energy for the overall substrate of the photolithographic mask.

Both approaches give a linear dependence of the displacements on the writing amplitudes at a given distribution of writing modes. Both approaches allow the computation of displacements induced by the laser beam based on the knowledge of the writing modes and the writing densities or pixel density.

The inverse problem can be formulated in a general case. Maps for writing modes and pixel densities have to found that result in the target displacement field. In general, a writing mode is a discrete parameter set of the laser beam and the problem has to be formulated as an optimization problem. A target functional has to be constructed that has a minimum (or a supremum) at the desired displacement field. Optimized writing and pixel density maps or optimized laser beam parameters produce the displacement field that minimizes the target functional.

Possible ways to solve the inverse problem, i.e. to compute a map of writing modes and writing densities or pixel densities that gives the desired change of the registration and/or the attenuation (or optical transmission variation) are:
1. An optimization of writing densities can be performed using a MLS approach (Moving Least Squares), but a complete enumeration of the discrete writing mode map can be very difficult in case of small elementary areas.
2. The discrete parameters of a mode map can be converted to a continuous analog with the assumption that one elementary area can have a superposition of the different writing modes. In the case that all physical and shape property changes of the elementary areas are proportional to the contribution of the corresponding writing modes, the target functional is a square of the residual deficiency. Then, the variational formalism will result in a linear problem.

In the following the second approach will be used. In most of the cases, when mask bending phenomena and a modification of the substrate thickness can be neglected, the three-dimensional (3D) problem can be reformulated as a two-dimensional one (2D). Every rectangular element or every rectangular elementary area will represent a rectangular parallelepiped of the substrate of the photolithographic mask.

The generalized Hooke's law for a mask substrate having a linear elasticity can be presented in a 2D form as:

$$\sigma_{ij}(x, y) = \sum_{k=1, l=1}^{2,2} H_{ijkl}(x, y) \varepsilon_{kl}(x, y) \quad (1)$$

where the 2D infinitesimal strain tensor $\epsilon(x,y)$ has components $\epsilon_{ij}(x,y)$ and the stress tensor $\sigma(x,y)$ has components $\sigma_{ij}(x,y)$.

It is assumed that in the 2D approximation there are no external forces acting on the surface of the mask substrate tangential and normal to the mask substrate surface. As a consequence of the assumption follows that:

$\sigma_{zx} = \sigma_{xz} = 0$ $\sigma_{zy} = \sigma yz = 0$ $\sigma_{zz} = 0 \quad (2)$ In case of a mask substrate having an isotropic elasticity the shear components $\epsilon_{zx}, \epsilon_{xz}, \epsilon_{zy}, \epsilon_{yz}$ of the strain tensor also have to be zero. The value of the component $\epsilon_{zz}$ can be ignored because it does not contribute to the deformation energy due to the assumption of $\sigma_{zz}=0$ (see equation 2).

To simplify formulas engineering notations will be used for the strain tensor $\epsilon(x,y)$ by defining $\epsilon_0 = \epsilon_{xx}$, $\epsilon_1 = \epsilon_{yy}$, $\epsilon_2 = 2*\epsilon_{xy}$, which reduces the strain tensor $\epsilon_{ij}$ to a strain vector $\epsilon_i$ having components $\epsilon_0, \epsilon_1, \epsilon_2$. Applying this procedure to the stress tensor $\sigma(x,y)$, i.e. introducing $\sigma_0 = \sigma_{xx}$, $\sigma_1 = \sigma_{yy}$, $\sigma_2 = \sigma_{xy}$, the strain tensor $\sigma_{ij}$ is also reduced to a strain vector $\sigma_i$ again with components $\sigma_0, \sigma_1, \sigma_2$. (From a transformation point of view, $\epsilon_i$ and $\sigma_i$ are not vectors.) Using the defined notations Hooke's law for equation (1) can be rewritten in the form:

$$\sigma_i(x, y) = \sum_{k=0}^{2} H_{ik}(x, y) \varepsilon_k(x, y) \quad (3)$$

$\sigma = H\varepsilon$

The fourth order elasticity tensor $H_{ijkl}$ is thus reduced to a second order tensor $H_{ij}.$ For an isotropic material as for a quartz substrate of a photolithographic mask, the elasticity tensor has only the two independent components E and μ and is of the form:

$$H = E \Big/ (1-\mu^2) \begin{bmatrix} 1 & \mu & 0 \\ \mu & 1 & 0 \\ 0 & 0 & \frac{1}{2}(1-\mu) \end{bmatrix} \quad (4)$$

where Young's modulus is denoted as E(x,y) and Poisson's ratio as μ(x,y).

The displacement field in the substrate of the photolithographic mask can be presented as a vector function $$u(x, y) = \begin{bmatrix} \Delta x(x, y) \\ \Delta y(x, y) \end{bmatrix}$$

in a plane perpendicular to the incident laser beam. For the general case the infinitesimal strain tensor field $\sigma_{ij}$ and in the 2D approximation the infinitesimal strain vector field $\sigma_i$ can be derived from the displacement field $u_i$ (i=1, 2) using Cauchy formulas. The infinitesimal strain vector field has then the form:

$\epsilon(x,y) = Au(x,y) \quad (5)$ where the matrix operator A is constructed from partial derivative elements:

$$A = \begin{bmatrix} \dfrac{\partial}{\partial x} & 0 \\ 0 & \dfrac{\partial}{\partial y} \\ \dfrac{\partial}{\partial y} & \dfrac{\partial}{\partial x} \end{bmatrix}. \quad (6)$$

The overall potential energy P of a distribution of deformations or of a deformation density P(x,y,z) results from the integral:

$$P = \int_V P(x,y,z) dV \qquad (7)$$

In the 2D approximation the distribution of the deformation does not depend on z. Then, the 2D potential energy density resulting from the stress vector $\sigma_i$ caused by a strain vector $\epsilon_i$ is proportional to the integral of the scalar product of both vectors since the force resulting from the strain vector is parallel to the direction of the strain vector. The potential energy density P(x,y) caused by the stress vector field $\sigma_i(x,y)$ resulting from the strain vectors field $\epsilon_i(x,y)$ is thus given by:

$$P(x,y) = \tfrac{1}{2}(\sigma_0 \epsilon_0 + \sigma_1 \epsilon_1 + \sigma_2 \epsilon_2) = \tfrac{1}{2}(\sigma,\epsilon) \qquad (8)$$

By substituting the strain vector field $\sigma_i(x,y)$ using Hooke's law in the form of equation (3) and replacing the strain vector field $\epsilon_i(x,y)$ by the displacement field of equation (5), the potential energy distribution or potential energy density in 2D has the form:

$$P(x,y) = \tfrac{1}{2}(H\epsilon,\epsilon) = \tfrac{1}{2}(H(x,y)Au(x,y), Au(x,y)) \qquad (9)$$

An ideal (but not the only) way to define the displacement field u(x,y) satisfying the criteria of the minimum of the potential energy is a finite element like approach. Without loss of generality the overall substrate of the photolithographic mask can be represented as a set of M*M rectangular elements α having the same size or as a square matrix having M columns and M rows.

For the following calculation of the potential energy P, the mask substrate is split in M*M small rectangular elements of identical size. The total potential energy P is the sum of the potential energies $P^\alpha$ of the individual small rectangular elements α.

$$P = \sum_{\alpha=1}^{M*M} P^\alpha \qquad (10)$$

The potential energy $P^\alpha$ of the rectangular element α is obtained by integrating the 2D potential energy density across the area $V^\alpha$ of the element α:

$$P^\alpha = \int_{V^\alpha} P^\alpha(x,y) dV \qquad (11)$$

The 2D potential energy density $P^\alpha(x,y)$ is obtained from equation (9):

$$P^\alpha(x,y) = \tfrac{1}{2}(H^\alpha Au^\alpha(x,y), Au^\alpha(x,y)) \qquad (12)$$

The index α counts all the rectangular elements α covering the substrate of the photolithographic mask. It is assumed that each rectangular element α is so small that the second order tensor field H(x,y) of the elasticity tensor can be substituted by a constant tensor $H^\alpha$ within a rectangular element α.

By again utilizing the assumption that the rectangular elements α are small, the vector field u(x,y) can be substituted by its linear approximation. For this purpose, linear form functions of the corner coordinates $N_i$ with indices 0, 1, 2, 3 according to the number of the corner are introduced.

$$\begin{array}{cc} N_2 \; N_3 \\ N_0 \; N_1 \end{array} \quad \begin{array}{c} x_2^{g\alpha}, y_2^{g\alpha} \; x_3^{g\alpha}, y_3^{g\alpha} \\ x_0^{g\alpha}, y_0^{g\alpha} \; x_1^{g\alpha}, y_1^{g\alpha} \end{array} \quad u_i^\alpha = u(x_i^{g\alpha}, y_i^{g\alpha}) \qquad (13)$$

The index g represents non perturbed grid locations, i.e. locations prior to the application of light pulses on or the writing of a mode into the substrate of the photolithographic mask. The displacements of the corner coordinates are defined by:

$$N_0^\alpha(x,y) = \frac{(x_1^{g\alpha} - x)}{(x_1^{g\alpha} - x_0^{g\alpha})} \frac{(y_1^{g\alpha} - y)}{(y_1^{g\alpha} - y_0^{g\alpha})} \qquad (14)$$

$$N_1^\alpha(x,y) = \frac{(x - x_1^{g\alpha})}{(x_1^{g\alpha} - x_0^{g\alpha})} \frac{(y_1^{g\alpha} - y)}{(y_1^{g\alpha} - y_0^{g\alpha})}$$

$$N_2^\alpha(x,y) = \frac{(x_1^{g\alpha} - x)}{(x_1^{g\alpha} - x_0^{g\alpha})} \frac{(y - y_0^{g\alpha})}{(y_1^{g\alpha} - y_0^{g\alpha})}$$

$$N_3^\alpha(x,y) = \frac{(x - x_1^{g\alpha})}{(x_1^{g\alpha} - x_0^{g\alpha})} \frac{(y - y_0^{g\alpha})}{(y_1^{g\alpha} - y_0^{g\alpha})}$$

In the following, in every rectangular element α the vector fields u(x,y) are represented by a linear interpolation of the displacement of the corner coordinates (nodes).

$$u(x,y) = N_0^\alpha(x,y) u_0^\alpha + N_1^\alpha(x,y) u_1^\alpha + N_2^\alpha(x,y) u_2^\alpha + N_3^\alpha(x,y) u_3^\alpha \qquad (15)$$

This approximation gives a good continuous approximation of the real displacement field u(x,y). The potential energy $P^\alpha$ of the element α will be represented as a function of the corner displacements of the rectangular element α.

By expressing the potential energy $P^\alpha$ via a displacement vector field u(x,y) within the rectangular element α the equation 12 can be rewritten in:

$$P^\alpha(x,y) = \frac{1}{2}\left( H^\alpha \sum_{i=0}^{3} A N_i^\alpha u_i^\alpha, \sum_{k=0}^{3} A N_k^\alpha u_k^\alpha \right) \qquad (16)$$

First derivatives of the form functions N with respect of Cartesian coordinates x, y are given by:

$$\frac{\partial N_0}{\partial x} = -\frac{\partial N_1}{\partial x} = N(y - m) \qquad (17)$$

$$\frac{\partial N_0}{\partial y} = -\frac{\partial N_2}{\partial y} = N(x - m)$$

$$\frac{\partial N_3}{\partial x} = -\frac{\partial N_2}{\partial x} = N(y + m)$$

$$\frac{\partial N_3}{\partial y} = -\frac{\partial N_1}{\partial y} = N(x + m)$$

with $N = 1/m^2$, m is the element or rectangular area size and therefore m=MaskSize/M.

Performing the integration over the element volume or the element area, the potential energy $P^\alpha$ of the deformed element a can be represented as a square form of the displacement values $u_i^\alpha$ of the element corners $N_0$, $N_1$, $N_2$, $N_3$.

$$P^\alpha = \sum_{i=0, k=0}^{7,7} u_i^\alpha P_{ik}^\alpha u_k^\alpha \qquad (18)$$

As an approximation, the volume occupied by the pixels is considered to be negligible and pixels are considered to not significantly affect the 2D rigidity of the substrate of the photolithographic mask. This means that the potential energy density $P_{ik}^\alpha$ essentially does not change within the element α as a function of the laser beam parameters or does not depend on the type and the amount of the laser beam writing. Thus, equation 18 changes to:

$$P^\alpha = \sum_{i=0,k=0}^{7,7} u_i^\alpha P_{ik}^0 u_k^\alpha \tag{19}$$

This is a key statement of the simplified approach discussed here.

It is now assumed that every rectangular element a alone has a new equilibrium state after the laser beam has been directed onto this portion of the photolithographic mask. The new equilibrium coordinates of the corners $N_0$, $N_1$, $N_2$, $N_3$ are called $w_i^\alpha$. It is obvious that a change of the potential energy from a non deformed state to a new equilibrium position due to deformations induced by the laser beam is opposite to a reverse change. Due to the fact that every element a has a new equilibrium shape in expression for the potential energy after directing the laser beam onto this portion of the photolithographic mask, displacements have to be counted starting from the new equilibrium state. Equation 19 was actually derived with the assumption that the deformation in the substrate of the photolithographic mask is starting from a flat field $$u(x, y) = \begin{pmatrix} x \\ y \end{pmatrix}.$$

Defining the potential energy as for the deformation from the equilibrium position of every rectangular element α, the equation 19 can be converted to:

$$P^\alpha = \sum_{i=0,k=0}^{7,7} (u_i^\alpha - w_i^\alpha) P_{ik}^0 (u_k^\alpha - w_k^\alpha) \tag{20}$$

The Lagrange variational principle will now be applied to the potential energy of the substrate of the photolithographic mask. The Lagrange variational principle states that the equilibrium position of a body has a minimum of the potential energy and that any partial variation of every displacement is equal to zero. For the present case this leads for all the coordinates of the nodes to the following linear equation:

$$\delta P / \delta \xi_i = \delta \left( \sum_{\alpha=1}^{M^2} P^\alpha \right) / \delta \xi_i = 0 \tag{21}$$

with i=1 . . . $2(M+1)^2$ for M×M cells having (M+1)×(M+1) nodes and every node has two coordinates. As defined in equations 13 to 15, every internal node with a coordinate $\xi_i^\alpha$ is presented four times in the components for all the adjacent nodes. All internal nodes are counted from left to right by rows and from bottom to top and all coordinates of all nodes are counted in the way that:

$$\xi_{2\alpha+0} = u_{0x}^\alpha, \xi_{2\alpha+1} = u_{0y}^\alpha \text{ and}$$

$$u_{0x}^\alpha = -u_{1x}^{\alpha-1} = u_{2x}^{\alpha-M} = -u_{3x}^{\alpha-M-1},$$

$$u_{0y}^\alpha = u_{1y}^{\alpha-1} = -u_{2y}^{\alpha-M} = -u_{3y}^{\alpha-M-1}, \tag{22}$$

By collecting all the derivatives in equation (17) and by using the definitions of equations (22) with the appropriate sign, the equation (21) is transformed to:

$$\sum_{j=1}^{2 \cdot (M+1)^2} P_{ij}^g \xi_j - \sum_{j=1,\alpha=1}^{8,M^2} P_{ij\alpha}^w w_j^\alpha = 0 \tag{23}$$

Equation 23 is the starting point for the description of all the different aspects of the inventive principle discussed in the preceding section. It is important to note that the determinant of the matrix $P_{ij}^g$ is zero due to the invariance of the potential energy of the overall substrate of the photolithographic mask versus a rotation and a translational movement. This condition is always automatically fulfilled by adding a condition with respect to the resulting translational movement and the rotation of the photolithographic mask. This means that it is always possible to calculate the inverse matrix (second order tensor) $(P_{ij}^g)^{-1}$ of the normalized matrix $P_{ij}^g$. Hence, using equation 23 for the known equilibrium deformations of the rectangular elements α allows the computation of the deformations resulting from locally directing the laser beam on a portion of the mask substrate.

$$\xi = (P^g)^{-1} P^w w \tag{24}$$

In order to link the resulting deformations with the causative laser beam, or to be more precisely with the laser beam parameters or with the writing mode of the laser beam, the resulting deformations are expressed in an accurate terminology for the writing mode. It is assumed that in the case of an uniform writing in the rectangular element α its equilibrium deformation is proportional to the amount or the number of written pixels or to the induced attenuation of the optical intensity. The writing density of the element α is denoted as $a^\alpha$ and a change of the corner coordinates for a unity writing density is denoted as $e_i^\alpha$. It is now assumed that for the writing mode, i.e. using the same laser beam parameters for every element α and varying only the writing density or pixel density, equation 24 can be rewritten in a form:

$$\xi_i = \sum_{j=1,k=1,\alpha=1}^{4 \cdot (M+1)^2, 8, M^2} (P_{ij}^g)^{-1} P_{jk\alpha}^w a^\alpha e_k \tag{25}$$

By performing the summation over k and denoting $$A_{i\alpha} = \sum_{k=1}^{8} P_{ik\alpha}^w e_k$$

equation 25 is of the form:

$$\xi_i = \sum_{j=1,\alpha=1}^{2 \cdot (M+1)^2, M^2} (P_{ij}^g)^{-1} A_{j\alpha} a^\alpha \tag{26}$$

This equation states that the deformation at the internal node $\xi_i$ is a linear combination of the writing amplitude $a^\alpha$ of every rectangular element $\alpha$.

Equation 26 supposes that the writing of the laser beam is performed with a fixed mode or with a fixed set of laser beam parameters. The deformation property of the writing mode is coded in equilibrium deformation displacements $e_k$ for unity writing. Actually those eight displacement components are the functions of only five independent ones as two virtual displacements of the element are fixed and a rotation also does not contribute to the potential energy. Using those five independent components, it is possible to construct an orthonormal set of unity vectors.

$$n^i = N_{ij}^{-1} e^j \; e^j = \{e_k^j\}, \; e_k^j = \delta_{kj} \tag{27}$$

where $N_{ij}^{-1} = (n^i, e^j)$ is a matrix which converts the basis $e^j$ to the basis $n^i$ $$(n^i, n^j) = \delta_{ij}, \left(n^i, \sum_i e^{2*i}\right) = 0, \left(n^i, \sum_i e^{2*i+1}\right) = 0 \tag{28}$$

Projections to this set of unity vectors will be used as a representation of the writing mode, i.e. a set of laser beam parameters. In the following a writing mode will be denoted as a writing tool signature abbreviated as TS or tool signature. The TS represents a property of the writing tool or of the laser system for a selected type of the writing or for a set of laser beam parameters having a predefined set of physical end geometrical properties. Using the notation of equations 27 and 28, equation 26 can be rewritten:

$$\xi_i = \sum_{j=1, k=1, \alpha=1, l=1}^{2 \cdot (M+1)^2, 8, M^2, 5} (P_{ij}^g)^{-1} P_{jk\alpha}^w a^\alpha N_{kl} t_l^s \tag{29}$$

where $t_l^s$ are deformation elements in normal directions and $N_{kl} t_l^s$ are displacements of corner elements.

By using the assumption of the linear combination of the deformations induced by a repeated application of a laser beam having several sets of parameters by using different writing modes in a multiple writing process, the resulting deformations can be defined as:

$$\xi_i = \sum_{j=1, \alpha=1, m=1}^{2 \cdot (M+1)^2, M^2, R} (P_{ij}^g)^{-1} A_{j\alpha}^m a_m^\alpha \tag{30}$$

where m takes all the different writing modes R into consideration.

As already indicated above, deformations can be represented by a linear operator operating in spaces of writing densities amplitudes $a_m^\alpha$ and deformation elements in normal directions $t_l^m$ and having non-zero values in the space of the induced node displacements $\xi_i$. By using equations 27 and 28 equation 30 has the form:

$$\xi_i = \sum_{j=1, k=1, \alpha=1, l=1, m=1}^{2 \cdot (M+1)^2, 8, M^2, 5, R} (P_{ij}^g)^{-1} P_{jk\alpha}^w a_m^\alpha N_{kl} t_l^m \tag{31}$$

where the displacements of the rectangular grid nodes $\xi_i$ are counted in pairs x,y from left to right and from bottom to top, $a_m^\alpha$ is the amplitude of the writing density for a mode m in the rectangular element $\alpha$, $t_l^m$ is a tool signature for mode m (or a mode signature).

It is now assumed that an initial registration problem $\phi_j$ is defined at a set of locations $X_j$, $Y_j$, $j=1, \ldots, L$. The registration problem $\phi_j$ has to be corrected by locally directing a laser beam onto the substrate of the photolithographic mask. In the approximation discussed above the deformations are additive to all initial registration problems. However, the displacements are only known at the nodes $\xi_i$. Using the assumptions that the deformations inside the rectangular elements $\alpha$ show a linear behavior, a matrix can be generated which transforms the magnitudes of the displacements at the nodes $\xi_i$ to the magnitude at the desired location $\zeta_i$. This transformation can be executed by using the equations 13 and 14:

$$\zeta_i = \sum_{j=1}^{2*(M+1)*(M+1)} M_{ij} \xi_j \tag{32}$$

Here $\zeta_i$ is the result of a linear interpolation or of a linear combination of computed displacements $\xi_i$ at locations $X_i$, $Y_i$. The matrix $M_{ij}$ has a dimension of $L \times 2*(M+1)*(M+1)$. Actually this matrix has only eight diagonal elements because every location is interpolated by using only four corners of the element $\alpha$ as has already been discussed.

Hence the resulting registration at a selected location i on the substrate of the photolithographic mask is:

$$\phi_i + \zeta_i \tag{33}$$

Before a photolithographic mask illuminates the photoresist on a wafer, a scanner or a stepper may perform a linear imaging transformation in order to correct displacement errors of pattern elements on the mask or imaging errors induced by the optical illumination system. A linear imaging transformation is nowadays implemented in almost every scanner. A linear imaging transformation can be described by six parameters. Two parameters $m_x$, $m_y$ account for an image shift, two parameters $s_x$, $s_y$ describe an image scaling and two further parameters $r_x$, $r_y$ describe a generalized rotation. With these six parameters of a linear imaging transformation every point of the image x, y is transformed according to the equation:

$$x' = x + m_x + s_x x - r_x y$$

$$y' = y + m_y + s_y y + r_y x \tag{34}$$

Typically the scaling and the rotation parameters have a very small magnitude of not more 1 ppm (parts per million), so that higher order components like $\zeta*s$ and $\zeta*r$ can be ignored. This means that all the image transformations can be performed using pure design locations.

The linear imaging transformation can be represented in matrix form:

$$\zeta_i' = \zeta_i + \sum_{k=1}^{6} T_{ik} s_k \tag{35}$$

where $s_k$ is the vector of all the scanner image transformation coefficients:

$$s=\{m_x, m_y, s_x, s_y, r_x, r_y\} \quad (36)$$

Some advanced scanners can offer even more complex nonlinear imaging transformations, however the imaging transformation can still be represented in the form of equation 35 with a wider set of transformation parameters according to equation 36.

In order to solve a given registration problem $\phi$, the amplitudes $a_m^\alpha$ of writing mode m in the rectangular element $\alpha$ and the scanner transformation coefficients $s_k$ have to be identified which minimize the target functional $\Phi$, i.e. it has to be solved:

$$\min\{\Phi(\phi+\zeta+Ts)\} \quad (37)$$

In order to minimize the target functional $\Phi$ both parameters, the displacements $\zeta_i$ and the linear transformation parameters $s_k$ are varied simultaneously in order to minimize the registration problem $\phi_i$. This is a key statement for the discussed approach. Equation 37 also indicates that it may be advantageous to generate some deformations in the substrate of the photolithographic mask (expressed by the displacements $\zeta_i$) in order to minimize the registration error. Thus, introducing displacements according the solution of equation 37, $\zeta_i^{opt}$, and performing a linear imaging transformation according to the solution of equation 37, $s_i^{opt}$, results in the best possible performance of the photolithographic mask.

From a computational point of view, it is convenient to select the target functional as a mean square of the residual displacements which transforms equation 37 to:

$$\min\left\{\sum_{i=1}^{L}\left(\varphi_i + \zeta_i + \sum_{j=1}^{6} T_{ij}s_j\right)^2 + \lambda^s \sum_{j=1}^{6} s_k^2 + \sum_{J=1}^{R,M^2} \lambda_m^\alpha a_j^{m2}\right\} \quad (38)$$

A Tikhonov regularization has been added to the target functional to make sure that the result will define a physically reasonable solution. The regularization coefficients $\lambda$ have to be selected to be small enough, so that they do not introduce a significant change to the solution. The problem of equation 38 may have an analytical solution, but there is the constraint that all the amplitudes of the writing density $a_l^m$ are positive for all modes m. A further constraint exists in that the amplitudes of the writing mode $(a^{thres})^m$ may not exceed some writing mode specific damage threshold of the substrate of the photolithographic mask resulting in a writing mode specific relation:

$$0 < a_i^m < (a^{thres})^m \quad (39)$$

What is claimed is:

1. A method for correcting a plurality of errors of a photolithographic mask; the method comprising:
    determining optimized first and optimized second parameters in a joint optimization process by simultaneously optimizing first parameters of an imaging transformation of the photolithographic mask and second parameters of a laser beam locally directed onto the photolithographic mask; and
    correcting the plurality of errors by performing an imaging transformation by a stepper or a scanner, in which the imaging transformation is described by the optimized first parameters, and performing at least one of a local density modification or an optical transmission distribution modification of a substrate of the photolithographic mask by locally directing the laser beam onto the photolithographic mask, in which the at least one of the local density modification or the optical transmission distribution modification is described by the optimized second parameters.

2. The method according to claim 1, wherein the joint optimization process comprises:
    setting up a target functional comprising error data, first imaging transformation parameters and second laser beam parameters; and
    minimizing the target functional by simultaneously varying the first imaging transformation parameters and the second laser beam parameters.

3. The method according to claim 2, wherein minimizing the target functional comprises applying a Lagrange variational principle.

4. The method of claim 3, in which the target functional minimizes a potential energy distribution introduced into the photolithographic mask by the first and the second parameters.

5. The method according to claim 2, wherein minimizing the target functional comprises minimizing the target functional as a mean square of residual displacements in which a Tikhonov regularization term is added to the target functional to assist in finding a solution during the minimization process.

6. The method according to claim 2, wherein the target functional comprises at least one weighting function as a constraint in at least one of an active area or a non-active area of the photolithographic mask.

7. The method of claim 6, in which the at least one weighting function is constructed to simultaneously correct registration errors and flatness errors of the plurality of errors.

8. The method according to claim 2, wherein the target functional comprises at least one overlay error between at least one first photolithographic mask and at least one second photolithographic mask, and minimizing the target functional comprises varying the at least one overlay error.

9. The method according to claim 1, wherein the imaging transformation comprises a linear imaging transformation and the linear imaging transformation comprises two parameters for a photolithographic mask shift, two parameters for a photolithographic mask scaling and two parameters for a generalized rotation of the photolithographic mask.

10. The method according to claim 1, wherein the second laser beam parameters comprise at least one of an energy of the laser beam, a numerical aperture, a focus size, a beam polarization, an astigmatism, a pulse length, a repetition rate, a number of pulses directed onto one location of the photolithographic mask, or a distance between two locations the laser beam is directed onto the photolithographic mask.

11. The method according to claim 1, wherein the laser beam locally modifies at least one of a density or an optical transmission distribution of the photolithographic mask.

12. The method of claim 11, in which at least one of the locally modified density or the optical transmission distribution of the photolithographic mask is discontinuously modified within a plurality of small volumes of the photolithographic mask, wherein each small volume is called a pixel.

13. The method according to claim 1, wherein the plurality of errors comprises different types of errors.

14. The method of claim 13, in which the different types of errors comprise at least one of registration errors, optical transmission errors, or planarity errors.

15. The method according to claim 1, wherein errors not corrected or introduced when locally directing the laser beam onto the substrate of the photolithographic mask generating pixels in a first layer of the substrate of the photolithographic mask for correcting the plurality of errors are corrected by again directing the laser beam onto the substrate of the photolithographic mask and generating pixels in a second layer of the substrate of the photolithographic mask.

16. The method according to claim 1, wherein at least one of the laser beam or the photolithographic mask is rotated by an angle parallel to the laser beam for a portion of a time period the laser beam is directed onto the photolithographic mask.

17. The method according to claim 1, wherein directing the laser beam onto the photolithographic mask does not introduce a variation of an optical transmission distribution for a laser beam at the exposure wavelength of the photolithographic mask.

18. The method according to claim 1, wherein directing the laser beam onto the photolithographic mask additionally introduces a predetermined variation of the optical transmission distribution across the photolithographic mask for the laser beam at the exposure wavelength of the photolithographic mask.

19. The method according to claim 1, further comprising directing the laser beam onto the photolithographic mask in order to correct errors newly introduced in the photolithographic mask by correcting optical transmission distribution errors in the active area of the photolithographic mask.

20. The method according to claim 1, wherein directing the laser beam onto the photolithographic mask comprises at least two sets of second laser beam parameters so that correcting of optical transmission distribution errors across the photolithographic mask does not introduce registration errors into the photolithographic mask.

21. The method according to claim 1, wherein the second parameters of the laser beam comprise a pulse energy ranging from 0.05 µJ to 5 µJ, a pulse length ranging from 0.05 ps to 100 ps, a repetition rate ranging from 1 kHz to 10 MHz, a pulse density ranging from 1,000 pulses per $mm^2$ to 10,000,000 pulses per $mm^2$, the NA of an objective ranging from 0.1 to 0.9 and the magnification of the objective ranging from 5x to 40x.

22. The method according to claim 1, wherein the second parameters comprise at least three sets of second laser beam parameters, a first set and a second set for directing the laser beam onto the active area having different pulse energies and a third set for directing the laser beam onto the non-active area of the photolithographic mask.

23. The method of claim 1, wherein locally directing the laser beam comprises directing the laser beam with a first set of second laser beam parameters onto an active area of the photolithographic mask and with a second set of second laser beam parameters onto a non-active area of the photolithographic mask.

24. The method according to claim 23, wherein the first set of second laser beam parameters comprises a pulse energy of 0.45 µJ-0.55 µJ, pulse duration of 5 -10 ps, a repetition rate of 10 kHz-100 kHz, the NA of the objective of 0.2-0.4, a magnification of the objective of 10x20x and a pulse density of 1,000-100,000 pulses per $mm^2$, and the second set of the second laser beam parameters comprises a pulse energy of 0.27 µJ-0.37 and a pulse density of 5,000-500,000 pulses per $mm^2$.

25. An apparatus for correcting a plurality of errors of a photolithographic mask, comprising:
- at least one computing means configured to simultaneously optimize first imaging parameters of an imaging transformation of the photolithographic mask and second parameters of a laser beam locally directed onto the photolithographic mask;
- at least one laser source for generating the laser beam of light pulses according to optimized second laser beam parameters, the light pulses generated according to optimized second laser beam parameters to perform at least one of a density modification or an optical transmission distribution modification of a substrateof the photolithographic mask by locally directing the laser beam onto the photolithographic mask; and
- at least one stepper or scanner for performing an imaging transformation according to optimized first imaging parameters, in which a combined action of the laser beam of light pulses generated according to optimized second laser beam parameters and the imaging transformation performed according to the optimized first imaging parameters correct the plurality of errors of the photolithographic mask.

* * * * *

UNITED STATES PATENT AND TRADEMARK OFFICE
CERTIFICATE OF CORRECTION

PATENT NO. : 9,658,527 B2
APPLICATION NO. : 13/179799
DATED : May 23, 2017
INVENTOR(S) : Vladimir Dmitriev It is certified that error appears in the above-identified patent and that said Letters Patent is hereby corrected as shown below:

Column 7
Line 2, after "nodes" insert -- $\xi_i$, --

Column 9
Line 38, delete "a requires that" and insert -- $\alpha$ requires that --

Column 11
Lines 20-25, delete

"
$$\min\left\{\sum_i \left[ \left(\sum_j \left(\Phi_{ij}^{cdc00} - \Phi_{ij}^{cdc90}\right)a_j^{cdc00} + \sum_j \Phi_{ij}^{cdc90} a_j^{cdc} + \sum_j T_{ij}s_j\right)^2 + + \lambda^s \sum_j s_j^2 + \lambda^a \left(\sum_j \left(a_j^{cdc00^2} + \left(a_j^{cdc} - a_j^{cdc00^2}\right)^2\right)\right) \right]\right\}$$
" and insert $$\min\left\{\sum_i \left[ \left(\sum_j \left(\Phi_{ij}^{cdc00} - \Phi_{ij}^{cdc90}\right)a_j^{cdc00} + \sum_j \Phi_{ij}^{cdc90} a_j^{cdc} + \sum_j T_{ij}s_j\right)^2 + \lambda^s \sum_j s_j^2 + \lambda^a \left(\sum_j \left(a_j^{cdc00^2} + \left(a_j^{cdc} - a_j^{cdc00^2}\right)^2\right)\right) \right]\right\}$$
--

Signed and Sealed this
Thirteenth Day of November, 2018

Andrei Iancu
*Director of the United States Patent and Trademark Office*

CERTIFICATE OF CORRECTION (continued)
U.S. Pat. No. 9,658,527 B2

Lines 51-56, delete $$\min\left\{\sum_i \left[\begin{array}{c}\left(\sum_j \left(\Phi_{ij}^{std} - \Phi_{ij}^{le}\right)a_j^{std} + \sum_j \Phi_{ij}^{le} a_j^{cdc} + \sum_j T_{ij} sj\right)^2 ++\\ \lambda^s \sum_j s_j^2 + \lambda^a \left(\sum_j \left(a_j^{std^2} + \left(a_j^{cdc} - a_j^{std}\right)^2\right)\right)\end{array}\right]\right\}$$

" and insert $$\min\left\{\sum_i \left[\begin{array}{c}\left(\sum_j \left(\Phi_{ij}^{std} - \Phi_{ij}^{le}\right)a_j^{std} + \sum_j \Phi_{ij}^{le} a_j^{cdc} + \sum_j T_{ij} sj\right)^2 +\\ \lambda^s \sum_j s_j^2 + \lambda^a \left(\sum_j \left(a_j^{std^2} + \left(a_j^{cdc} - a_j^{std}\right)^2\right)\right)\end{array}\right]\right\}$$

--

Column 12
Lines 37-43, delete $$\min\left\{\sum_i \left[\begin{array}{c}\left(\sum_j \left(\Phi_{ij}^{std} - \Phi_{ij}^{le}\right)a_j^{std} + \sum_j \Phi_{ij}^{le} a_j^{cdc} + \sum_j \Phi_{ij}^{apo} a_j^{apo} + \sum_j T_{ij} s_j\right)^2 ++\\ \lambda^s \sum_j s_j^2 + \lambda^a \left(\sum_j \left(a_j^{std^2} + \left(a_j^{cdc} - a_j^{std}\right)^2 + a_j^{apo^2}\right)\right)\end{array}\right]\right\}$$

" and insert $$\min\left\{\sum_i \left[\begin{array}{c}\left(\sum_j \left(\Phi_{ij}^{std} - \Phi_{ij}^{le}\right)a_j^{std} + \sum_j \Phi_{ij}^{le} a_j^{cdc} + \sum_j \Phi_{ij}^{apo} a_j^{apo} + \sum_j T_{ij} s_j\right)^2 +\\ \lambda^s \sum_j s_j^2 + \lambda^a \left(\sum_j \left(a_j^{std^2} + \left(a_j^{cdc} - a_j^{std}\right)^2 + a_j^{apo^2}\right)\right)\end{array}\right]\right\}$$

--

Column 14
Line 52, delete "correaction" and insert -- correction --

Column 17
Line 45, delete "C; and" and insert -- "C;" --
Line 48, delete "transformation." and insert -- transformation; --
Line 50, delete "photolithograghic mask." and insert -- photolithographic mask; and --

Column 21
Line 16, delete "aperature" and insert -- aperture --

CERTIFICATE OF CORRECTION (continued)
U.S. Pat. No. 9,658,527 B2

Column 24
Line 27 (Approx.), delete "correaction" and insert -- correction --
Line 35 (Approx.), delete "attenuationallowed" and insert -- attenuation allowed --

Column 25
Line 7, delete "correaction" and insert -- correction --

Column 30
Lines 1-5, delete " $\lambda^2 \sum_k s_k^2 + \lambda^a \sum_k a_k^{1^2} \}$ " and insert -- $\lambda^s \sum_k s_k^2 + \lambda^a \sum_k a_k^{1^2} \}$ --

Column 31
Line 46, delete "LowRec" and insert -- LowReg --

Column 32
Line 33, delete "that that" and insert -- that --

Column 33
Line 40, delete "directions 1." and insert -- directions l. --

Column 35
Line 33, delete "apoidzation" and insert -- apodization --
Line 61, delete "correaction" and insert -- correction --

Column 36
Line 60, delete "correaction" and insert -- correction --

Column 39
Line 7, delete "following" and insert -- following, --

Lines 28-32, delete "
$$\min\left\{\sum_i \left(\sum_j (\Phi_{ij}^{cdc00} - \Phi_{ij}^{cdc90})a_j^{cdc00} + \sum_j \Phi_{ij}^{cdc90} a_j^{cdc} + \sum_j T_{ij} s_j\right)^2 + \lambda^s \sum_k s_k^2 + \lambda^a \left(\sum_k (a_k^{cdc00^2} + (a_k^{cdc} - a_k^{cdc00})^2)\right)\right\}$$
" and insert --
$$\min\left\{\sum_i \left(\sum_j (\Phi_{ij}^{cdc00} - \Phi_{ij}^{cdc90})a_j^{cdc00} + \sum_j \Phi_{ij}^{cdc90} a_j^{cdc} + \sum_j T_{ij} s_j\right)^2 + \lambda^s \sum_k s_k^2 + \lambda^a \left(\sum_k (a_k^{cdc00^2} + (a_k^{cdc} - a_k^{cdc00})^2)\right)\right\}$$
--

Line 47, delete "correaction" and insert -- correction --

CERTIFICATE OF CORRECTION (continued)
U.S. Pat. No. 9,658,527 B2

Column 40

Lines 58-64, delete "
$$\min\left\{\sum_i\left(\sum_j(\Phi_{ij}^{std}-\Phi_{ij}^{le})a_j^{std}+\sum_j\Phi_{ij}^{le}a_j^{cdc}+\sum_j T_{ij}s_j\right)^2 + \lambda^s\sum_k s_k^2 + \lambda^a\left(\sum_k(a_k^{std\,2}+(a_k^{cdc}-a_k^{std})^2)\right)\right\}$$
"

and insert --
$$\min\left\{\sum_i\left(\sum_j(\Phi_{ij}^{std}-\Phi_{ij}^{le})a_j^{std}+\sum_j\Phi_{ij}^{le}a_j^{cdc}+\sum_j T_{ij}s_j\right)^2 + \lambda^s\sum_k s_k^2 + \lambda^a\left(\sum_k(a_k^{std\,2}+(a_k^{cdc}-a_k^{std})^2)\right)\right\}$$
--

Column 41

Lines 45-51, delete "
$$\min\left\{\sum_i\left(\sum_j(\Phi_{ij}^{std}-\Phi_{ij}^{le})a_j^{std}+\sum_j\Phi_{ij}^{le}a_j^{cdc}+\sum_j\Phi_{ij}^{apo}a_j^{apo}+\sum_j T_{ij}s_j\right)^2 + \lambda^s\sum_k s_k^2 + \lambda^a\left(\sum_k(a_k^{std\,2}+(a_k^{cdc}-a_k^{std})^2+a_k^{apo\,2})\right)\right\}$$
" and insert --
$$\min\left\{\sum_i\left(\sum_j(\Phi_{ij}^{std}-\Phi_{ij}^{le})a_j^{std}+\sum_j\Phi_{ij}^{le}a_j^{cdc}+\sum_j\Phi_{ij}^{apo}a_j^{apo}+\sum_j T_{ij}s_j\right)^2 + \lambda^s\sum_k s_k^2 + \lambda^a\left(\sum_k(a_k^{std\,2}+(a_k^{cdc}-a_k^{std})^2+a_k^{apo\,2})\right)\right\}$$
--

Column 44
Line 17, delete "correactions" and insert -- corrections --
Line 22, delete "a" and insert -- an --
Line 24, delete "baem" and insert -- beam --
Line 29, delete "a" and insert -- an --

Column 46
Lines 16-17 (Approx.), delete "correaction" and insert -- correction --

Column 47
Line 47, delete "strain tensor $\epsilon(x,y)$" and insert -- strain tensor $\varepsilon(x,y)$ --
Lines 47 to 48, delete "components $\epsilon_{ij}(x,y)$" and insert -- components $\varepsilon_{ij}(x,y)$ --

CERTIFICATE OF CORRECTION (continued)
U.S. Pat. No. 9,658,527 B2

Lines 55-59 (Approx.), Equation (2), delete "$\begin{aligned}\sigma_{zx} &= \sigma_{xz} = 0 \\ \sigma_{zy} &= \sigma yz = 0 \\ \sigma_{zz} &= 0\end{aligned}$" and insert -- $\begin{aligned}\sigma_{zx} &= \sigma_{xz} = 0 \\ \sigma_{zy} &= \sigma_{yz} = 0 \\ \sigma_{zz} &= 0\end{aligned}$ --

Line 61, delete "shear components $\epsilon_{zx}, \epsilon_{xz}, \epsilon_{zy}, \epsilon_{yz}$" and insert -- shear components $\varepsilon_{zx}, \varepsilon_{xz}, \varepsilon_{zy}, \varepsilon_{yz}$, --

Line 62, delete "component $\epsilon_{zz}$" and insert -- component $\varepsilon_{zz}$ --

Lines 66-67, delete "strain tensor $\epsilon(x,y)$ by defining $\epsilon_0 = \epsilon_{xx}, \epsilon_1 = \epsilon_{yy}, \epsilon_2 = 2*\epsilon_{xy}$ which reduces the strain tensor $\epsilon_{ij}$" and insert -- strain tensor $\varepsilon(x,y)$ by defining $\varepsilon_0 = \varepsilon_{xx}, \varepsilon_1 = \varepsilon_{yy}, \varepsilon_2 = 2*\varepsilon_{xy}$ which reduces the strain tensor $\varepsilon_{ij}$ --

Column 48
Line 1, delete "$\epsilon_i$ having components $\epsilon_0, \epsilon_1, \epsilon_2$" and insert -- $\varepsilon_i$ having components $\varepsilon_0, \varepsilon_1, \varepsilon_2$ --

Line 55, delete "$\epsilon(x,y) = \mathbf{A}\, u(x,y)$" and insert -- $\varepsilon(x,y) = \mathbf{A}\, u(x,y)$ --

Column 49
Line 13, delete "$\epsilon_i(x,y)$" and insert -- $\varepsilon_i(x,y)$ --

Line 15, delete "$P(x,y) = 1/2(\sigma_0 \epsilon_0 + \sigma_1 \epsilon_1 + \sigma_2 \epsilon_2) = 1/2(\sigma, \epsilon)$" and insert -- $P(x,y) = 1/2(\sigma_0 \varepsilon_0 + \sigma_1 \varepsilon_1 + \sigma_2 \varepsilon_2) = 1/2(\sigma, \varepsilon)$ --

Line 18, delete "$\epsilon_i(x,y)$" and insert -- $\varepsilon_i(x,y)$ --

Line 22 (Approx.), delete "$P(x,y) = \frac{1}{2}(\mathbf{H}\epsilon, \epsilon) = \frac{1}{2}(\mathbf{H}(x,y)\mathbf{A}u(x,y), \mathbf{A}u(x,y))$"

and insert -- $P(x,y) = \frac{1}{2}(\mathbf{H}\varepsilon, \varepsilon) = \frac{1}{2}(\mathbf{H}(x,y)\mathbf{A}u(x,y), \mathbf{A}u(x,y))$ --

Line 35-40, delete "$P = \sum_{\alpha=1}^{M*M} P^a$" and insert -- $P = \sum_{\alpha=1}^{M*M} P^\alpha$ --

Column 50
Line 56, delete "element a" and insert -- element α --

Column 51
Line 14 (Approx.), delete "element a" and insert -- element α --
Line 24, delete "element a" and insert -- element α --

Column 55
Line 52 (Approx.), delete "$0 < a_i^m < (a^{thres})^m$" and insert -- $0 < a_l^m < (a^{thres})^m$ --

Column 58
Line 14 (Approx.), in Claim 24, delete "5 -10" and insert -- 5 - 10 --

CERTIFICATE OF CORRECTION (continued)
U.S. Pat. No. 9,658,527 B2

Line 16 (Approx.), in Claim 24, delete "10x20x" and insert -- 10x - 20x --
Line 19 (Approx.), in Claim 24, delete "0.27 µJ–0.37 and" and insert -- 0.27 µJ – 0.37 µJ and --
Line 33 (Approx.), in Claim 25, delete "substrateof" and insert -- substrate of --